(12) United States Patent
Lee et al.

(10) Patent No.: US 11,742,460 B2
(45) Date of Patent: Aug. 29, 2023

(54) DISPLAY DEVICE AND METHOD OF MANUFACTURING THE SAME

(71) Applicant: Samsung Display Co., Ltd., Yongin-si (KR)

(72) Inventors: Seung Min Lee, Yongin-si (KR); Jin Taek Kim, Yongin-si (KR); Baek Hyeon Lim, Yongin-si (KR); Jin Yeong Kim, Yongin-si (KR); Kyung Tae Chae, Yongin-si (KR); Jung Hwan Yi, Yongin-si (KR); Hee Keun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 312 days.

(21) Appl. No.: 17/098,117

(22) Filed: Nov. 13, 2020

(65) Prior Publication Data

US 2021/0296537 A1    Sep. 23, 2021

(30) Foreign Application Priority Data

Mar. 17, 2020   (KR) .......................... 10-2020-0032740

(51) Int. Cl.
*H01L 33/38*    (2010.01)
*H01L 33/54*    (2010.01)
(Continued)

(52) U.S. Cl.
CPC ........ *H01L 33/382* (2013.01); *H01L 33/0095* (2013.01); *H01L 33/54* (2013.01); *H01L 2933/005* (2013.01); *H01L 2933/0016* (2013.01)

(58) Field of Classification Search
CPC ........... H01L 33/382; H01L 2933/0016; H01L 27/3248; H01L 27/3246; H01L 27/3262; H01L 27/1214; H01L 25/167
See application file for complete search history.

(56) References Cited

U.S. PATENT DOCUMENTS 6,903,378 B2    6/2005  Cok
8,637,858 B2    1/2014  Huang et al.
(Continued)

FOREIGN PATENT DOCUMENTS

KR    10-2018-0007025 A    1/2018
KR    10-2018-0072909 A    7/2018

*Primary Examiner* — Antonio B Crite
(74) *Attorney, Agent, or Firm* — Lewis Roca Rothgerber Christie LLP

(57) ABSTRACT

A display device includes: a substrate having a display area and a non-display area; and a pixel in each of a pixel area in the display area. Each of the pixels includes: an insulating layer on the substrate and having an opening; first and second electrodes on the insulating layer and spaced apart from each other; a plurality of light emitting elements in the opening; a first contact electrode electrically connecting one end of the light emitting elements and the first electrode to each other; a second contact electrode electrically connecting another end of the light emitting elements and the second electrode to each other; a first insulating pattern on the first contact electrode; and a second insulating pattern on the second contact electrode. The first insulating pattern and the second insulating pattern are on the same layer and spaced apart from each other.

12 Claims, 52 Drawing Sheets

(51) Int. Cl.
  *H01L 33/62* (2010.01)
  *H01L 25/075* (2006.01)
  *H01L 25/16* (2023.01)
  *H01L 27/15* (2006.01)
  *G09F 9/33* (2006.01)
  *H01L 21/02* (2006.01)
  *H01L 21/768* (2006.01)
  *H01L 27/12* (2006.01)
  *H01L 33/00* (2010.01)

(56) References Cited

U.S. PATENT DOCUMENTS

| | | |
|---|---|---|
| 10,373,985 B2 | 8/2019 | Kim et al. |
| 10,381,335 B2 | 8/2019 | Sasaki et al. |
| 10,461,123 B2 | 10/2019 | Kim et al. |
| 2018/0012876 A1 | 1/2018 | Kim et al. |
| 2018/0159065 A1* | 6/2018 | Kim ................... H01L 27/3276 |

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2020-0032740, filed on Mar. 17, 2020, in the Korean Intellectual Property Office, the entire content of which is herein incorporated by reference.

BACKGROUND

1. Field

Aspects of embodiments of the present disclosure relate to a display device and a method of manufacturing the same.

2. Description of the Related Art

Due to increasing interest in information displays and high demand for portable information media, display devices have been in high demand. Accordingly, commercialization of display devices has intensified.

SUMMARY

Aspects of embodiments of the present disclosure provide a display device formed by a simplified manufacturing process by using fewer masks and the method of manufacturing the display device.

A display device according to an embodiment of the present disclosure includes a substrate having a display area and a non-display area extending around a side of the display area, the display area including a plurality of pixel areas, and a pixel in each of the pixel areas. Each of the pixels includes an insulating layer on the substrate and having an opening, first and second electrodes on the insulating layer and spaced apart from each other, a plurality of light emitting elements in the opening, a first contact electrode electrically connecting one end of the light emitting elements and the first electrode to each other, a second contact electrode electrically connecting another end of the light emitting elements and the second electrode to each other, a first insulating pattern on the first contact electrode, and a second insulating pattern on the second contact electrode. The first insulating pattern and the second insulating pattern are on the same layer and are spaced apart from each other.

In an embodiment of the present disclosure, the first insulating pattern may overlap the first contact electrode when viewed on a plane, and the second insulating pattern may overlap the second contact electrode when viewed on the plane.

In an embodiment of the present disclosure, the first contact electrode and the first insulating pattern may have the same planar shape, and the second contact electrode and the second insulating pattern may have the same planar shape.

In an embodiment of the present disclosure, the first insulating pattern and the second insulating pattern may be organic insulating films including the same organic material.

In an embodiment of the present disclosure, the first insulating pattern may be directly on the first contact electrode, and the second insulating pattern may be directly on the second contact electrode.

In an embodiment of the present disclosure, the first contact electrode and the first insulating pattern may have the same planar shape, and the second contact electrode and the second insulating pattern may have the same planar shape.

In an embodiment of the present disclosure, each of the pixels may further include a pixel circuit portion including a transistor, and the pixel circuit portion may be between the substrate and the insulating layer.

In an embodiment of the present disclosure, the transistor may be spaced apart from the opening in the insulating layer when viewed in a cross section.

A display device according to another embodiment of the present disclosure includes a substrate having a display area and a non-display area extending around at least one side of the display area, the display area including a plurality of pixel areas, and a pixel in each of the pixel areas. Each of the pixels includes a transistor and a driving voltage line on the substrate, a passivation layer on the transistor and the driving voltage line, an insulating layer on the passivation layer and having an opening, first and second electrodes on the insulating layer and spaced apart from each other, and a plurality of light emitting elements in the opening.

In an embodiment of the present disclosure, the passivation layer may have a first area corresponding to the opening in the insulating layer and a second area that does not correspond to the opening in the insulating layer. A thickness of the first area of the passivation layer and a thickness of the second area of the passivation layer may be different from each other.

In an embodiment of the present disclosure, the thickness of the first area of the passivation layer may be less than the thickness of the second area of the passivation layer.

In an embodiment of the present disclosure, a first distance between the substrate and a portion of each of the first and second electrodes in the opening in the insulating layer may be less than a second distance between the substrate and the passivation layer.

In an embodiment of the present disclosure, each of the pixels may further include an insulating pattern on an upper surface of each of the light emitting elements, a first contact electrode connecting the first electrode and one end of the light emitting elements, and a second contact electrode connecting the second electrode and another end of the light emitting elements.

In an embodiment of the present disclosure, the first contact electrode and the second contact electrode may be spaced apart from each other on the insulating pattern.

In an embodiment of the present disclosure, the first contact electrode and the second contact electrode may be on the same layer or may be on different layers.

In an embodiment of the present disclosure, each of the pixels may further include a first insulating pattern on the first contact electrode and a second insulating pattern on the second contact electrode. The first contact electrode and the first insulating pattern may have the same planar shape, and the second contact electrode and the second insulating pattern may have the same planar shape.

A method of manufacturing a display device according to an embodiment of the present disclosure includes providing a pixel in each pixel area on a substrate. The providing the pixel includes forming a transistor and a driving voltage line on the substrate, forming a first insulating material layer on the transistor and the driving voltage line, forming an insulating pattern having a sub opening exposing the first insulating material layer by forming a second insulating material layer on the first insulating material layer and removing a portion of the second insulating material layer, forming a passivation layer having a groove and an insulating layer having an opening with a width greater than a width of the sub opening by removing a portion of the exposed first insulating material layer using the insulating pattern as an etching mask, forming a first electrode and a second electrode spaced apart from each other on the insulating layer, supplying light emitting elements to the pixel areas and aligning the light emitting elements by forming an electric field between the first electrode and the second electrode by applying an alignment signal corresponding to each of the first and second electrodes, and forming a contact electrode on each of the first and second electrodes.

In an embodiment of the present disclosure, the groove in the passivation layer may correspond to the opening in the insulating layer.

In an embodiment of the present disclosure, a first distance between the substrate and a portion of each of the first and second electrodes in the opening in the insulating layer may be less than a second distance between the substrate and the passivation layer.

In an embodiment of the present disclosure, the forming the passivation layer and the insulating layer may include forming a contact opening exposing each of a portion of the transistor and a portion of the driving voltage line by removing a portion of the insulating pattern and the second insulating material layer.

According to embodiments of the present disclosure, a display device may be formed by a simplified manufacturing process by stably fixing the light emitting element using a contact electrode and the insulating pattern positioned thereon such that a separate configuration (e.g., a separate element or component) for fixing the light emitting element may be omitted.

In addition, a portion of the pixel circuit portion may be connected to a portion of a display element portion by using the insulating pattern, which has an opening in which the light emitting element is disposed, as an etching mask. Therefore, a display device may be formed by a simplified manufacturing process using fewer masks.

Additionally, a method of manufacturing the above-described display device may be provided.

Aspects and features of embodiments of the present disclosure are not limited to those described above and other aspects and features are described throughout the present specification.

BRIEF DESCRIPTION OF THE DRAWINGS

The above and other aspects and features of the present disclosure will become more apparent by describing, in further detail, example embodiments thereof with reference to the accompanying drawings, in which.

DETAILED DESCRIPTION

Figure 1A:
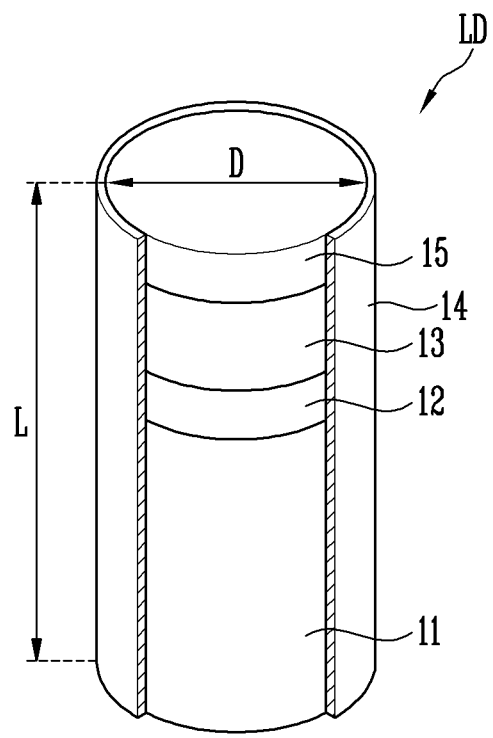
FIG. 1A is a perspective view schematically illustrating a light emitting element according to an embodiment of the present disclosure.

The present disclosure may be modified in various manners and may have various forms. Therefore, while example embodiments are illustrated in the drawings and will be described, in detail, in the specification, it should be understood that the present disclosure is not intended to be limited to the disclosed embodiments. The present disclosure includes all modifications, equivalents, and substitutions within the spirit and technical scope of the present disclosure.

Similar reference numerals are used to indicate similar components in describing the drawings. In the accompanying drawings, the dimensions of the structures may be enlarged from their actual dimensions for the sake of clarity. Terms, such as "first," "second," and the like, may be used to describe various components, but the components should not be limited by such terms. These terms are used only for the purpose of distinguishing one component from another component. For example, without departing from the scope of the present disclosure, a first component may be referred to as a second component, and similarly, a second component may be referred to as a first component. Singular expressions, such as "a" and "an," include plural expressions unless the context clearly indicates otherwise.

The terminology used herein is for the purpose of describing particular example embodiments of the present invention and is not intended to be limiting of the described example embodiments of the present invention. It should be understood that in the present disclosure, terms, such as "include," "comprise," "have," etc., and variations thereof, is used to specify that a feature, a number, a step, an operation, a component, a part, or a combination thereof described in the specification is present but does not exclude the possibility of the presence or addition of one or more other features, numbers, steps, operations, components, parts, or combinations thereof. In addition, when a portion of a layer, a film, an area, a plate, or the like is referred to as being "on" another portion, it includes not only an embodiment in which the portion is "directly on" the other portion but also an embodiment in which yet another portion is between the portion and the other portion. In addition, in the present disclosure, when a portion of a layer, a film, an area, a plate, or the like is formed on another portion, a forming direction is not limited to an upper direction (e.g., the formation is not limited to forming on an upper surface of the other portion) but includes forming the portion on a side surface or in a lower direction (e.g. on a lower surface). When a portion of a layer, a film, an area, a plate, or the like is formed "under" another portion, this includes not only an embodiment in which the portion is "directly beneath" the other portion but also an embodiment in which yet another portion is between the portion and the other portion.

Similarly, it will be understood that when an element or layer is referred to as being "connected to" or "coupled to" another element or layer, it may be directly connected or coupled to the other element or layer or one or more intervening elements or layers may also be present. When an element or layer is referred to as being "directly connected to" or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Hereinafter, example embodiments of the present disclosure will be described, in detail, with reference to the accompanying drawings such that the disclosure is thorough and complete.

Figure 1B:
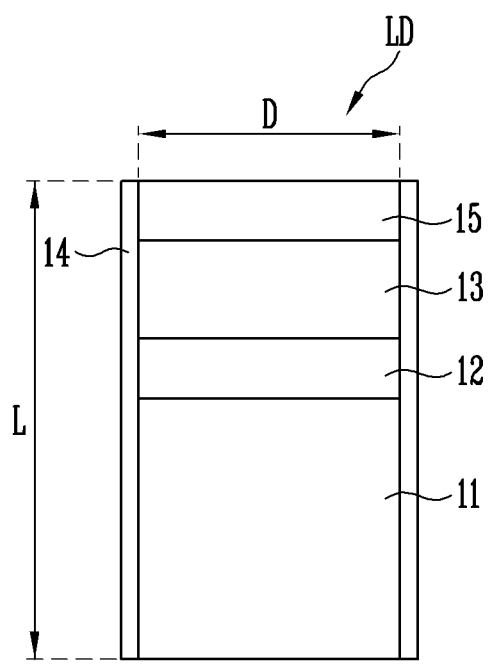
FIG. 1B is a cross-sectional view of the light emitting element shown in FIG. 1A.
Figure 2A:
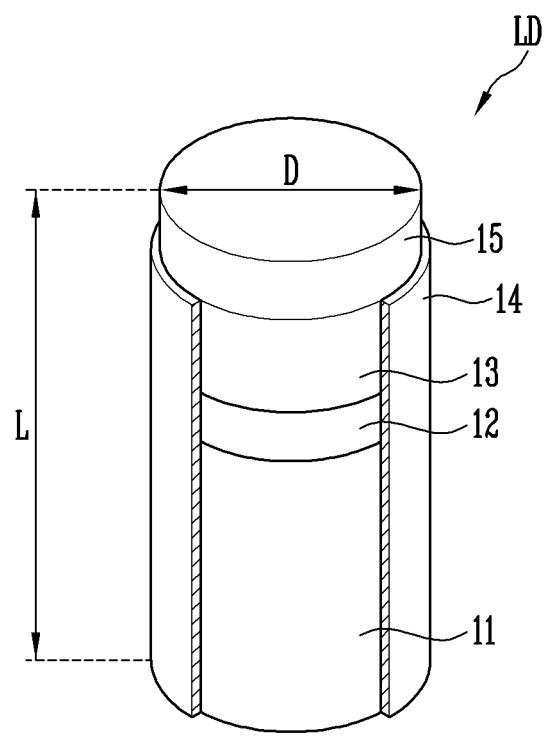
FIG. 2A is a perspective view schematically illustrating a light emitting element according to another embodiment of the present disclosure.
Figure 2B:
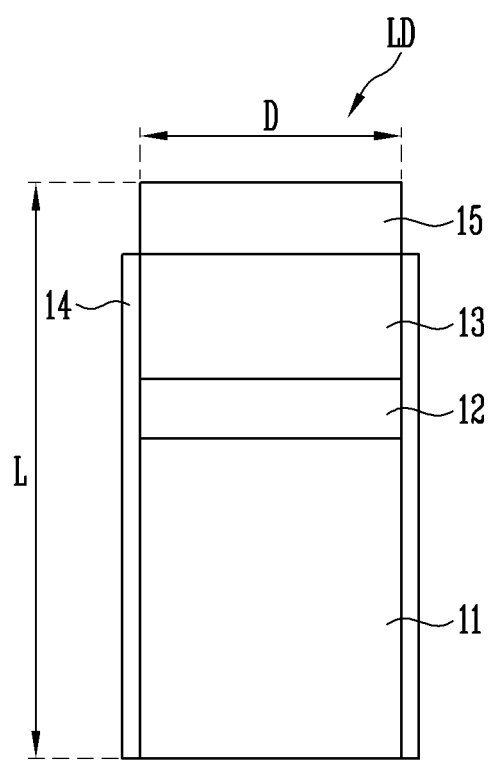
FIG. 2B is a cross-sectional view of the light emitting element shown in FIG. 2A.
Figure 3A:
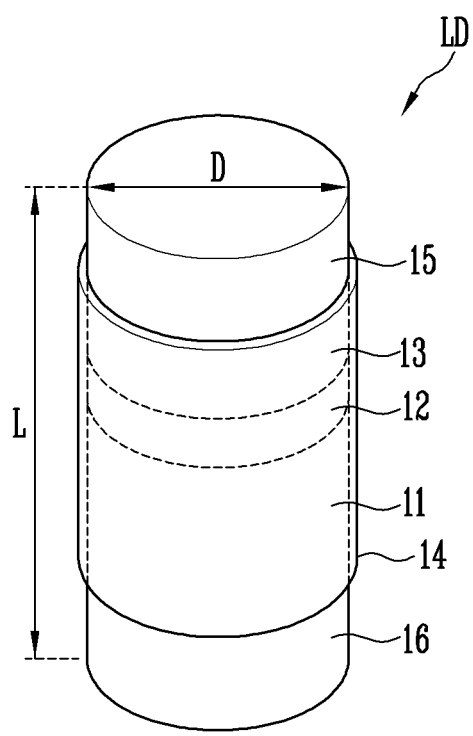
FIG. 3A is a perspective view schematically illustrating a light emitting element according to another embodiment of the present disclosure.
Figure 3B:
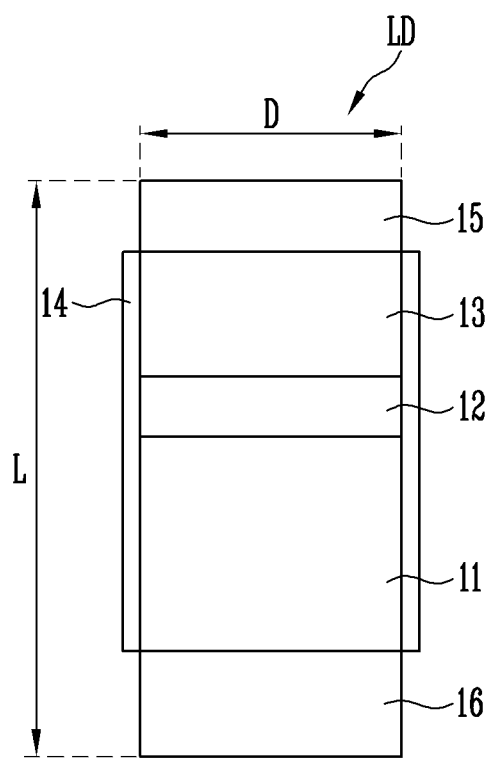
FIG. 3B is a cross-sectional view of the light emitting element shown in FIG. 3A.
Figure 4A:
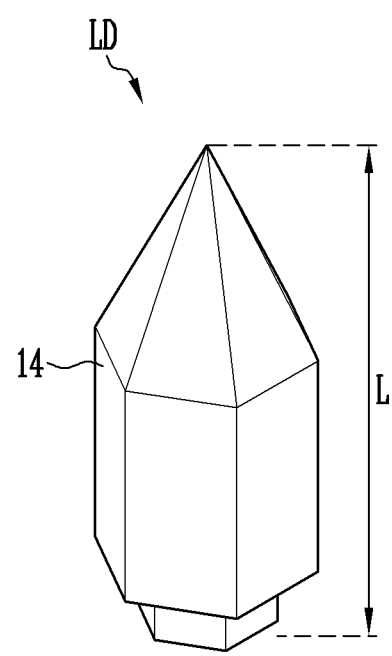
FIG. 4A is a perspective view schematically illustrating a light emitting element according to another embodiment of the present disclosure.
Figure 4B:
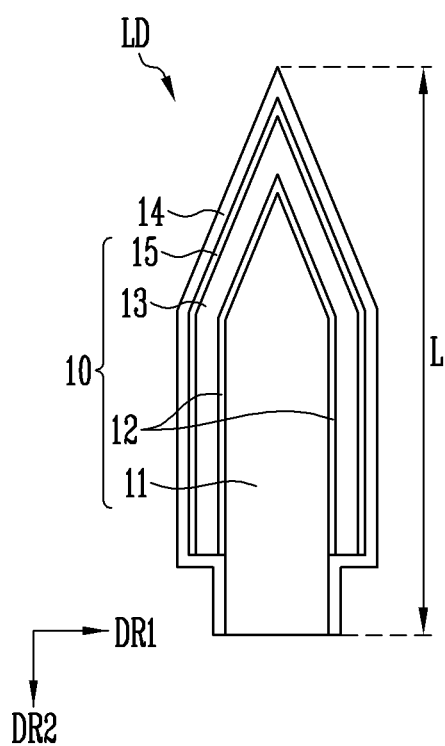
FIG. 4B is a cross-sectional view of the light emitting element shown in FIG. 4A.

FIG. 1A is a perspective view schematically illustrating a light emitting element according to an embodiment of the present disclosure, FIG. 1B is a cross-sectional view of the light emitting element shown in FIG. 1A, FIG. 2A is a perspective view schematically illustrating a light emitting element according to another embodiment of the present disclosure, FIG. 2B is a cross-sectional view of the light emitting element shown in FIG. 2A, FIG. 3A is a perspective view schematically illustrating a light emitting element according to another embodiment of the present disclosure, FIG. 3B is a cross-sectional view of the light emitting element shown in FIG. 3A, FIG. 4A is a perspective view schematically illustrating a light emitting element according to another embodiment of the present disclosure, and FIG. 4B is a cross-sectional view of the light emitting element shown in FIG. 4A.

The light emitting elements shown in FIGS. 1A, 1B, 2A, 2B, 3A, and 3B may be manufactured by an etching method, and the light emitting element shown in FIGS. 4A and 4B may be manufactured by a growth method. In an embodiment of the present disclosure, a type and/or a shape of the light emitting element are/is not limited to the embodiments illustrated in FIGS. 1A, 1B, 2A, 2B, 3A, 3B, 4A, and 4B.

Referring to FIGS. 1A, 1B, 2A, 2B, 3A, and 3B, the light emitting element LD may include a first semiconductor layer 11, a second semiconductor layer 13, and an active layer 12 interposed between the first semiconductor layer 11 and the second semiconductor layer 13. For example, the light emitting element LD may be implemented as a light emitting stack in which the first semiconductor layer 11, the active layer 12, and the second semiconductor layer 13 are sequentially stacked.

According to an embodiment of the present disclosure, the light emitting element LD may have a shape extending in one direction. When an extension direction of the light emitting element LD is referred to as a longitudinal direction, the light emitting element LD may have one side end and another side end along the extension (or longitudinal) direction. One semiconductor layer from among the first and second semiconductor layers 11 and 13 may be disposed at the one side end of the light emitting element LD, and the other of the first and second semiconductor layers 11 and 13 may be disposed at the other side end of the light emitting element LD.

The light emitting element LD may have various suitable shapes. For example, the light emitting element LD may have a rod-like shape or a bar-like shape that is long in (e.g., is longer in or is elongated in) the longitudinal direction (e.g., has an aspect ratio greater than 1). In an embodiment of the present disclosure, a length L of the light emitting element LD in the longitudinal direction may be greater than a diameter D (or a width of a cross section) of the light emitting element LD. The light emitting element LD may include, for example, a light emitting diode manufactured to be extremely small to have the diameter D and/or the length L of about a nano scale to a micro scale (e.g., may have a size in a range from about 1 nm to about 1,000 μm). In an embodiment of the present disclosure, a size of the light emitting element LD may be varied (e.g., selected) according to a requirement condition (or a design condition) of a lighting device or a self-luminous display device to which the light emitting element LD is to be applied.

The first semiconductor layer 11 may include at least one n-type semiconductor layer. For example, the first semiconductor layer 11 may include any one semiconductor material from among InAlGaN, GaN, AlGaN, InGaN, AlN, and InN and may include an n-type semiconductor layer doped with a first conductive dopant, such as Si, Ge, or Sn. However, the first semiconductor layer 11 is not limited to the above-described material configurations, and the first semiconductor layer 11 may include various suitable materials.

The active layer 12 may be disposed on the first semiconductor layer 11 and may be formed having a single or multiple quantum well structure. A position of the active layer 12 may be variously changed according to the type of the light emitting element LD. The active layer 12 may emit light in a wavelength of about 400 nm to about 900 nm and may have a double hetero structure. In an embodiment of the present disclosure, a clad layer doped with a conductive dopant may be formed on and/or under the active layer 12. For example, the clad layer may include (or may be formed of) an AlGaN layer or an InAlGaN layer. According to an embodiment, a material, such as AlGaN or InAlGaN, may be used to form (e.g., used to form or partially form) the active layer 12. In addition, various suitable materials may form the active layer 12.

When an electric field of having a reference voltage or more (e.g., a predetermined voltage or more) is applied to both ends (e.g., opposite ends) of the light emitting element LD, the light emitting element LD emits light as electron-hole pairs are combined in the active layer 12. The light emission from the light emitting element LD may be controlled by using such a principle such that the light emitting element LD may be used as a light source of various light emitting elements LD, including a pixel of a display device.

The second semiconductor layer 13 may be disposed on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material from among InAlGaN, GaN, AlGaN, InGaN, AlN, and InN and may include a p-type semiconductor layer doped with a second conductive dopant, such as Mg. However, the second semiconductor layer 13 is not limited to the above-described material configurations, and the second semiconductor layer 13 may include various suitable materials.

In an embodiment of the present disclosure, the first semiconductor layer 11 and the second semiconductor layer 13 may have widths (or thicknesses or lengths) different from each other in the direction of the length L (e.g., in the length direction L) of the light emitting element LD. For example, the first semiconductor layer 11 may be relatively wider (or relatively thicker or longer) than the second semiconductor layer 13 along the length direction L of the light emitting element LD. Therefore, the active layer 12 of the light emitting element LD may be positioned more adjacently to (e.g., nearer to) an upper surface of the second semiconductor layer 13 than to a lower surface of the first semiconductor layer 11, as shown in FIGS. 1A to 3B.

According to an embodiment of the present disclosure, the light emitting element LD may further include an additional electrode 15 disposed on the second semiconductor layer 13 in addition to the above-described first semiconductor layer 11, active layer 12, and second semiconductor layer 13. In addition, according to an embodiment and as shown in FIGS. 3A and 3B, the light emitting element LD may further include another additional electrode 16 disposed at one end of the first semiconductor layer 11.

The additional electrodes 15 and 16 may be ohmic contact electrodes, but are not limited thereto and may be Schottky contact electrodes. The additional electrodes 15 and 16 may include a metal or metal oxide, for example chromium (Cr), titanium (Ti), aluminum (Al), gold (Au), nickel (Ni), indium tin oxide (ITO), an oxide or an alloy thereof, and the like may be used alone or in combination, but the present disclosure is not limited thereto.

The materials included in each of the additional electrodes 15 and 16 may be the same as or different from each other. The additional electrodes 15 and 16 may be substantially transparent or translucent. Therefore, the light generated by the light emitting element LD may pass through the additional electrodes 15 and 16 and may be emitted to the outside of the light emitting element LD. According to an embodiment, the additional electrodes 15 and 16 may include an opaque metal such that the light generated by the light emitting element LD does not pass through the additional electrodes 15 and 16 and is emitted to the outside of the light emitting element LD through a region other than both ends of the light emitting element LD.

In an embodiment of the present disclosure, the light emitting element LD may further include an insulating film 14. However, according to an embodiment, the insulating film 14 may be omitted or may be provided so as to cover only a part (or portion) of the first semiconductor layer 11, the active layer 12, and the second semiconductor layer 13.

The insulating film 14 may prevent or substantially prevent an electrical short circuit that may occur when the active layer 12 contacts a conductive material other than the first semiconductor layer 11 and the second semiconductor layer 13. In addition, the insulating film 14 may improve a life (e.g., a lifetime) and efficiency of the light emitting element LD by reducing or minimizing a surface defect in the light emitting element LD. In addition, when a plurality of light emitting elements LD are closely disposed, the insulating film 14 may prevent or substantially prevent an unwanted short circuit that may occur between adjacent light emitting elements LD. However, while the active layer 12 prevents or substantially prevents an occurrence of a short circuit with an external conductive material, the presence or absence of the insulating film 14 is not limited.

As shown in FIGS. 1A and 1B, the insulating film 14 may be provided in a form entirely surrounding an outer circumferential surface (e.g., an outer periphery) of the light emitting stack including the first semiconductor layer 11, the active layer 12, the second semiconductor layer 13, and the additional electrode 15. For convenience of description, a portion of the insulating film 14 is omitted in FIG. 1A to show the underlying layers, and the first semiconductor layer 11, the active layer 12, the second semiconductor layer 13, and the additional electrode 15 included in the actual light emitting element LD may be surrounded by (e.g., surrounded along their peripheries by) the insulating film 14.

In the above-described embodiment, the insulating film 14 entirely surrounds the outer circumferential surface of each of the first semiconductor layer 11, the active layer 12, the second semiconductor layer 13, and the additional electrode 15, but the present disclosure is not limited thereto.

According to an embodiment and as shown in FIGS. 2A and 2B, the insulating film 14 may surround the outer circumferential surface of each of the first semiconductor layer 11, the active layer 12, and the second semiconductor layer 13 and may not surround the outer circumferential surface of the additional electrode 15 disposed on the second semiconductor layer 13 or may surround only a portion of the outer circumferential surface of the additional electrode 15 and may not surround the remaining portion of the outer circumferential surface of the additional electrode 15.

The insulating film 14 may expose at least both ends of the light emitting element LD. For example, the insulating film 14 may expose one end of the first semiconductor layer 11 and one end of the additional electrode 15 disposed at sides of the second semiconductor layer 13. In addition, according to an embodiment and as shown in FIGS. 3A and 3B, when the additional electrodes 15 and 16 are disposed at the both ends (e.g., the opposite ends) of the light emitting element LD, the insulating film 14 may expose at least one region of each of the additional electrodes 15 and 16. In another embodiment, the insulating film 14 may be omitted.

According to an embodiment of the present disclosure, the insulating film 14 may include a transparent insulating material. For example, the insulating film 14 may include one or more insulating materials selected from a group consisting of $SiO_2$, $Si_3N_4$, $Al_2O_3$, and $TiO_2$ but is not limited thereto, and various suitable materials having insulating properties may be used.

When the insulating film 14 is provided on the light emitting element LD, a short circuit between the active layer 12 and a first electrode and/or a second electrode (described in more detail below) may be prevented or substantially prevented. In addition, by forming the insulating film 14, the life and efficiency of the light emitting element LD may be improved by reducing or minimizing a surface defect in the light emitting element LD. In addition, when the plurality of light emitting elements LD are closely disposed, the insulating film 14 may prevent or substantially prevent an unwanted short circuit that may occur between adjacent light emitting elements LD.

The above-described light emitting elements LD may be used as a light emitting source of various display devices. The light emitting elements LD may be manufactured by a surface treatment process. For example, the plurality of light emitting elements LD are mixed in a fluid solution (e.g., a solvent) and supplied to each light emission area (e.g., a light emission area of each pixel or a light emission area of each sub pixel) so that the light emitting elements LD may be uniformly sprayed without aggregating (e.g., without ununiformly aggregating) in the solution.

The light emitting elements LD described above may be used in various types of devices that use a light source, including a display device. For example, when a plurality of light emitting elements LD are disposed in a light emission area of each pixel of a display panel, the light emitting elements LD may be used as a light source of each pixel. However, an application field of the light emitting element LD is not limited to the above-described example. For example, the light emitting element LD may be used in other types of devices that use a light source, such as a lighting device.

Next, the light emitting element LD manufactured by the growth method will be described with reference to FIGS. 4A and 4B.

The light emitting element LD manufactured by the growth method, shown in FIGS. 4A and 4B, will be described primarily based on differences from the above-described embodiments shown in FIGS. 1A to 3B, and elements and/or components of the light emitting element LD shown in FIGS. 4A and 4B that are not specially described may be the same or substantially similar to the above-described embodiments. In such cases, the same reference numerals are given to similar and/or the same components as those of the above-described embodiments.

Referring to FIGS. 4A and 4B, the light emitting element LD according to an embodiment of the present disclosure may include the first semiconductor layer 11, the second semiconductor layer 13, and the active layer 12 interposed between the first and second semiconductor layers 11 and 13. According to an embodiment, the light emitting element LD may include a light emission pattern 10 having a core-shell structure including the first semiconductor layer 11 positioned in a center, the active layer 12 surrounding at least one side of the first semiconductor layer 11, the second semiconductor layer 13 surrounding at least one side of the active layer 12, and the additional electrode 15 surrounding at least one side of the second semiconductor layer 13.

The light emitting element LD may have a polygonal horn shape extending in one direction. For example, the light emitting element LD may have a hexagonal horn shape. When the extension direction of the light emitting element LD is referred to as the length direction L, the light emitting element LD may have one end (e.g., a lower end) and another end (e.g., an upper end) along the length direction L. A portion of one semiconductor layer of the first and second semiconductor layers 11 and 13 may be exposed at the one end (e.g., the lower end) of the light emitting element LD, and a portion of the other semiconductor layer of the first and second semiconductor layers 11 and 13 may be exposed at the other end (e.g., the upper end) of the light emitting element LD. For example, a portion of the first semiconductor layer 11 may be exposed at the one end (e.g., the lower end) of the light emitting element LD, and a portion of the second semiconductor layer 13 may be exposed at the other end (e.g., the upper end) of the light emitting element LD. In such an embodiment, when the light emitting element LD is applied as a light source of the display device, the exposed portion of the first semiconductor layer 11 may contact a driving electrode driving the light emitting element LD, and the exposed portion of the second semiconductor layer 13 may contact another driving electrode.

According to an embodiment, when the light emitting element LD includes the additional electrode 15, a portion of the additional electrode 15 surrounding at least one side of the second semiconductor layer 13 may be exposed at the other end (e.g., the upper end) of the light emitting element LD. In such an embodiment, when the light emitting element LD is applied as the light source of the display device, the exposed portion of the additional electrode 15 may contact the other driving electrode and may be electrically connected to the other driving electrode.

In an embodiment of the present disclosure, the first semiconductor layer 11 may be positioned at a core, that is, a center of the light emitting element LD. The light emitting element LD may have a shape corresponding to a shape of the first semiconductor layer 11. For example, when the first semiconductor layer 11 has a hexagonal horn shape, the light emitting element LD and the light emission pattern 10 may also have a hexagonal horn shape.

The active layer 12 may be provided and/or formed in a shape surrounding the outer circumferential surface of the first semiconductor layer 11 in the length direction L of the light emitting element LD. For example, the active layer 12 may be provided and/or formed in a shape surrounding the region except for the other end of the first semiconductor layer 11 disposed at the lower side of the first semiconductor layer 11 in the length direction L of the light emitting element LD.

The second semiconductor layer 13 may be provided and/or formed in a shape surrounding the active layer 12 in the length direction L of the light emitting element LD and may include a semiconductor layer of a type different from that of the first semiconductor layer 11. For example, the second semiconductor layer 13 may include at least one p-type semiconductor layer.

In an embodiment of the present disclosure, the light emitting element LD may include the additional electrode 15 surrounding at least one side of the second semiconductor layer 13. The additional electrode 15 may be an ohmic contact electrode or a Schottky contact electrode electrically connected to the second semiconductor layer 13, but the present disclosure is not limited thereto.

As described above, the light emitting element LD may have the hexagonal horn shape as shown in FIGS. 4A and 4B in which both ends are protruded and may be implemented as the light emission pattern 10 having a core-shell structure including the first semiconductor layer 11 provided in the center thereof, the active layer 12 surrounding the first semiconductor layer 11, the second semiconductor layer 13 surrounding the active layer 12, and the additional electrode 15 surrounding the second semiconductor layer 13. The first semiconductor layer 11 may be disposed at the one end (e.g., the lower end) of the light emitting element LD having the hexagonal horn shape, and the additional electrode 15 may be disposed at the other end (e.g., the upper end) of the light emitting element LD.

In addition, according to an embodiment, the light emitting element LD may further include the insulating film 14 provided on an outer circumferential surface of the light emission pattern 10 having the core-shell structure. The insulating film 14 may include a transparent insulating material.

Figure 5:
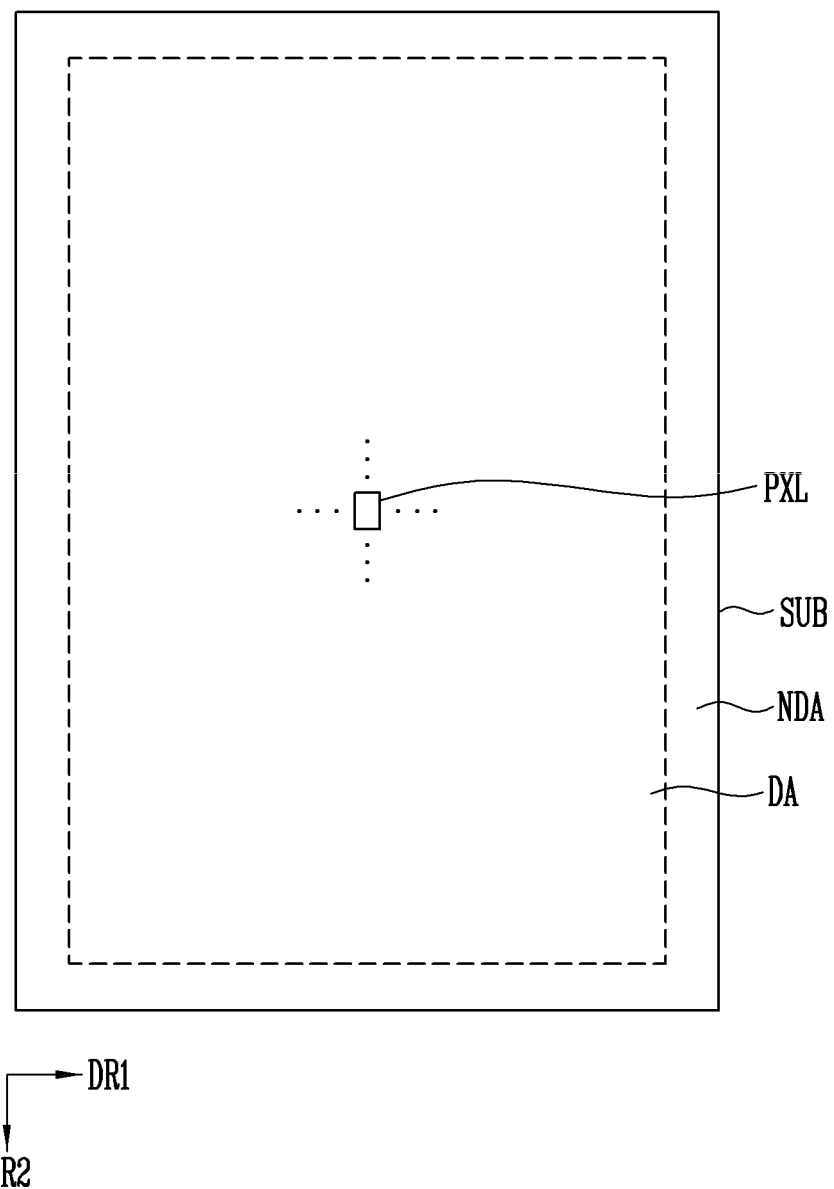
FIG. 5 is a schematic plan view illustrating a display device according to an embodiment of the present disclosure including, for example, any of the light emitting elements shown in FIGS. 1A to 4B as a light emitting source.

FIG. 5 is a schematic plan view illustrating a display device according to an embodiment of the present disclosure. The display device shown in FIG. 5 may use (or may include) any of the light emitting elements shown in FIGS. 1A, 1B, 2A, 2B, 3A, 3B, 4A, and 4B as a light emitting source.

In FIG. 5, for convenience, a structure of the display device is schematically shown based on a display area where an image is displayed. However, according to an embodiment, at least one driver (e.g., a scan driver, a data driver, and the like) and/or a plurality of signal lines may be further disposed in the display device.

Referring to FIGS. 1A to 5, the display device according to an embodiment of the present disclosure may include a substrate SUB, a plurality of pixels PXL provided on the substrate SUB, a driver provided on the substrate SUB and configured to drive the pixels PXL, and a line portion connecting the pixels PXL and the driver to each other. Each pixel PXL includes at least one light emitting element LD.

The display device may be a passive matrix display device or an active matrix display device according to a method of driving the light emitting element LD. For example, when the display device is an active matrix display device, each of the pixels PXL may include a driving transistor that controls a current amount supplied to the light emitting element LD, a switching transistor that transfers a data signal to the driving transistor, and the like.

Recently, the active matrix display device that selects and lights respective pixels PXL has become mainstream due to its improved resolution, contrast, and operation speed. However, the present disclosure is not limited thereto, and the passive matrix display device in which lighting is performed for each group of pixels PXL may also use components (e.g., the first and second electrodes and the like) for driving the light emitting element LD.

The substrate SUB may have a display area DA and a non-display area NDA.

According to an embodiment, the display area DA may be disposed at a center area of the display device, and the non-display area NDA may be disposed at an edge area of the display device to surround (e.g., to surround or extend around a periphery of) the display area DA. However, the positions of the display area DA and the non-display area NDA are not limited thereto, and the positions of the display area DA and the non-display area NDA may be changed.

The display area DA may be an area where the pixels PXL that display an image are provided. The non-display area NDA may be an area where the driver for driving the pixels PXL and a portion of the line portion connecting the pixels PXL and the driver to each other are provided.

The display area DA may have various shapes. For example, the display area DA may have a closed polygon shape including a side formed of a straight line (e.g., have one or more straight line sides). In addition, the display area DA may have a circular shape and/or an elliptical shape including a side formed of a curve (e.g., having a curved side). In addition, the display area DA may have various suitable shapes, such as a semicircle, a semi-ellipse, and the like including a side formed of a straight line and/or a curve.

The non-display area NDA may be provided on at least one side of the display area DA. In an embodiment of the present disclosure, the non-display area NDA may surround a periphery (or edge) of the display area DA.

A portion of the line portion connected to the pixels PXL and the driver connected to the line portion and for driving the pixels PXL may be arranged in the non-display area NDA.

The line portion may electrically connect the driver and the pixels PXL to each other. The line portion may provide a signal to each pixel PXL and may be signal lines connected to each pixel PXL, for example, fan-out lines connected to a scan line, a data line, an emission control line, and the like.

The substrate SUB may include a transparent insulating material and may transmit light. The substrate SUB may be a rigid substrate or a flexible substrate.

One area of the substrate SUB may be the display area DA on which the pixels PXL may be disposed, and the remaining area of the substrate SUB may be provided as the non-display area NDA. For example, the substrate SUB may include the display area DA including pixel areas in which each pixel PXL is disposed, and the non-display area NDA disposed around the display area DA.

Each of the pixels PXL may be provided in the display area DA on the substrate SUB. In an embodiment of the present disclosure, the pixels PXL may be arranged in the display area DA in a stripe or PenTile array structure, but the present disclosure is not limited thereto.

Each of the pixels PXL may include at least one light emitting element LD driven by corresponding scan signal and data signal. The light emitting element LD may have a small size on a nano scale to a micro scale and may be connected in parallel with adjacent light emitting elements, but the present disclosure is not limited thereto. The light emitting element LD may configure (or may form or constitute) a light source of each of the pixels PXL.

Each of the pixels PXL may include at least one light source driven by a signal (e.g., a scan signal and a data signal) and/or power (e.g., first driving power and second driving power). For example, each of the pixels PXL may include at least one micro light emitting element LD having a small size on about a nano scale to about a micro scale, as shown in each of the embodiments shown in FIGS. 1A to 4B. However, the type of the light emitting element LD that may be used as the light source of each of the pixels PXL is not limited thereto.

In an embodiment of the present disclosure, the color, type, number, and/or the like of the pixels PXL is not limited, and for example, the color of light emitted from each pixel PXL may be variously changed.

The driver may provide a signal and power to each pixel PXL through the line portion, thereby controlling driving of the pixel PXL.

The driver may include a scan driver that provides a scan signal to the pixels PXL through a scan line, an emission driver that provides an emission control signal to the pixels PXL through an emission control line, a data driver that provides a data signal to the pixels PXL through a data line, and a timing controller. The timing controller may control the scan driver, the emission driver, and the data driver.

FIGS. 6A to 6E are circuit diagrams illustrating an electrical connection relationship between components included in one pixel shown in FIG. 5 according to various embodiments.

For example, FIGS. 6A to 6E show the electrical connection relationship between the components included in the pixel PXL that may be applied to the active display device, according to different embodiments. However, types of the components included in the pixel PXL to which an embodiment of the present disclosure may be applied are not limited thereto.

In FIGS. 6A to 6E, not only the components included in each of the pixels PXL shown in FIG. 5 but also an area where the components are provided are referred to as the pixel PXL. According to an embodiment, each pixel PXL shown in FIGS. 6A to 6E may be any one of the pixels PXL included in the display device of FIG. 5, and the pixels PXL may have substantially the same or similar structure.

Referring to FIGS. 1A to 4B, 5, and 6A to 6E, one pixel PXL (hereinafter referred to as a "pixel") may include a light emitting unit EMU that generates light having a luminance corresponding to the data signal. In addition, the pixel PXL may selectively further include a pixel driving circuit 144 for driving the light emitting unit EMU.

According to an embodiment, the light emitting unit EMU may include a plurality of light emitting elements LD connected in parallel between a first power line PL1 to which a voltage of a first driving power VDD is applied and a second power line PL2 to which a voltage of a second driving power VSS is applied. For example, the light emitting unit EMU may include a first electrode EL1 (e.g., a "first alignment electrode") connected to the first driving power VDD via the pixel driving circuit 144 and the first power line PL1, a second electrode EL2 (e.g., a "second alignment electrode") connected to the second driving power VSS via the second power line PL2, and the plurality of light emitting elements LD connected in parallel in the same direction between the first and second electrodes EL1 and EL2. In an embodiment of the present disclosure, the first electrode EL1 may be an anode electrode, and the second electrode EL2 may be a cathode electrode.

In an embodiment of the present disclosure, each of the light emitting elements LD included in the light emitting unit EMU may include a first end connected to the first driving power VDD through the first electrode EL1 and a second end connected to the second driving power VSS through the second electrode EL2. The first driving power VDD and the second driving power VSS may have different potentials. For example, the first driving power VDD may be set as high potential power, and the second driving power VSS may be set as low potential power. A potential difference between the first driving power VDD and the second driving power VSS may be set as a threshold voltage or more of the light emitting elements LD during a light emission period of the pixel PXL.

As described above, the respective light emitting elements LD, which are connected in parallel in the same direction (e.g., a forward direction) between the first electrode EL1 and the second electrode EL2 to which voltages of different potentials are respectively supplied, may configure respective effective light sources. Such effective light sources may be gathered to form the light emitting unit EMU of the pixel PXL.

The light emitting elements LD of the light emitting unit EMU may emit light at a luminance corresponding to a driving current supplied through the corresponding pixel driving circuit 144. For example, the pixel driving circuit 144 may supply a driving current corresponding to a grayscale value of corresponding frame data to the light emitting unit EMU during each frame period. The driving current supplied to the light emitting unit EMU may be divided and flow to the light emitting elements LD connected in the same direction. Therefore, each of the light emitting elements LD may emit light at a luminance corresponding to the current flowing through the light emitting element LD, and thus, the light emitting unit EMU may emit light of the luminance corresponding to the driving current.

Figure 6A:
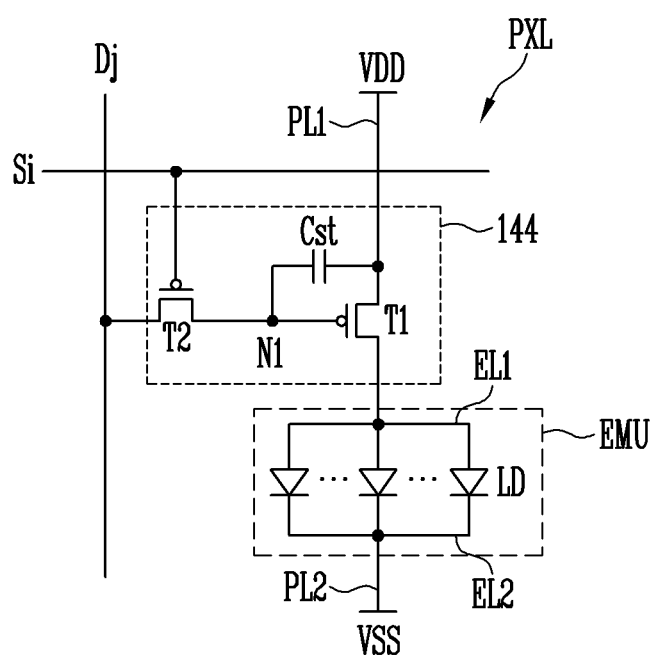
FIGS. 6A to 6E are circuit diagrams illustrating an electrical connection relationship between components included in one pixel shown in FIG. 5 according to embodiments of the present disclosure.
Figure 6B:
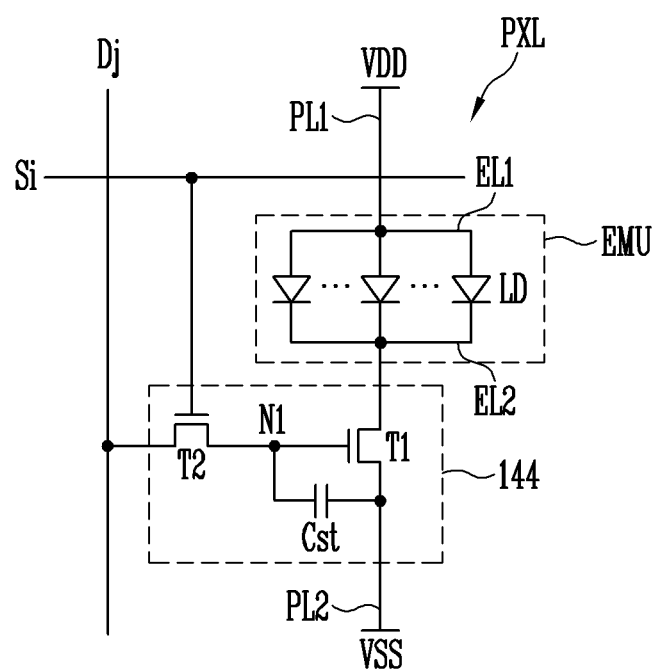
Figure 6C:
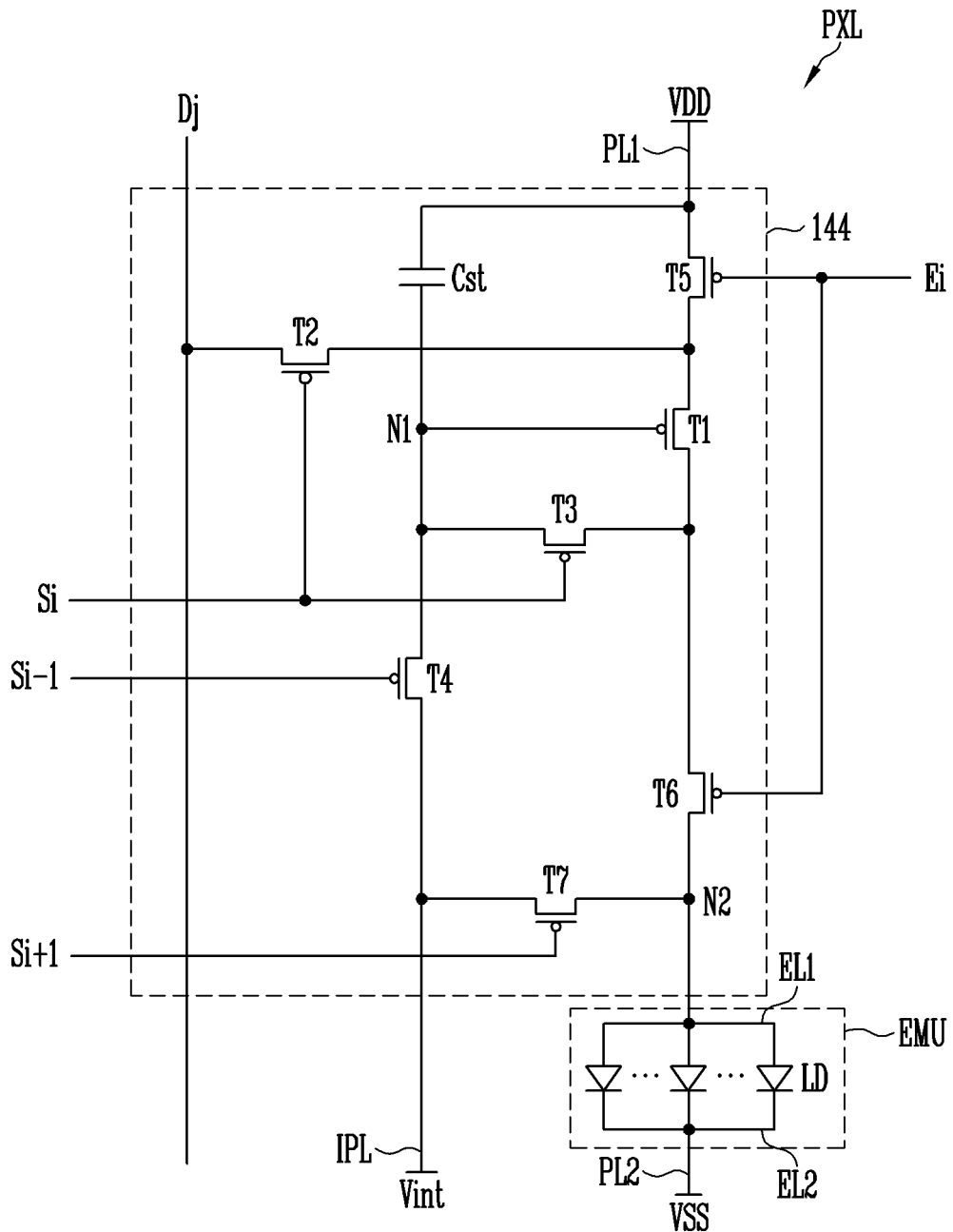
Figure 6D:
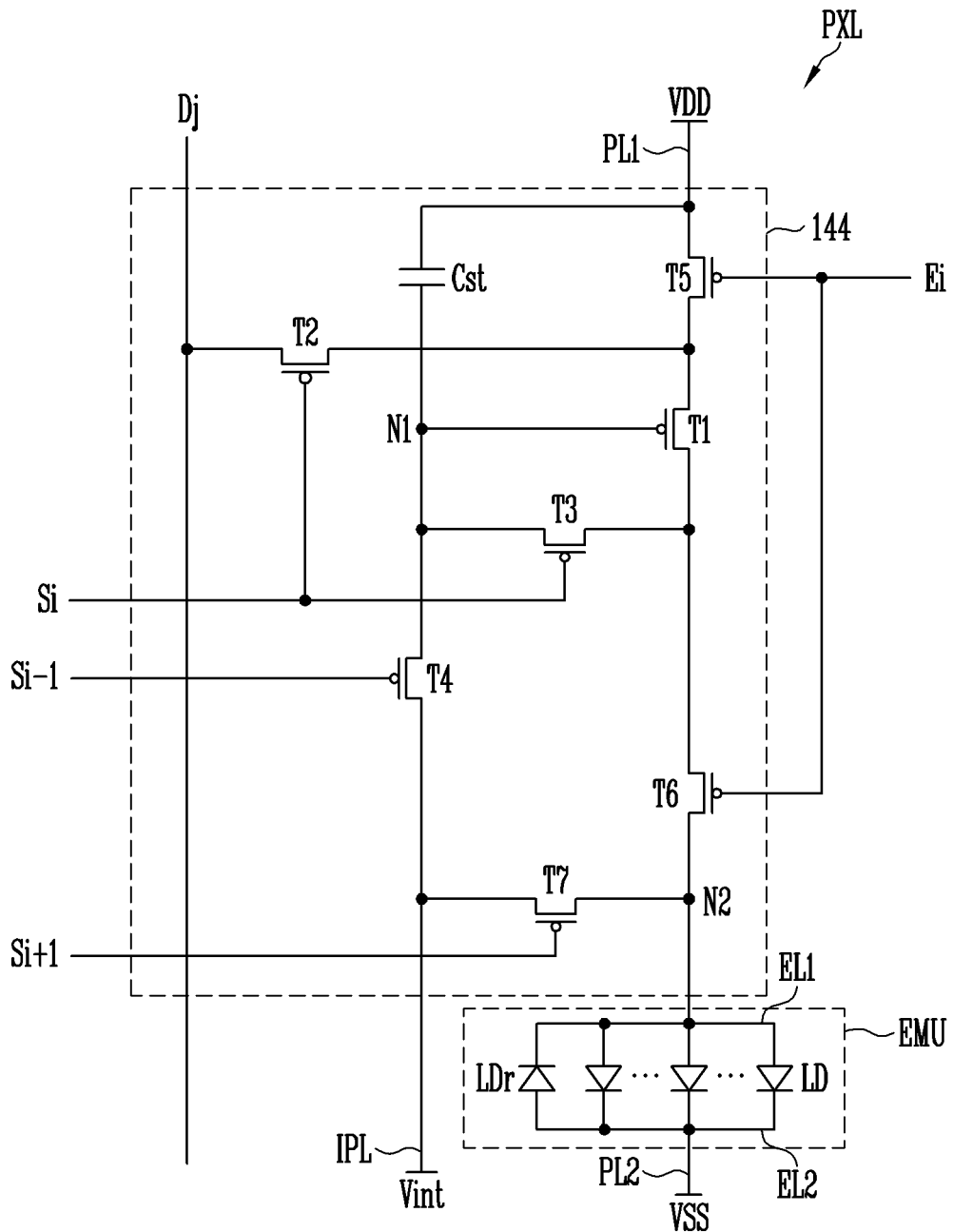
Figure 6E:
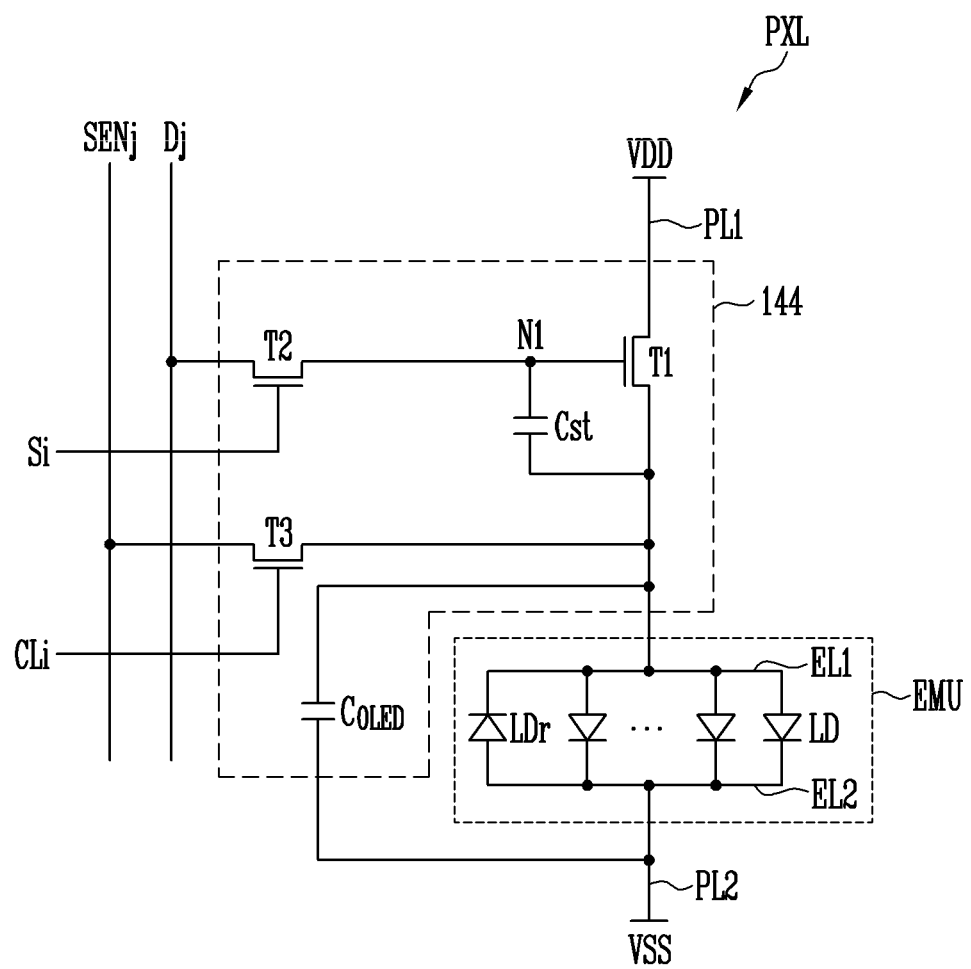

Meanwhile, FIGS. 6A to 6E show an embodiment in which the light emitting elements LD are connected in the same direction between the first driving power VDD and the second driving power VSS, but the present disclosure is not limited thereto. According to an embodiment, the light emitting unit EMU may further include at least one ineffective light source in addition to the light emitting elements LD configuring each effective light source. For example, at least a reverse light emitting element LDr may be further connected between the first and second electrodes EL1 and EL2 of the light emitting unit EMU, as shown in FIGS. 6D and 6E. The reverse light emitting element LDr may be connected in parallel between the first and second electrodes EL1 and EL2 together with the light emitting elements LD configuring the effective light sources and may be connected between the first and second electrodes EL1 and EL2 in a direction opposite to the light emitting elements LD. The reverse light emitting element LDr maintains an inactive state even though a driving voltage (e.g., a driving voltage in a forward direction) is applied between the first and second electrodes EL1 and EL2, and thus, a current substantially does not flow through the reverse light emitting element LDr.

The pixel driving circuit 144 may be connected to a scan line Si and a data line Dj of a corresponding pixel PXL. For example, when the pixel PXL is disposed in an i-th (i is a natural number) row and a j-th (j is a natural number) column of the display area DA, the pixel driving circuit 144 of the pixel PXL may be connected to the i-th scan line Si and the j-th data line Dj of the display area DA. According to an embodiment, the pixel driving circuit 144 may include first and second transistors T1 and T2 and a storage capacitor Cst as shown in FIGS. 6A and 6B. However, the pixel driving circuit 144 is not limited to the structures shown in FIGS. 6A and 6B.

Referring to FIG. 6A, the pixel driving circuit 144 may include the first and second transistors T1 and T2 and the storage capacitor Cst.

A first terminal of the second transistor T2 (e.g., a switching transistor) may be connected to the data line Dj, and a second terminal may be connected to a first node N1. The first terminal and the second terminal of the second transistor T2 may be different terminals. For example, when the first terminal is a source electrode, the second terminal may be a drain electrode. In addition, a gate electrode of the second transistor T2 may be connected to the scan line Si.

The second transistor T2 may be turned on when a scan signal of a voltage (e.g., a low voltage) at which the second transistor T2 may be turned on is supplied from the scan line Si to electrically connect the data line Dj and the first node N1 to each other. At this time, a data signal of a corresponding frame is supplied to the data line Dj, and thus, the data signal is transferred to the first node N1. The data signal transferred to the first node N1 is charged in the storage capacitor Cst.

A first terminal of the first transistor T1 (e.g., a driving transistor) may be connected to the first driving power VDD, and a second terminal may be electrically connected to the first electrode EL1 of each of the light emitting elements LD. A gate electrode of the first transistor T1 may be connected to the first node N1. The first transistor T1 controls an amount of driving current supplied to the light emitting elements LD corresponding to (e.g., based on) a voltage at the first node N1.

One electrode of the storage capacitor Cst may be connected to the first driving power VDD, and another electrode thereof may be connected to the first node N1. The storage capacitor Cst charges a voltage corresponding to the data signal supplied to the first node N1 and maintains the charged voltage until the data signal of a next frame is supplied.

The pixel driving circuit 144 shown in FIGS. 6A and 6B is shown including the second transistor T2 for transferring the data signal into the pixel PXL, the storage capacitor Cst for storing the data signal, and the first transistor T1 for supplying the driving current corresponding to the data signal to the light emitting elements LD.

However, the present disclosure is not limited thereto, and the structure of the pixel driving circuit 144 may be variously modified and implemented. For example, the pixel driving circuit 144 may further include other circuit elements, such as a transistor element, such as a transistor element for compensating for a threshold voltage of the first transistor T1, a transistor element for initializing the first node N1, and/or a transistor element for controlling a light emission time of the light emitting element LD, and/or a boosting capacitor for boosting the voltage of the first node N1.

In addition, in FIG. 6A, the transistors in the pixel driving circuit 144, for example, the first and second transistors T1 and T2 are P-type transistors, but the present disclosure is not limited thereto. For example, at least one of the first and second transistors T1 and T2 included in the pixel driving circuit 144 may be changed to an N-type transistor.

Next, referring to FIGS. 1A to 4B, 5, and 6B, according to an embodiment of the present disclosure, the first and second transistors T1 and T2 may be implemented as N-type transistors. A configuration or an operation of the pixel driving circuit 144 shown in FIG. 6B is similar to that of the pixel driving circuit 144 shown in FIG. 6A except for a connection position change of some of the components due to a transistor type change. Therefore, only a brief description thereof will be provided.

In an embodiment of the present disclosure, the pixel driving circuit 144 shown in FIG. 6B may include the first and second transistors T1 and T2 as N-type transistors and the storage capacitor Cst. When the first and second transistors T1 and T2 are N-type transistors, the light emitting unit EMU may be connected between the first driving power VDD and the pixel driving circuit 144 to stabilize the storage capacitor Cst that charges the voltage corresponding to the data signal supplied to the first node N1. However, the present disclosure is not limited thereto. According to an embodiment, the light emitting unit EMU shown in FIG. 6B may be connected between the pixel driving circuit 144 and the second driving power VSS. The pixel driving circuit 144 is not limited to the configuration shown in FIGS. 6A and 6B. For example, the pixel driving circuit 144 may be configured as shown in FIGS. 6C and 6D.

As shown in FIGS. 6C and 6D, the pixel driving circuit 144 may be connected to the scan line Si and the data line Dj of the pixel PXL. For example, when the pixel PXL is disposed in the i-th row and the j-th column of the display area DA, the pixel driving circuit 144 of the pixel PXL may be connected to the i-th scan line Si and the j-th data line Dj of a corresponding pixel PXL.

In addition, according to an embodiment, the pixel driving circuit 144 may be further connected to one or more other (e.g., additional) scan lines. For example, the pixel PXL disposed in the i-th row of the display area DA may be further connected to an (i−1)-th scan line Si−1 and/or an (i+1)-th scan line Si+1. In addition, according to an embodiment, the pixel driving circuit 144 may be further connected to third power in addition to the first driving power VDD and the second driving power VSS. For example, the pixel driving circuit 144 may also be connected to initialization power Vint.

The pixel driving circuit 144 may include first to seventh transistors T1 to T7 and a storage capacitor Cst.

One electrode, for example, a source electrode, of the first transistor T1 (e.g., the driving transistor) may be connected to the first driving power VDD via the fifth transistor T5, and another electrode, for example, a drain electrode, of the first transistor T1 may be connected to one side end of the light emitting elements LD via the sixth transistor T6. In addition, a gate electrode of the first transistor T1 may be connected to the first node N1. The first transistor T1 controls the driving current flowing between the first driving power VDD and the second driving power VSS via the light emitting elements LD corresponding to the voltage of the first node N1.

The second transistor T2 (e.g., the switching transistor) may be connected between the j-th data line Dj connected to the pixel PXL and the source electrode of the first transistor T1. In addition, a gate electrode of the second transistor T2 may be connected to the i-th scan line Si connected to the pixel PXL. The second transistor T2 may be turned on when a scan signal having a gate-on voltage (e.g., a low voltage) is supplied from the i-th scan line Si to electrically connect the j-th data line Dj to the source electrode of the first transistor T1. Therefore, when the second transistor T2 is turned on, the data signal supplied from the j-th data line Dj is transferred to the first transistor T1.

The third transistor T3 may be connected between the drain electrode of the first transistor T1 and the first node N1. In addition, a gate electrode of the third transistor T3 may be connected to the i-th scan line Si. The third transistor T3 may be turned on when the scan signal having the gate-on voltage is supplied from the i-th scan line Si to electrically connect the drain electrode of the first transistor T1 and the first node N1 to each other.

The fourth transistor T4 may be connected between the first node N1 and an initialization power line IPL to which the initialization power Vint is applied. In addition, a gate electrode of the fourth transistor T4 may be connected to a previous scan line, for example, the (i−1)-th scan line Si−1. The fourth transistor T4 may be turned on when the scan signal having the gate-on voltage is supplied to the (i−1)-th scan line Si−1 to transfer a voltage of the initialization power Vint to the first node N1. The initialization power Vint may have a voltage equal to or less than the lowest voltage of the data signal (e.g., equal to or less than the lowest data signal voltage).

The fifth transistor T5 may be connected between the first driving power VDD and the first transistor T1. In addition, a gate electrode of the fifth transistor T5 may be connected to a corresponding emission control line, for example, an i-th emission control line Ei. The fifth transistor T5 may be turned off when a light emission control signal having a gate-off voltage is supplied to the i-th emission control line Ei and may be turned on in other instances.

The sixth transistor T6 may be connected between the first transistor T1 and the one end of the light emitting elements LD. In addition, a gate electrode of the sixth transistor T6 may be connected to the i-th emission control line Ei. The sixth transistor T6 may be turned off when the light emission control signal having the gate-off voltage is supplied to the i-th emission control line Ei and may be turned on in other instances.

The seventh transistor T7 may be connected between the one end of the light emitting elements LD and the initialization power line IPL. In addition, a gate electrode of the seventh transistor T7 may be connected to any one of next scan lines, for example, the (i+1)-th scan line Si+1. The seventh transistor T7 may be turned on when the scan signal having the gate-on voltage is supplied to the (i+1)-th scan line Si+1 to supply the initialization power Vint (e.g., to supply the voltage of the initialization power Vint) to the one end of the light emitting elements LD.

The storage capacitor Cst may be connected between the first driving power VDD and the first node N1. The storage capacitor Cst may store a data signal supplied to the first node N1 and a voltage corresponding to the threshold voltage of the first transistor T1 during each frame period.

In FIGS. 6C and 6D, the transistors included in the pixel driving circuit 144, for example, the first to seventh transistors T1 to T7, are P-type transistors, but the present disclosure is not limited thereto. For example, at least one of the first to seventh transistors T1 to T7 may be changed to an N-type transistor.

In an embodiment of the present disclosure, the pixel driving circuit 144 is not limited to the configuration shown in FIGS. 6A to 6D. For example, the pixel driving circuit 144 may be configured as in the embodiment shown in FIG. 6E.

The pixel driving circuit 144 may be further connected to a control line CLi and a sensing line SENj as shown in FIG. 6E. For example, the pixel driving circuit 144 of the pixel PXL disposed in the i-th row and the j-th column of the display area DA may be connected to an i-th control line CLi and a j-th sensing line SENj of the display area DA. The above-described pixel driving circuit 144 may further include a third transistor T3 in addition to the first and second transistors T1 and T2 (see, e.g., FIGS. 6A and 6B).

The third transistor T3 is connected between the first transistor T1 and the sensing line SENj. For example, one electrode of the third transistor T3 may be connected to the one terminal (e.g., the source electrode) of the first transistor T1 connected to the first electrode EL1, and another electrode of the third transistor T3 may be connected to the sensing line SENj. According to an embodiment, the gate electrode of the third transistor T3 is connected to the control line CLi. The third transistor T3 may be turned on by a control signal having a gate-on voltage (e.g., a high level) supplied to the control line CLi during a sensing period (e.g., a predetermined sensing period) to electrically connect the sensing line SENj and the first transistor T1 to each other.

According to an embodiment, a sensing period may be a period for extracting characteristic information (e.g., the threshold voltage or the like of the first transistor T1) of each of the pixels PXL disposed in the display area DA. During the above-described sensing period, the first transistor T1 may be turned on by supplying a reference voltage (e.g., a predetermined reference voltage) at which the first transistor T1 may be turned on is supplied to the first node N1 through the data line Dj and the second transistor T2, or by connecting each pixel PXL to a current source or the like. In addition, the first transistor T1 may be connected to the sensing line SENj by supplying the control signal having the gate-on voltage to the third transistor T3 to turn on the third transistor T3. Therefore, the characteristic information of each pixel PXL, including the threshold voltage or the like of the first transistor T1, may be extracted through the sensing line SENj described above. The extracted characteristic information may be used to convert image data so that a characteristic deviation between the pixels PXL may be compensated.

While FIG. 6E discloses an embodiment in which all of the first to third transistors T1 to T3 are N-type transistors, but the present disclosure is not limited thereto. For example, at least one of the above-described first to third transistors T1 to T3 may be changed to a P-type transistor. In addition, FIG. 6E discloses an embodiment in which the light emitting unit EMU is connected between the pixel driving circuit 144 and the second driving power VSS, but the light emitting unit EMU may be connected between the first driving power VDD and the pixel driving circuit 144.

In addition, FIGS. 6A to 6E show embodiments in which all of the light emitting elements LD configuring (or forming) each light emitting unit EMU are connected in parallel, but the present disclosure is not limited thereto. According to an embodiment, the light emitting unit EMU may be configured to include at least one series stage including a plurality of light emitting elements LD connected to each other in parallel. For example, the light emitting unit EMU may be configured in a serial/parallel mixed structure. This will be described in more detail below with reference to FIGS. 7A and 7B.

The pixel PXL according to present disclosure is not limited to the embodiments shown in FIGS. 6A to 6E, and the pixel PXL may have various other suitable structures. In addition, in another embodiment of the present disclosure, each pixel PXL may be part of (e.g., configured inside) a passive light emitting display device or the like. In such an embodiment, the pixel driving circuit 144 may be omitted, and each of the ends of the light emitting elements LD included in the light emitting unit EMU may be directly connected to the scan lines Si−1, Si, and Si+1, the data line Dj, the first power line PL1 to which the first driving power VDD is applied, the second power line PL2 to which the second driving power VSS is applied, a control line (e.g., a predetermined control line), and/or the like.

Figure 7A:
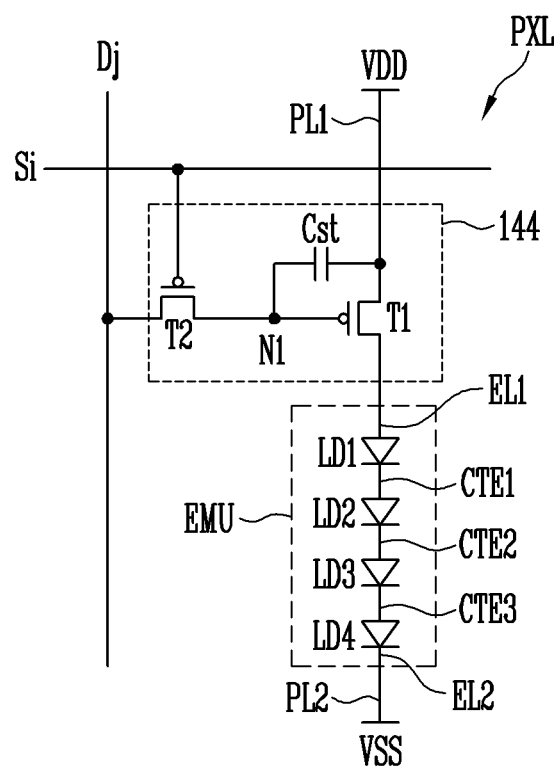
FIGS. 7A and 7B are circuit diagrams illustrating an electrical connection relation of the components included in one pixel shown in FIG. 5 according to embodiments of the present disclosure.
Figure 7B:
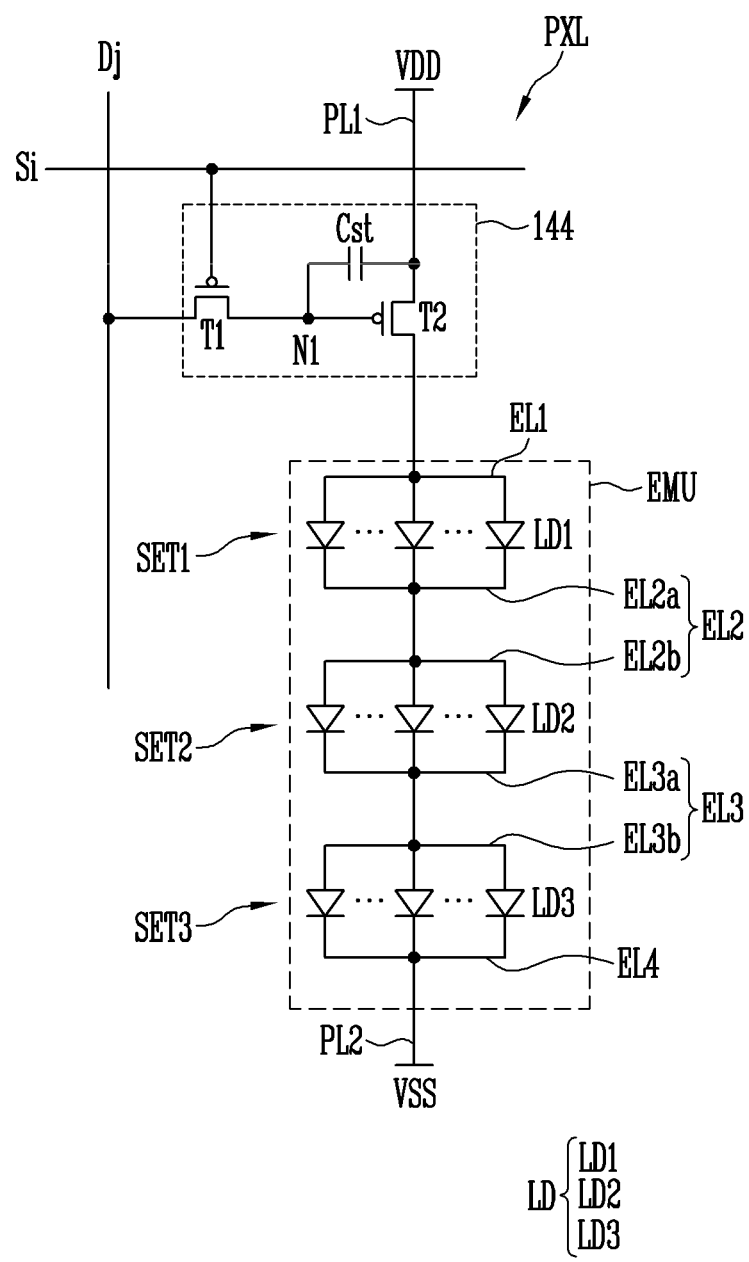

FIGS. 7A and 7B are circuit diagrams illustrating the electrical connection relation of components included in one pixel PXL shown in FIG. 5 according to other embodiments. In FIGS. 7A and 7B, the light emitting unit EMU of each pixel PXL may include a plurality of serial terminals which are continuously connected to each other. In describing the embodiments shown in FIGS. 7A and 7B, in order to avoid repetitive description, detailed description of the same or substantially similar configurations to that of the embodiments shown in FIGS. 6A to 6E, for example, the pixel driving circuit 144, will be omitted.

First, referring to FIG. 7A, the light emitting unit EMU may include a plurality of light emitting elements connected to each other in series. For example, the light emitting unit EMU may include a first light emitting element LD1, a second light emitting element LD2, a third light emitting element LD3, and a fourth light emitting element LD4 connected in series in a forward direction between the first driving power VDD and the second driving power VSS to configure an effective light source. In the following embodiment, at least one random light emitting element from among the first to fourth light emitting elements LD1 to LD4 or collectively the first to fourth light emitting elements LD1 to LD4 may be referred to as the light emitting element LD or the light emitting elements LD.

One end (e.g., the second semiconductor layer) of the first light emitting element LD1 may be connected to the first driving power VDD through the first electrode EL1, and another end (e.g., the first semiconductor layer) of the first light emitting element LD1 may be connected to one end (e.g., the second semiconductor layer) of the second light emitting element LD2 through a first intermediate electrode CTE1 connected between first and second series stages.

The one end (e.g., the second semiconductor layer) of the second light emitting element LD2 may be connected to the first intermediate electrode CTE1, and another end (e.g., the first semiconductor layer) of the second light emitting element LD2 may be connected to one end (e.g., the second semiconductor layer) of the third light emitting element LD3 through a second intermediate electrode CTE2 connected between second and third series stages.

The one end of the third light emitting element LD3 may be connected to the second intermediate electrode CTE2, and another end (e.g., the first semiconductor layer) of the third light emitting element LD3 may be connected to one end (e.g., the second semiconductor layer) of the fourth light emitting element LD4 through a third intermediate electrode CTE3 connected between third and fourth series stages.

The one end of the fourth light emitting element LD4 may be connected to the third intermediate electrode CTE3, and another end (e.g., the first semiconductor layer) of the fourth light emitting element LD4 may be connected to the second driving power VSS through the second electrode EL2.

As described above, the first to fourth light emitting elements LD1 to LD4 may be connected in series between the first and second electrodes EL1 and EL2 of the light emitting unit EMU of the pixel PXL.

In an embodiment in which the light emitting unit EMU has a structure in which the light emitting elements LD are connected in series, a voltage applied between the first and second electrodes EL1 and EL2 may increase and a magnitude of the driving current flowing through the light emitting unit EMU may decrease compared to a light emitting unit EMU having a structure in which the light emitting elements LD are connected in parallel. Therefore, when the light emitting unit EMU of each pixel PXL is configured in a serial structure, power consumption of the display device may be reduced.

According to an embodiment, at least one series stage may be provided in a form including a plurality of light emitting elements LD connected in parallel to each other. The light emitting unit EMU of each pixel PXL may be configured in a series/parallel mixed structure. For example, the light emitting unit EMU may be configured as shown in FIG. 7B.

Next, referring to FIG. 7B, the light emitting unit EMU of the pixel PXL may include a plurality of series stages sequentially connected between the first and second driving power VDD and VSS. In addition, each series stage may include one or more light emitting elements LD connected in a forward direction between two electrodes configuring an electrode pair of a corresponding series stage. For example, the light emitting unit EMU may include first to third series stages SET1 to SET3 sequentially connected between the first and second driving power sources VDD and VSS. Each of the first to third series stages SET1 to SET3 includes two electrodes EL1 and EL2a, EL2b and EL3a, and EL3b and EL4 configuring an electrode pair of a corresponding series stage, and a plurality of light emitting elements LD connected in parallel in the forward direction, for example, in the same direction, between each of the two electrodes EL1 and EL2a, EL2b and EL3a, and EL3b and EL4.

The first series stage SET1 may include the first electrode EL1 and the 2a-th electrode EL2a from among the electrode pairs EL1 and EL2a, EL2b and EL3a, and EL3b and EL4, which form the electrode pairs included in the light emitting unit EMU and may include at least one first light emitting element LD1 connected between the first electrode EL1 and the 2a-th electrode EL2a. For example, the first series stage SET1 may include the first electrode EL1 connected to the first driving power VDD via the pixel driving circuit 144, the 2a-th electrode EL2a connected to the second driving power VSS, and a plurality of first light emitting elements LD1 connected between the first electrode EL1 and the 2a-th electrode EL2a. One end (e.g., the second semiconductor layer) of each first light emitting element LD1 is electrically connected to the first electrode EL1 of the first series stage SET1, and another end (e.g., the first semiconductor layer) thereof is electrically connected to the 2a-th electrode EL2a of the first series stage SET1. The first light emitting elements LD1 may be connected in parallel between the first electrode EL1 and the 2a-th electrode EL2a of the first series stage SET1 and may be connected in the same direction (e.g., the forward direction) between the first electrode EL1 and the 2a-th electrode EL2a.

According to an embodiment, at least one reverse light emitting element (see, e.g., LDr in FIG. 6E) may be further connected to the first series stage SET1. The reverse light emitting element LDr may be connected in parallel between the first electrode EL1 and the 2a-th electrode EL2a together with the first light emitting elements LD1 configuring effective light sources and may be connected between the first electrode EL1 and the 2a-th electrode EL2a in a direction opposite to that of the first light emitting elements LD1. The reverse light emitting element LDr maintains an inactive state even though a driving voltage (e.g., a driving voltage in a forward direction) is applied between the first and electrodes EL1 and EL2a. Therefore, a current does not flow or substantially flow through the reverse light emitting element LDr.

The second series stage SET2 may include the 2b-th electrode EL2b and the 3a-th electrode EL3a from among the electrode pairs EL1 and EL2a, EL2b and EL3a, and EL3b and EL4, which form the electrode pairs included in the light emitting unit EMU and may include at least one second light emitting element LD2 connected between the 2b-th electrode EL2b and the 3a-th electrode EL3a. For example, the second series stage SET2 may include the 2b-th electrode EL2b connected to the first driving power VDD via the first series stage SET1, the 3a-th electrode EL3a connected to the second driving power VSS, and a plurality of second light emitting elements LD2 connected between the 2b-th electrode EL2b and the 3a-th electrode EL3a. One end (e.g., the second semiconductor layer) of each second light emitting element LD2 is electrically connected to the 2b-th electrode EL2b of the second series stage SET2, and another end (e.g., the first semiconductor layer) thereof is electrically connected to the 3a-th electrode EL3a of the second series stage SET2. The second light emitting elements LD2 may be connected in parallel between the 2b-th electrode EL2b and the 3a-th electrode EL3a of the second series stage SET2 and may be connected in the same direction (e.g., the forward direction) between the first and second driving power VDD and VSS through the 2b-th electrode EL2b and the 3a-th electrode EL3a.

According to an embodiment, at least one reverse light emitting element (see, e.g., LDr in FIG. 6E) may be further connected between the 2b-th electrode EL2b and the 3a-th electrode EL3a. The reverse light emitting element LDr may be connected in parallel between the 2b-th electrode EL2b and the 3a-th electrode EL3a together with the second light emitting elements LD2 configuring effective light sources and may be connected between the 2b-th electrode EL2b and the 3a-th electrode EL3a in a direction opposite to that of the second light emitting elements LD2.

In an embodiment of the present disclosure, the 2a-th electrode EL2a of the first series stage SET1 and the 2b-th electrode EL2b of the second series stage SET2 may be integrally provided and connected to each other. For example, the 2a-th electrode EL2a of the first series stage SET1 and the 2b-th electrode EL2b of the second series stage SET2 may configure the second electrode EL2 electrically connecting the first series stage SET1 and the second series stage SET2 to each other. As described above, when the 2a-th electrode EL2a of the first series stage SET1 and the 2b-th electrode EL2b of the second series stage SET2 are integrally provided, the 2a-th electrode EL2a and the 2b-th electrode EL2b may be different areas (or portions) of the second electrode EL2.

The third series stage SET3 may include the 3b-th electrode EL3b and the fourth electrode EL4 from among the electrode pairs EL1 and EL2a, EL2b and EL3a, and EL3b and EL4, which form the electrode pairs included in the light emitting unit EMU and may include at least one third light emitting element LD3 connected between the 3b-th electrode EL3b and the fourth electrode EL4. For example, the third series stage SET3 may include the 3b-th electrode EL3b connected to the first driving power VDD via the pixel driving circuit 144 and previous series stages, for example, the first and second series stages SET1 and SET2, the fourth electrode EL4 connected to the second driving power VSS, and a plurality of third light emitting elements LD3 connected between the 3b-th electrode EL3b and the fourth electrode EL4. One end (e.g., the second semiconductor layer) of each third light emitting element LD3 is electrically connected to the 3b-th electrode EL3b of the third series stage SET3, and another end (e.g., the first semiconductor layer) thereof is electrically connected to the fourth electrode EL4 of the third series stage SET3. The third light emitting elements LD3 may be connected in parallel between the 3b-th electrode EL3b and the fourth electrode EL4 of the third series stage SET3 and may be connected in the same direction (e.g., the forward direction) between the first and second driving power VDD and VSS through the 3b-th electrode EL3b and the fourth electrode EL4.

According to an embodiment, at least one reverse light emitting element (see, e.g., LDr in FIG. 6E) may be further connected between the 3b-th electrode EL3b and the fourth electrode EL4. The reverse light emitting element LDr may be connected in parallel between the 3b-th electrode EL3b and the fourth electrode EL4 together with the third light emitting elements LD3 configuring effective light sources and may be connected between the 3b-th electrode EL3b and the fourth electrode EL4 in a direction opposite to that of the third light emitting elements LD3.

In an embodiment of the present disclosure, the 3a-th electrode EL3a of the second series stage SET2 and the 3b-th electrode EL3b of the third series stage SET3 may be integrally provided and connected to each other. For example, the 3a-th electrode EL3a of the second series stage SET2 and the 3b-th electrode EL3b of the third series stage SET3 may configure a third electrode EL3 electrically connecting the second series stage SET2 and the third series stage SET3 to each other. As described above, when the 3a-th electrode EL3a of the second series stage SET2 and the 3b-th electrode EL3b of the third series stage SET3 are integrally provided, the 3a-th electrode EL3a and the 3b-th electrode EL3b may be different areas (or portions) of the third electrode EL3.

In the above-described embodiment, the first electrode EL1 of the first series stage SET1 may be the anode electrode of the light emitting unit EMU in each pixel PXL, and the fourth electrode of the third series stage SET3 may be the cathode electrode of the light emitting unit EMU.

As described above, the light emitting unit EMU of the pixel PXL including the light emitting elements LD connected in the series/parallel mixed structure may easily adjust a driving current/voltage condition according to an applied product specification.

For example, the light emitting unit EMU of the pixel PXL including the light emitting elements LD connected in the series/parallel mixed structure may reduce the driving current compared to the light emitting unit EMU having the structure in which the light emitting elements LD are connected in parallel (e.g., are connected only in parallel). In addition, the light emitting unit EMU of the pixel PXL including the light emitting elements LD connected in the series/parallel mixed structure may reduce the driving voltage applied to the both ends of the light emitting unit EMU compared to the light emitting unit EMU having the structure in which all of the light emitting elements LD are connected in series. In addition, in an embodiment in which all of the light emitting elements LD are connected in series, when at least one of the light emitting elements LD connected in series is not completely connected in the forward direction (e.g., when a reverse light emitting element LDr is included), a path through which the driving current may flow in the pixel PXL is blocked, thereby causing a dark spot defect. On the other hand, in an embodiment in which the light emitting elements LD are connected in the series/parallel mixed structure, even though some light emitting elements LD are not connected in the forward direction (e.g., when a reverse light emitting element LDr is included) or a defect occurs in some light emitting elements LD in each series stage, the driving current may flow through another light emitting element LD of a corresponding series stage. Accordingly, a defect in the pixel PXL (e.g., a defect caused by a misaligned or reversed light emitting element) may be prevented or reduced.

Figure 8:
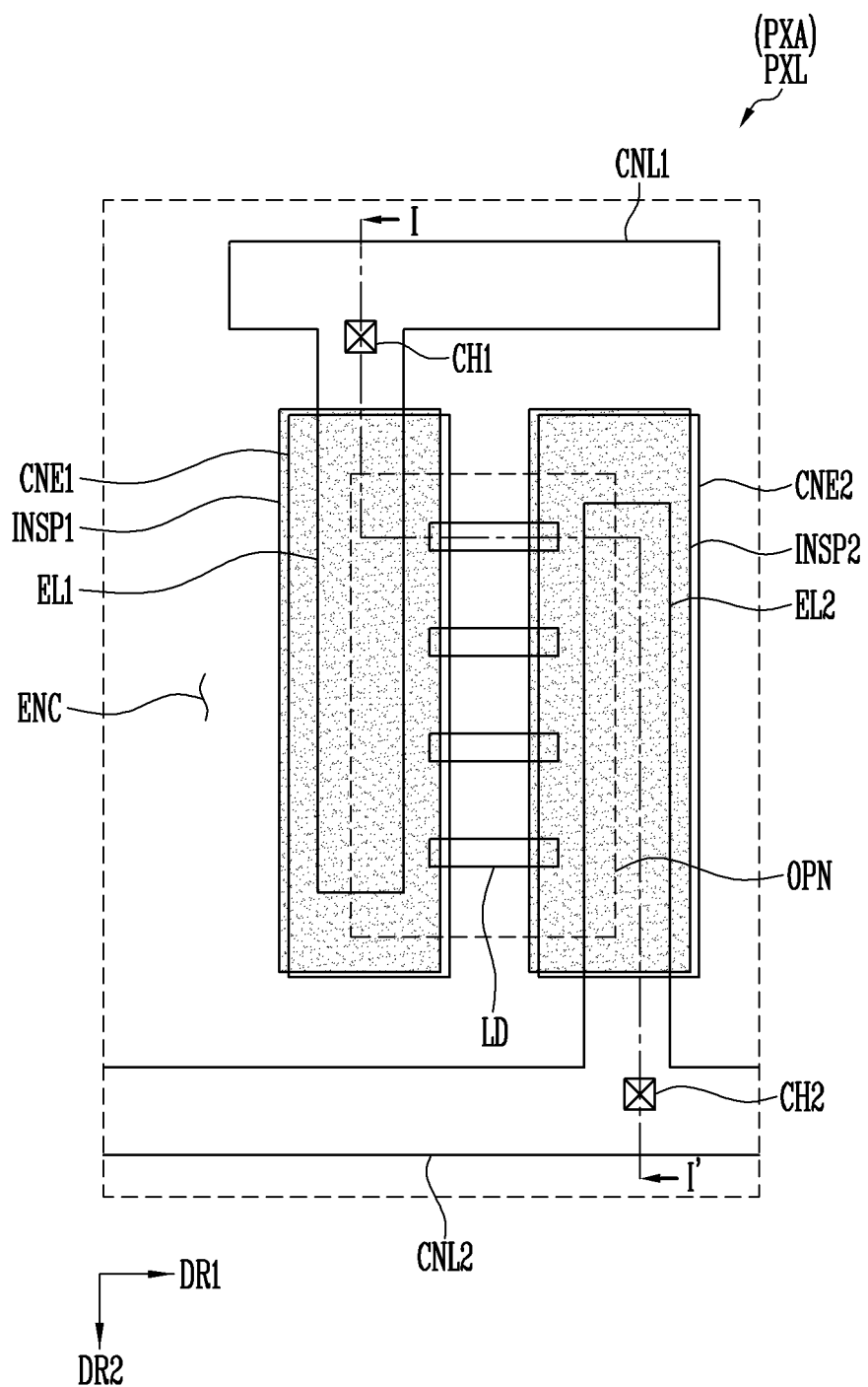
FIG. 8 is a plan view schematically illustrating one pixel shown in FIG. 5.
Figure 9:
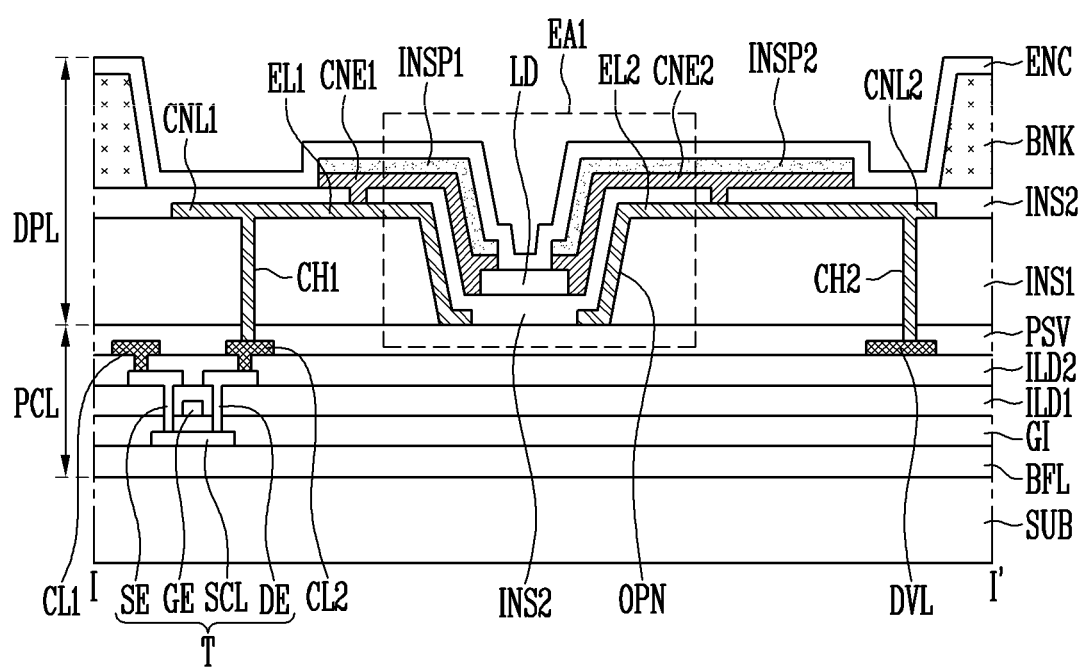
FIG. 9 is a cross-sectional view taken along the line I-I' of FIG. 8.
Figure 10:
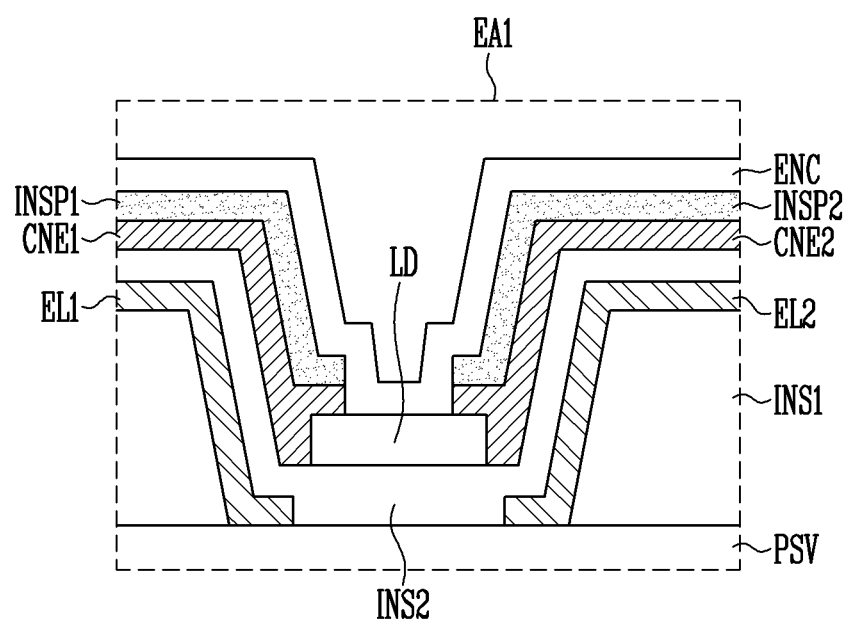
FIG. 10 is an enlarged cross-sectional view of the portion EA1 of FIG. 9.
Figure 11A:
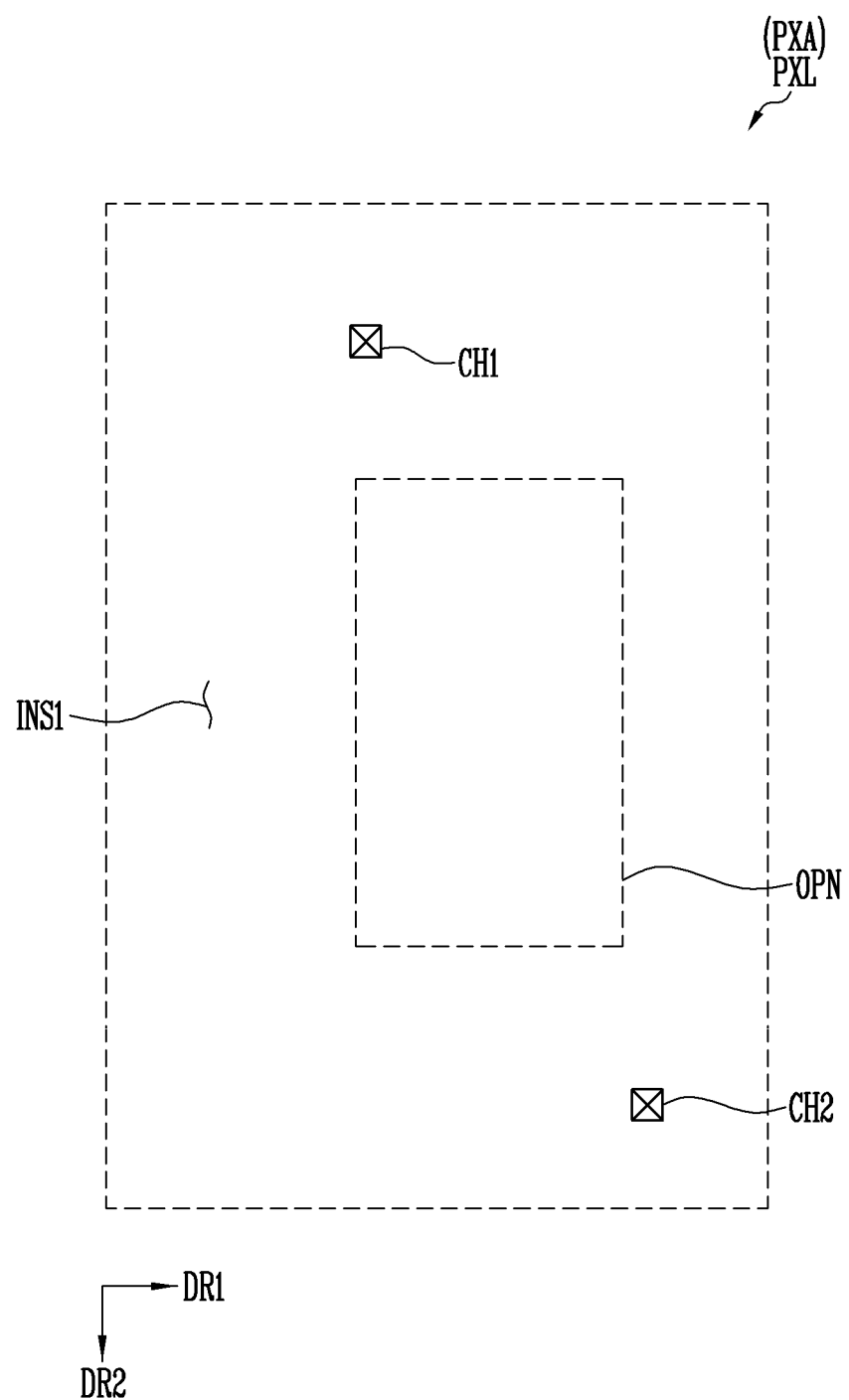
FIGS. 11A to 11E are schematic plan views sequentially illustrating a method of manufacturing the pixel shown in FIGS. 8 and 9.
Figure 11B:
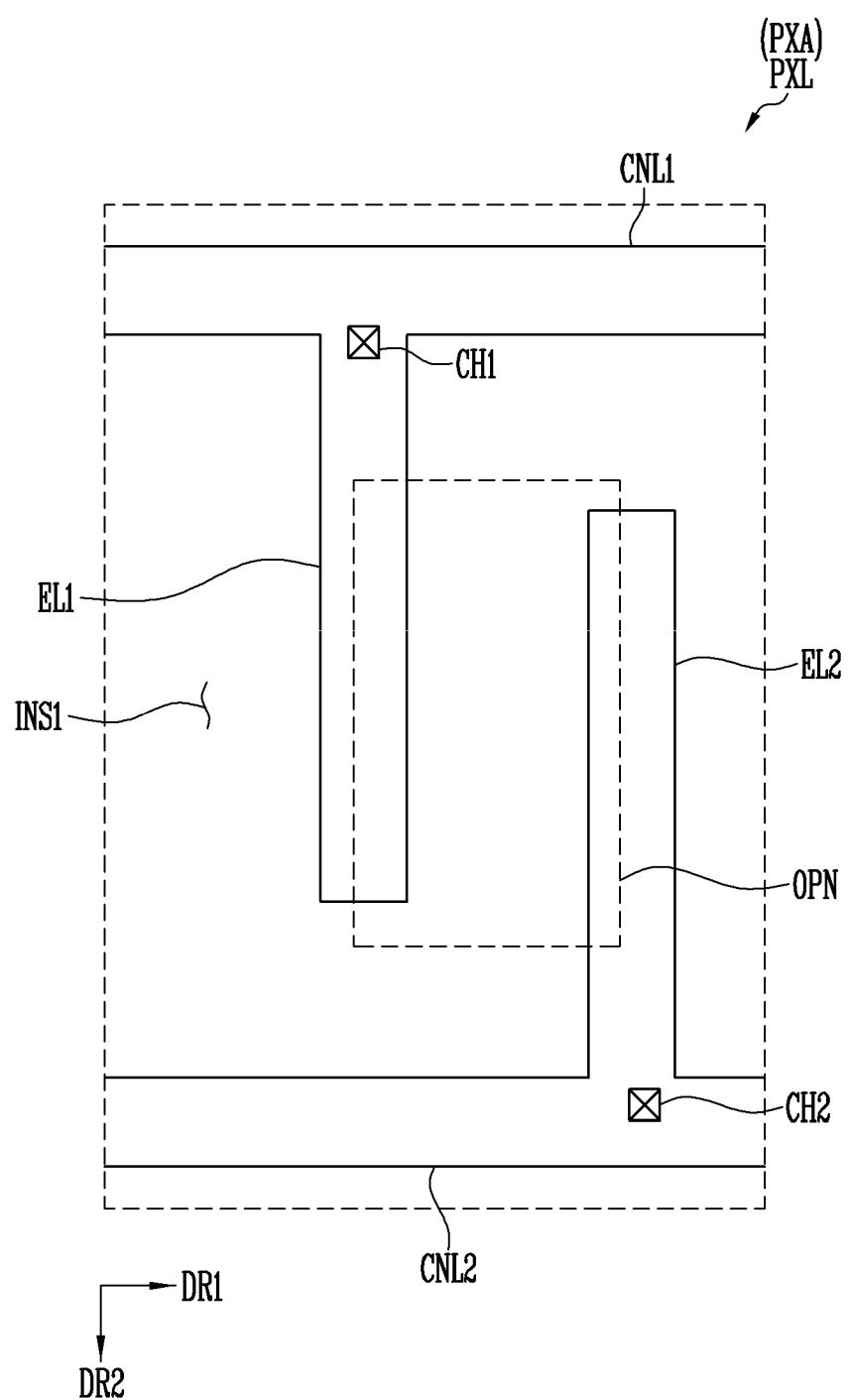
Figure 11C:
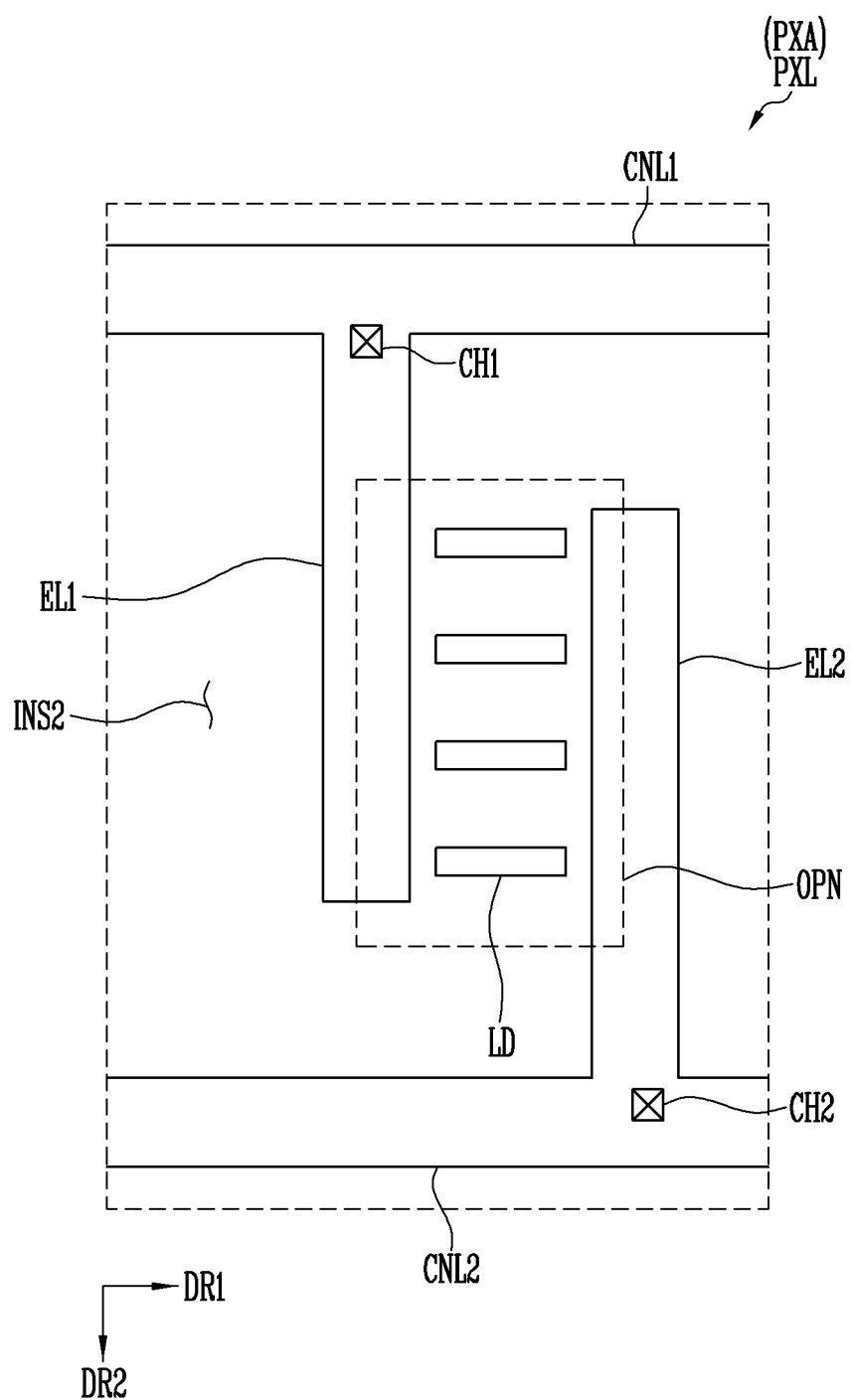
Figure 11D:
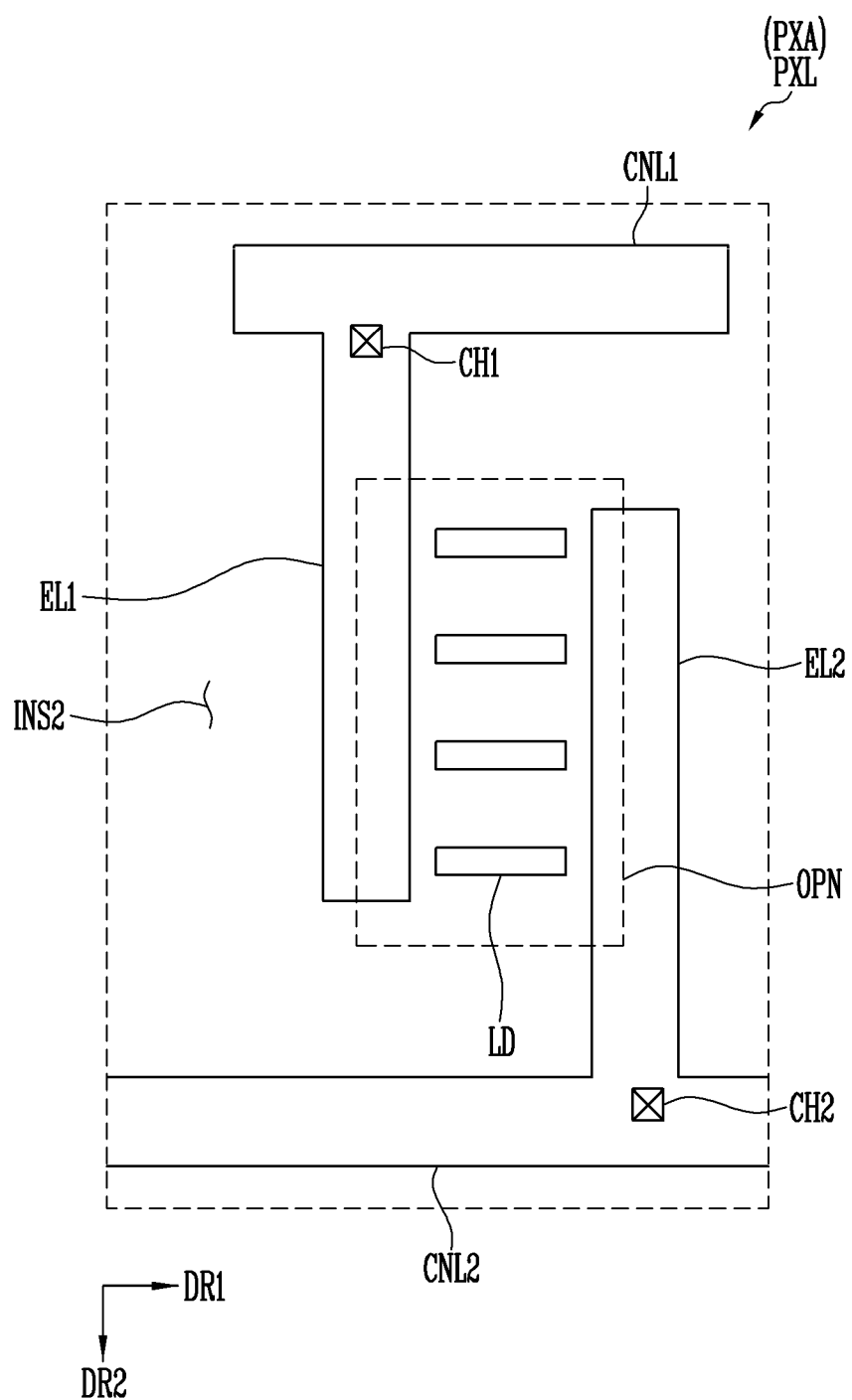
Figure 11E:
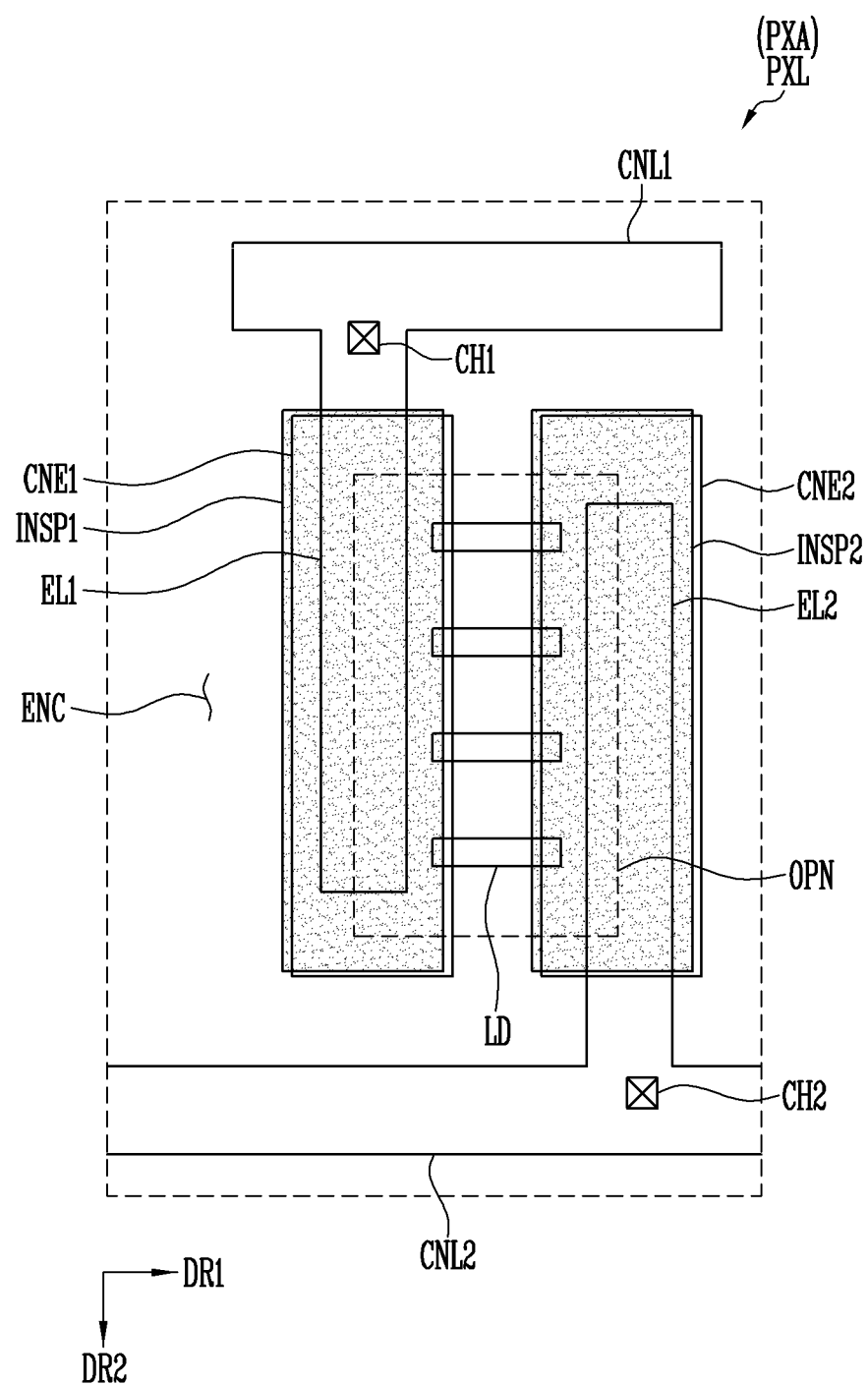
Figure 12A:
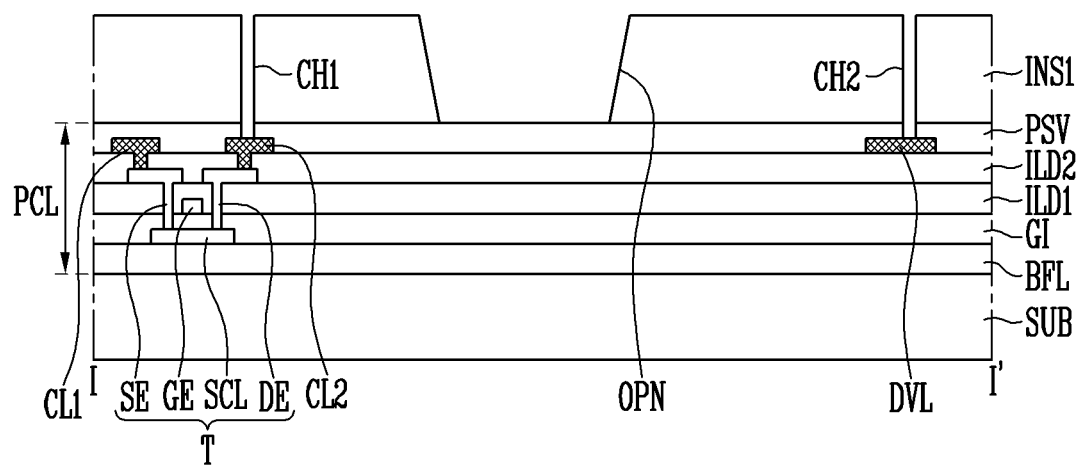
FIGS. 12A to 12G are schematic cross-sectional views sequentially illustrating a method of manufacturing the pixel shown in FIGS. 8 and 9.
Figure 12B:
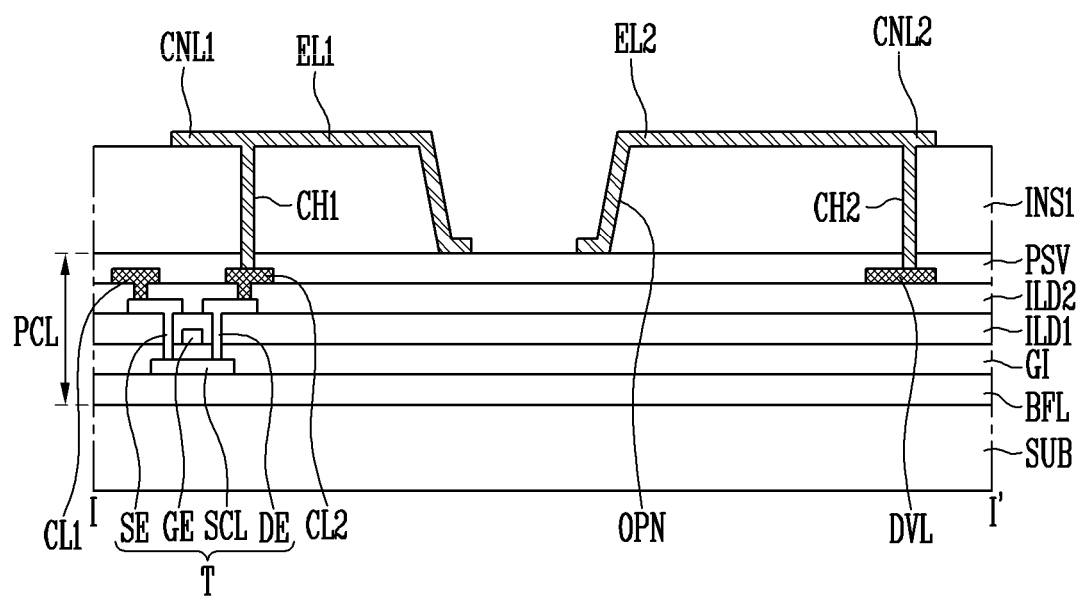
Figure 12C:
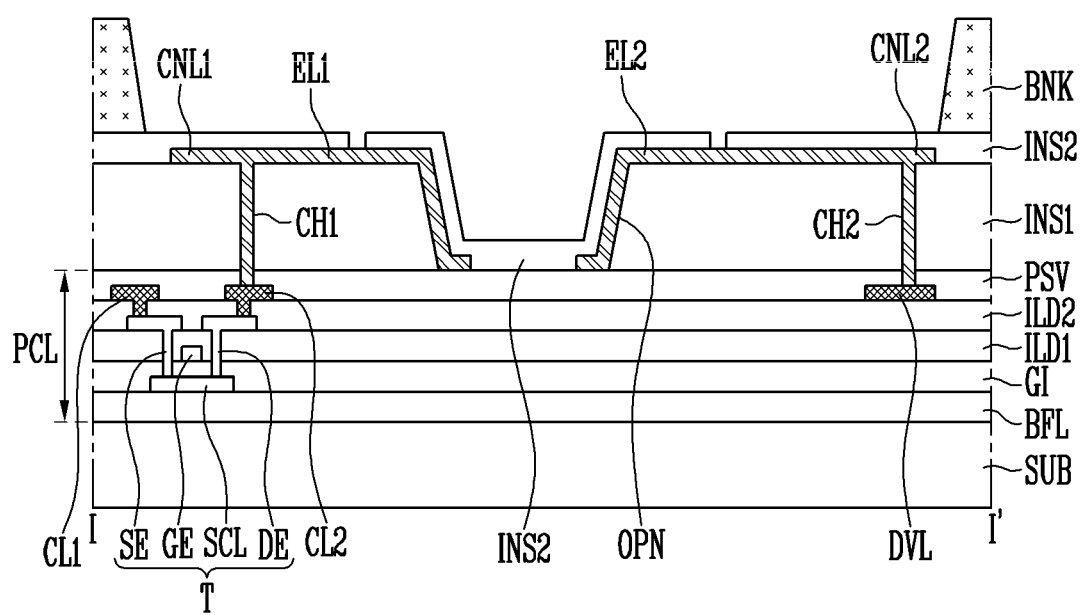
Figure 12D:
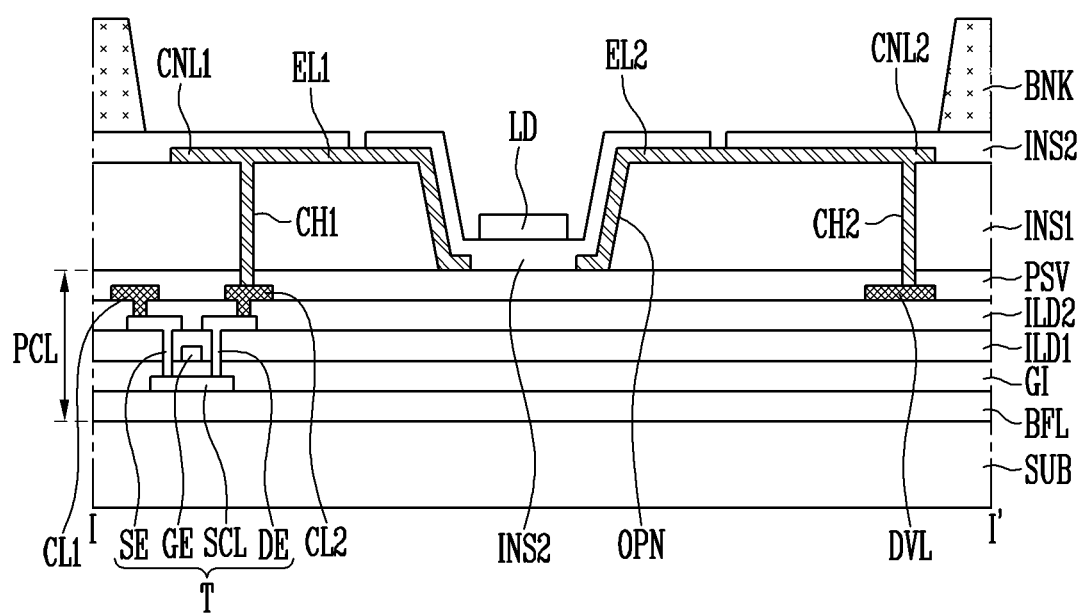
Figure 12E:
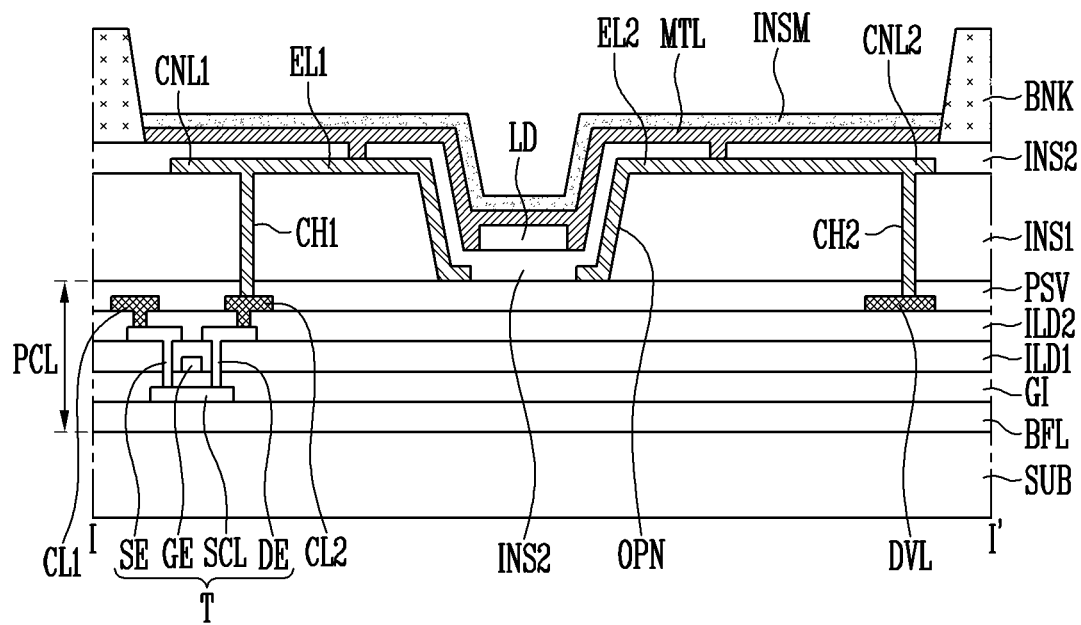
Figure 12F:
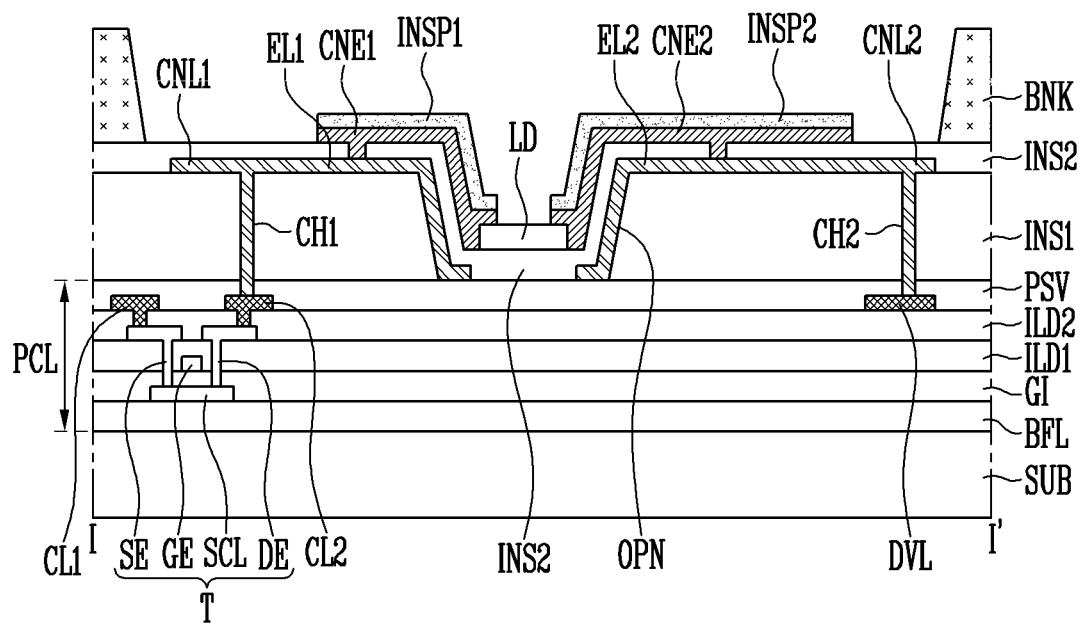
Figure 12G:
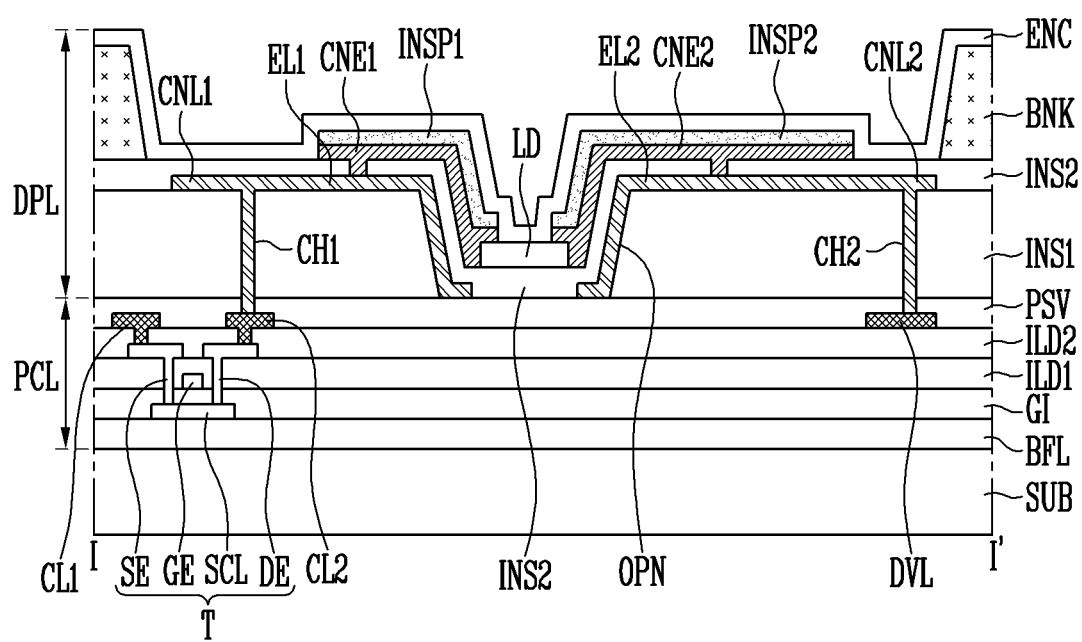

FIG. 8 is a plan view schematically illustrating one of the pixels PXL shown in FIG. 5, FIG. 9 is a cross-sectional view taken along the line I-I' of FIG. 8, and FIG. 10 is an enlarged cross-sectional view of the portion EA1 of FIG. 9.

One pixel PXL shown in FIG. 8 may be any one of the pixels PXL shown in each of FIGS. 6A to 6E, 7A, and 7B. For example, the one pixel PXL shown in FIG. 8 may be the pixel PXL shown in FIG. 6A.

In FIG. 8, for ease of description, the transistor connected to the light emitting elements and the signal lines connected to the transistor are omitted from the drawing.

FIGS. 8 to 10 show a simplified (or schematic) structure of the one pixel PXL. For example, each electrode is illustrated as a single electrode layer and each insulating layer is illustrated as a single insulating layer, but the present disclosure is limited thereto.

As used herein, "formed and/or provided in the same layer" may refer to a plurality of layers, elements, and/or components formed in (or during) the same process, and "formed and/or provided in different layers" may refer to a plurality of layers, elements, and/or components formed in (or during) different processes.

Referring to FIGS. 1A to 5, 6A, and 8 to 10, the display device according to an embodiment of the present disclosure may include the substrate SUB, the line portion, and the plurality of pixels PXL.

The substrate SUB may include a transparent insulating material and may transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material configuration of the substrate SUB may be variously changed and may include fiber reinforced plastic (FRP) or the like. The substrate SUB (e.g., the material forming the substrate SUB) may preferably have resistance (e.g., heat resistance) to a high process temperature experienced during a manufacturing process of the display device.

The substrate SUB may have the display area DA, including a plurality of pixel areas PXA in which the pixels PXL are respectively disposed, and the non-display area NDA disposed around the display area DA.

The pixels PXL may be arranged in a matrix form and/or a stripe form along a plurality of pixel rows extended in a first direction DR1 and a plurality of pixel columns extended in a second direction DR2 crossing the first direction DR1 in the display area DA on the substrate SUB, but the present disclosure is not limited thereto. According to an embodiment, the pixels PXL may be provided in the display area DA on the substrate SUB in various suitable arrangement forms.

The pixel area PXA in which each pixel PXL is disposed may include a light emission area in which light is emitted and a peripheral area surrounding a periphery of the light emission area. In an embodiment of the present disclosure, the peripheral area may include a non-light emission area in which light is not emitted.

In the pixel area PXA, a pixel circuit portion PCL provided on the substrate SUB and including the pixel driving circuit 144 and a display element portion DPL including a plurality of light emitting elements LD may be disposed.

For convenience, the pixel circuit portion PCL will be described first described, and then the display element portion DPL will be described.

The pixel circuit portion PCL may include a buffer film BFL, the pixel driving circuit 144 provided on the buffer film BFL, and a passivation film PSV provided on the pixel driving circuit 144.

The buffer film BFL may prevent (or substantially prevent) an impurity from diffusing into a transistor T. The buffer film BFL may be provided as a single film but, in other embodiments, may be provided as a plurality of films (or layers). When the buffer film BFL is provided as the plurality of films, each layer may be formed of the same material or different materials. The buffer film BFL may be omitted according to the material, a process condition, and the like of the substrate SUB.

The pixel driving circuit 144 may include a transistor T, a storage capacitor Cst, and a driving voltage line DVL. In FIG. 9, for convenience of illustration, only one transistor T (e.g., the first transistor or the driving transistor T1) is shown in the pixel driving circuit 144. That is, the transistor T shown in FIG. 9 may have the same configuration as the first transistor T1 described with reference to FIG. 6A.

The transistor T may include a transistor semiconductor pattern SCL, a gate electrode GE, a first terminal SE, and a second terminal DE. The first terminal SE may be any one of a source electrode and a drain electrode, and the second terminal DE may be the other one of the source electrode and the drain electrode. For example, when the first terminal SE is the source electrode, the second terminal DE may be the drain electrode.

The transistor semiconductor pattern SCL may be provided and/or formed on the buffer film BFL. The transistor semiconductor pattern SCL may include a first contact region that contacts the first terminal SE and a second contact region that contacts the second terminal DE. A region between the first contact region and the second contact region may be a channel region. The transistor semiconductor pattern SCL may be a semiconductor pattern formed of polysilicon, amorphous silicon, an oxide semiconductor, or the like. The channel region may be a semiconductor pattern which is not doped with an impurity and may be an intrinsic semiconductor. The first contact region and the second contact region may be a semiconductor pattern doped with an impurity.

The gate electrode GE may be provided and/or formed on the transistor semiconductor pattern SCL with a gate insulating film GI interposed therebetween.

The gate insulating film GI may be an inorganic insulating film including an inorganic material. For example, the gate insulating film GI may include at least one metal oxide, such as silicon nitride ($SiN_x$), silicon oxide ($SiO_x$), silicon oxynitride (SiON), and aluminum oxide ($AlO_x$). However, the material of the gate insulating film GI is not limited to the above-described embodiments. According to an embodiment, the gate insulating film GI may be formed of an organic insulating film including an organic material. The gate insulating film GI may be provided as a single film or may be provided as a plurality of films (e.g., as a plurality of layers).

The first terminal SE and the second terminal DE may respectively contact the first contact region and the second contact region of the transistor semiconductor pattern SCL through contact openings (e.g., contact holes) passing through a first interlayer insulating film ILD1 and the gate insulating film GI. For example, the first terminal SE may contact one of the first and second contact regions of the transistor semiconductor pattern SCL, and the second terminal DE may contact the other contact region of the first and second contact regions of the transistor semiconductor pattern SCL. In some embodiments, the first interlayer insulating film ILD1 may be an inorganic insulating film including an inorganic material. For example, the first interlayer insulating film ILD1 may include at least one metal oxide, such as silicon oxide ($SiO_x$), silicon nitride ($SiN_x$), silicon oxynitride (SiON), and aluminum oxide ($AlO_x$). The first interlayer insulating film ILD1 may be formed as a single film or may include a plurality of films. According to an embodiment, the first interlayer insulating film ILD1 may include an organic insulating film including an organic material.

In the above-described embodiment, the first and second terminals SE and DE of the transistor T are described as separate electrodes which are electrically connected to the transistor semiconductor pattern SCL through the contact openings passing through the gate insulating film GI and the first interlayer insulating film ILD1, but the present disclosure is not limited thereto. According to an embodiment, the first terminal SE of the transistor T may be one of first and second contact regions adjacent to the channel region of the transistor semiconductor pattern SCL, and the second terminal DE of the transistor T may be the other one of the first and second contact regions of the transistor semiconductor pattern SCL. The second terminal DE of the transistor T may be electrically connected to the light emitting elements LD of a corresponding pixel PXL through a bridge electrode or a contact electrode.

In an embodiment of the present disclosure, the first terminal SE may be connected to a first conductive line CL1 provided and/or formed on a second interlayer insulating film ILD2, and the second terminal DE may be connected to a second conductive line CL2 provided and/or formed on the second interlayer insulating film ILD2. The first terminal SE may have a double layer structure connected to the first conductive line CL1 to reduce a line resistance and reduce or minimize distortion due to signal delay. The second terminal DE may have a double layer structure connected to the second conductive line CL2 to reduce a line resistance and reduce or minimize distortion due to signal delay. The second interlayer insulating film ILD2 may include the same material as the first interlayer insulating film ILD1. For example, the second interlayer insulating film ILD2 may include (or may be formed of) an inorganic insulating film including an inorganic material.

In an embodiment of the present disclosure, the second conductive line CL2 may act as a bridge connecting the transistor T and some components of the display element portion DPL. For example, the second conductive line CL2 may act as a bridge connecting the second terminal DE of the transistor T and the first electrode EL1 of the display element portion DPL.

In an embodiment of the present disclosure, the transistor T may be configured as a low-temperature polycrystalline silicon (LTPS) thin film transistor, but the present disclosure is not limited thereto, and in other embodiments, the transistor T may be an oxide semiconductor thin film transistor. In addition, an embodiment in which the transistor T is a thin film transistor of a top gate structure has been described as an example, but the present disclosure is not limited thereto. According to another embodiment, the transistor T may be a thin film transistor having a bottom gate structure.

The driving voltage line DVL may be provided and/or formed on the second interlayer insulating film ILD2. The driving voltage line DVL may be the second power line PL2 to which the second driving power VSS is applied, described above with reference to FIG. 6A. The driving voltage line DVL may be provided on the same layer as the first and second conductive lines CL1 and CL2, but the present disclosure is not limited thereto. According to an embodiment, the driving voltage line DVL may be provided and/or formed on one of the insulating films included in the pixel circuit portion PCL and may be provided on a layer different from that of the first and second conductive lines CL1 and CL2.

The first and second conductive lines CL1 and CL2 and the driving voltage line DVL may be formed as a single film selected from molybdenum (Mo), tungsten (W), aluminum neodymium (AlNd), titanium (Ti), aluminum (Al), silver (Ag), and an alloy thereof alone or a mixture thereof, or having a double film or multiple film structure of molybdenum (Mo), aluminum (Al), or silver (Ag) that is a low resistance material to reduce a line resistance.

The passivation film PSV may be disposed on the first and second conductive lines CL1 and CL2 and the driving voltage line DVL.

The passivation film PSV may include an organic insulating film, an inorganic insulating film, or an organic insulating film disposed on an inorganic insulating film. The inorganic insulating film may include at least one metal oxide, such as silicon oxide ($SiO_x$), silicon nitride ($SiN_x$), silicon oxynitride (SiON), and aluminum oxide ($AlO_x$). The organic insulating film may include an organic insulating material capable of transmitting light. The organic insulating film may include at least one of an acrylic resin, an epoxy resin, a phenolic resin, a polyamide resin, a polyimide resin, an unsaturated polyester resin, a poly-phenylene ethers resin, a poly-phenylene sulfides resin, and a benzocyclobutene resin.

Next, the display element portion DPL of each pixel PXL will be described.

The display element portion DPL may include first and second insulating films INS1 and INS2, a bank (e.g., a bank layer) BNK, first and second connection lines CNL1 and CNL2, the first and second electrodes EL1 and EL2, the light emitting elements LD, and the first and second contact electrodes CNE1 and CNE2.

The first insulating film INS1 may be provided and/or formed on the passivation film PSV. The first insulating film INS1 may include an inorganic insulating film formed of an inorganic material or an organic insulating film formed of an organic material. According to an embodiment, the first insulating film INS1 may include an organic insulating film as a single film (e.g., as a single layer insulating film) and/or an inorganic insulating film as a single film, but the present disclosure is not limited thereto. According to an embodiment, the first insulating film INS1 may be provided as a plurality of films in which at least one organic insulating film and at least one inorganic insulating film are stacked. However, a material and a configuration of the first insulating film INS1 are not limited to the above-described embodiments, and according to an embodiment, the first insulating film INS1 may include a conductive material.

The first insulating film INS1 may have an opening OPN exposing a portion of the passivation film PSV. The opening OPN may be formed by removing a portion of the first insulating film INS1 that does not overlap some components included in the pixel circuit portion PCL. The opening OPN may be formed by removing one region (or portion) of the first insulating films INS1 spaced apart from in a horizontal direction (e.g., that does not overlap) the transistor T and the driving voltage line DVL included in the pixel circuit portion PCL in a cross-sectional view. In an embodiment of the present disclosure, the opening OPN in the first insulating film INS1 does not overlap the transistor T and the driving voltage line DVL.

The light emitting elements LD may be disposed in the opening OPN in the first insulating film INS1. The first insulating film INS1 may be a support member supporting each of the first and second electrodes EL1 and EL2 to change (e.g., to control) a surface profile of each of the first and second electrodes EL1 and EL2 so that the light emitted from the light emitting elements LD progresses in (e.g., is reflected to progress in) the image display direction of the display device.

When viewed in the cross section, both side surfaces of the first insulating film INS1 with the opening OPN interposed therebetween (e.g., side surfaces of the first insulating film INS1 at or adjacent the opening OPN therein) may have a diagonal shape with a slope (e.g., with a predetermined slope), but the present disclosure is not limited thereto. According to an embodiment, the both side surfaces of the first insulating film INS1 with the opening OPN interposed therebetween may have a curved shape with a curvature (e.g., a predetermined curvature). When viewed in the cross section, the shape of both side surfaces of the first insulating film INS1 with the opening OPN interposed therebetween is not limited to the above-described shapes and may be variously changed within a range of improving efficiency of the light emitted from each of the light emitting elements LD.

According to an embodiment, a via layer may be provided and/or formed between the passivation film PSV and the first insulating film INS1. The via layer may planarize between the passivation film PSV and the first insulating film INS1 (e.g., may planarize the passivation film PSV under the first insulating film INS1) and may further block an influence to alignment and/or driving of the light emitting elements LD by an electric field induced from components included in the pixel driving circuit 144, for example, the transistor T or the like.

The bank BNK may surround (e.g., may extend around) at least one side of the peripheral area of each pixel PXL. The bank BNK may be a structure that defines (or partitions) each pixel PXL and the light emission area of the pixels PXL adjacent thereto, and may be, for example, a pixel defining film. The bank BNK may be configured to include at least one light blocking material and/or a reflective material to prevent (or substantially prevent) a light leakage defect in which light (or a light ray) leaks between each pixel PXL and the pixels PXL adjacent thereto. According to an embodiment, a reflective material layer may be formed on the bank BNK to further improve efficiency of the light emitted from (e.g., to improve the light emission efficiency of) each pixel PXL. The bank BNK may be formed and/or provided on the first insulating film INS1.

The first connection line CNL1 may extend (e.g., may primarily extend) in the first direction DR1 (e.g., the horizontal direction) of each of the pixels PXL. The first connection line CNL1 may be provided and/or formed only in each pixel PXL (e.g., a first connection line CNL1 may be separately formed in each pixel PXL) to drive each pixel PXL independently or separately from adjacent pixels PXL and may be electrically and/or physically separated from the first connection line CNL1 provided and/or formed in each of the adjacent pixels PXL. The first connection line CNL1 may be connected to the first electrode EL1 in the corresponding pixel PXL.

The second connection line CNL2 may extend (e.g., may primarily extend) in a direction parallel to the extension direction of the first connection line CNL1. For example, the second connection line CNL2 may extend in the first direction DR1. The second connection line CNL2 may be provided commonly to each pixel PXL and the pixels PXL adjacent thereto (e.g., the second connection line CNL2 may extend between a plurality of the pixels PXL). Accordingly, the plurality of pixels PXL disposed in the same pixel row along the first direction DR1 may be commonly connected to the second connection line CNL2. The second connection line CNL2 provided in each pixel PXL may be electrically connected to some components, for example, the driving voltage line DVL, included in the pixel circuit portion PCL of a corresponding pixel PXL through a second contact opening (e.g., a second contact hole) CH2 passing through the passivation film PSV. Accordingly, the second driving power VSS applied to the driving voltage line DVL may be transferred to the second connection line CNL2.

Each of the first and second electrodes EL1 and EL2 may be provided in the pixel area PXA of each pixel PXL and may extend (e.g., may primarily extend) in one direction, for example, the second direction DR2. The first electrode EL1 and the second electrode EL2 may be provided on the same surface and may be spaced apart from each other.

The first electrode EL1 may be branched from the first connection line CNL1 in the second direction DR2. The first electrode EL1 and the first connection line CNL1 may be integrally provided (e.g., integrally formed) and may be connected to each other. In such an embodiment, the first connection line CNL1 may be one region of the first electrode EL1 or the first electrode EL1 may be one region of the first connection line CNL1. However, the present disclosure is not limited thereto, and according to an embodiment, the first electrode EL1 and the first connection line CNL1 may be formed separately from each other and, thus, may be electrically connected to each other through a contact opening (or contact hole), a connection device, and the like.

The second electrode EL2 may be branched from the second connection line CNL2 in the second direction DR2. The second electrode EL2 and the second connection line CNL2 may be integrally provided (e.g., may be integrally formed) and may be connected to each other. In such an embodiment, the second connection line CNL2 may be one region of the second electrode EL2 or the second electrode EL2 may be one region of the second connection line CNL2. However, the present disclosure is not limited thereto, and according to an embodiment, the second electrode EL2 and the second connection line CNL2 may be formed separately from each other and, thus, may be electrically connected to each other through a contact opening (or contact hole), a connection device, and the like, which are not shown.

The first electrode EL1 and the second electrode EL2 may be disposed on the first insulating film INS1 at a constant (or substantially constant) distance.

Each of the first and second electrodes EL1 and EL2 may be provided and/or formed on the first insulating film INS1, and a portion of the first and second electrodes EL1 and EL2 may be extended into the opening OPN and may be provided on the passivation film PSV. Each of the first and second electrodes EL1 and EL2 may have a surface profile corresponding to a shape of the first insulating film INS1. For example, each of the first and second electrodes EL1 and EL2 may include a flat portion corresponding to the first insulating film INS1, a flat portion corresponding to the passivation film PSV exposed by the opening OPN, and inclined portions respectively corresponding to the both side surfaces of the first insulating film INS1 with the opening OPN interposed therebetween.

Each of the first and second electrodes EL1 and EL2 may include (or may be formed of) a material having a constant reflectance such that the light emitted from each of the light emitting elements LD progresses in the image display direction of the display device. For example, each of the first and second electrodes EL1 and EL2 may include (or may be formed of) a conductive material having a constant reflectance. The conductive material may include an opaque metal that reflects the light emitted from the light emitting elements LD in the image display direction of the display device. The opaque metal may include, for example, a metal, such as Ag, Mg, Al, Pt, Pd, Au, Ni, Nd, Ir, Cr, Ti, and an alloy thereof. According to an embodiment, each of the first and second electrodes EL1 and EL2 may include a transparent conductive material. The transparent conductive material may include a conductive oxide, such as an indium tin oxide (ITO), an indium zinc oxide (IZO), a zinc oxide (ZnO), and an indium tin zinc oxide (ITZO), a conductive polymer, such as PEDOT, and the like. When each of the first and second electrodes EL1 and EL2 includes the transparent conductive material, a separate conductive layer including (or formed of) an opaque metal for reflecting the light emitted from the light emitting elements LD in the image display direction of the display device may be further included. However, the material of each of the first and second electrodes EL1 and EL2 is not limited to the above-described materials.

In addition, each of the first and second electrodes EL1 and EL2 may be provided and/or formed as a single film, but the present disclosure is not limited thereto. According to an embodiment, each of the first and second electrodes EL1 and EL2 may be provided and/or formed as a plurality of films in which a plurality of materials of metals, alloys, conductive oxides, and conductive polymers are stacked. By forming each of the first and second electrodes EL1 and EL2 as a plurality of films, distortion due to signal delay when a signal (or voltage) is transferred to the both ends of each of the light emitting elements LD may be reduced or minimized. For example, each of the first and second electrodes EL1 and EL2 may include indium tin oxide (ITO), silver (Ag), and indium tin oxide (ITO) sequentially stacked.

When the first connection line CNL1 is provided integrally with the first electrode EL1, the first connection line CNL1 may include the same material as the first electrode EL1. In addition, when the second connection line CNL2 is provided integrally with the second electrode EL2, the second connection line CNL2 may include the same material as the second electrode EL2.

As described above, because each of the first and second electrodes EL1 and EL2 has the surface profile corresponding to the shape of the first insulating film INS1 disposed thereunder, the light emitted from each of the light emitting elements LD may be reflected by each of the first and second electrodes EL1 and EL2 and may further progress in the image display direction of the display device. Finally, the efficiency of the light emitted from (e.g., the light emission efficiency of) each of the light emitting elements LD may be further improved.

Each of the first and second electrodes EL1 and EL2 functions as a reflective member that induces (e.g., reflects) the light emitted from the light emitting elements LD in a desired direction to improve light efficiency of the display device. For example, each of the first and second electrodes EL1 and EL2, due in part to the shape of the first insulating film INS1, may act as a reflective member that causes the light emitted from the light emitting elements LD to progress in the image display direction of the display device to improve light output efficiency of the light emitting elements LD.

The first electrode EL1 may be connected to a portion of the pixel circuit portion PCL through a first contact opening (e.g., a first contact hole) CH1 passing through the first insulating film INS1 and the passivation film PSV. For example, the first electrode EL1 may be connected to the second conductive line CL2, which is connected to the second terminal DE of the transistor T, through the first contact opening CH1. Therefore, a signal (e.g., a predetermined signal or voltage) applied to the transistor T may be transferred to the first electrode EL1.

The second electrode EL2 may be connected to a portion, for example, the driving voltage line DVL, of the pixel circuit portion PCL through a second contact opening (e.g., a second contact hole) CH2 passing through the first insulating film INS1 and the passivation film PSV. Therefore, a signal (e.g., the second driving power VSS) applied to the driving voltage line DVL may be transferred to the second electrode EL2.

One of the first electrode EL1 and the second electrode EL2 may be an anode electrode, and the other of the first electrode EL1 and the second electrode EL2 may be a cathode electrode. In an embodiment of the present disclosure, the first electrode EL1 may be the anode electrode, and the second electrode EL2 may be the cathode electrode.

A second insulating film INS2 may be provided and/or formed on the first and second electrodes EL1 and EL2. The second insulating film INS2 may be formed and/or provided under each of the light emitting elements LD in the pixel area PXA of each pixel PXL. The second insulating film INS2 may fill a space between the passivation film PSV exposed by the opening OPN and each light emitting element LD to stably support each of the light emitting elements LD and prevent (or substantially prevent) the light emitting elements LD from separating from the passivation film PSV.

In addition, in the pixel area PXA of each pixel PXL, the second insulating film INS2 may expose one region of each of the first and second electrodes EL1 and EL2 and cover the remaining regions except for the one region. For example, the second insulating film INS2 may include contact openings (e.g., contact holes) exposing a portion of each of the first and second electrodes EL1 and EL2.

The second insulating film INS2 may include an inorganic insulating film formed of an inorganic material or an organic insulating film formed of an organic material. In an embodiment of the present disclosure, the second insulating film INS2 may include (or may be formed of) an inorganic insulating film to protect the light emitting elements LD from the pixel circuit portion PCL of each pixel PXL, but the present disclosure is not limited thereto. According to an embodiment, the second insulating film INS2 may include (or may be formed of) an organic insulating film to flatten (e.g., to planarize) a support surface of the light emitting elements LD.

Each of the light emitting elements LD may be a micro light emitting element of, for example, a small size, for example, on a nano scale to micro scale, using an inorganic crystal structure material. For example, each of the light emitting elements LD may be a micro light emitting element manufactured by an etching method or a micro light emitting element manufactured by a growth method. However, the type, size, shape, and the like of the light emitting elements LD may be variously changed.

A plurality of (e.g., at least two to tens of) light emitting elements LD may be aligned and/or provided in the pixel area PXA of each pixel PXL, but the number of light emitting elements LD is not limited thereto. According to an embodiment, the number of light emitting elements LD aligned and/or provided in the pixel area PXA of each pixel PXL may be variously changed.

In an embodiment of the present disclosure, each of the light emitting elements LD may emit any one of color light and/or white light. Each of the light emitting elements LD may be aligned between the first electrode EL1 and the second electrode EL2 such that a length direction L thereof (see, e.g., FIGS. 1A to 4B) is parallel to the first direction DR1. The light emitting elements LD may be provided to the pixels PXL by being sprayed in a solution to the pixel area PXA of each pixel PXL.

In an embodiment of the present disclosure, the light emitting elements LD may be deposited to the pixel area PXA of each pixel PXL through an inkjet printing method, a slit coating method, or other various methods. For example, the light emitting elements LD may be mixed with a volatile solvent and supplied to the pixel area PXA of each pixel PXL through an inkjet printing method or a slit coating method. Then, an alignment signal (e.g., an alignment voltage) is applied to each of the first and second electrodes EL1 and EL2 positioned in the pixel area PXA of each pixel PXL, which forms an electric field between the first electrode EL1 and the second electrode EL2. Therefore, the light emitting elements LD may be aligned between the first electrode EL1 and the second electrode EL2.

For example, the light emitting elements LD may be aligned in the pixel area PXA of each pixel PXL by applying an alignment signal (e.g., an alignment voltage) to each of the first and second electrodes EL1 and EL2. Thus, each of the first and second electrodes EL1 and EL2 may act as an alignment electrode (e.g., an alignment line) for aligning of the light emitting elements LD. For example, the first electrode EL1 may be a first alignment electrode (e.g., a first alignment line) receiving a first alignment signal (e.g., a first alignment voltage) from the first connection line CNL1, and the second electrode EL2 may be a second alignment electrode (e.g., a second alignment line) receiving a second alignment signal (e.g., a second alignment voltage) from the second connection line CNL2. The first and second alignment signals may have voltage levels that are different from each other. The first and second alignment signals may be signals having a voltage difference and/or a phase difference such that light emitting elements LD may be aligned between the first and second electrodes EL1 and EL2. For example, the first alignment signal may be a ground voltage (GND), and the second alignment signal may be an AC signal, but the present disclosure is not limited thereto. According to an embodiment, both of the first and second alignment signals may be AC signals.

After the light emitting elements LD are aligned, the light emitting elements LD may be finally aligned and/or provided in the pixel area PXA of each pixel PXL by volatilizing or removing the solvent by using suitable methods.

After the light emitting elements LD are aligned in the pixel area PXA of each pixel PXL, the first and second electrodes EL1 and EL2 may act as driving electrodes driving the light emitting elements LD.

When the light emitting elements LD are aligned in the pixel area PXA of each pixel PXL, the alignment signal (e.g., an alignment voltage) applied to each of the first and second electrodes EL1 and EL2 may be controlled to form a magnetic field that relatively biases the light emitting elements LD supplied to the pixel area PXA.

Each of the light emitting elements LD may include a first end electrically connected to one electrode from among the two electrodes (e.g., the first and second electrodes EL1 and EL2) that are adjacent to each other in the pixel area PXA of each pixel PXL and a second end electrically connected to the other electrode from among the two electrodes. In an embodiment of the present disclosure, the first end of each light emitting element LD may be the first semiconductor layer 11 including an n-type semiconductor layer, and the second end may be the second semiconductor layer 13 including a p-type semiconductor layer. For example, in the pixel area PXA of each pixel PXL, each light emitting element LD may be connected in the forward direction between the two adjacent electrodes with a constant (or substantially constant) distance. As described above, the light emitting elements LD connected in the forward direction between the two adjacent electrodes may configure the effective light sources of the light emitting unit EMU of each pixel PXL.

The above-described light emitting elements LD may be provided and/or formed on the second insulating film INS2 in the pixel area PXA of each pixel PXL.

Contact electrodes CNE1 and CNE2 may be provided and/or formed on the second insulating film INS2. The contact electrodes CNE1 and CNE2 may electrically and physically connect the first and second electrodes EL1 and EL2 and the light emitting elements LD corresponding thereto, respectively.

The contact electrodes CNE1 and CNE2 may include a first contact electrode CNE1 and a second contact electrode CNE2. The first contact electrode CNE1 may be provided on the second insulating film INS2 on (or overlapping) the first electrode EL1 and may be connected to the first electrode EL1 exposed by one of the contact openings in the second insulating film INS2. The second contact electrode CNE2 may be provided on the second insulating film INS2 on (or overlapping) the second electrode EL2 and may be connected to the second electrode EL2 exposed by another one of the contact openings in the second insulating film INS2.

The first and second contact electrodes CNE1 and CNE2 may be configured of (or may include) various transparent conductive materials. For example, the first and second contact electrodes CNE1 and CNE2 may include at least one transparent conductive material including ITO, IZO, and ITZO and may be implemented to be substantially transparent or translucent to provide a target light transmittance. However, the material of the first and second contact electrodes CNE1 and CNE2 is not limited to the above-described materials, and according to an embodiment, the first and second contact electrodes CNE1 and CNE2 may be configured of (or may include) various opaque conductive materials.

The first contact electrode CNE1 and the second contact electrode CNE2 may be disposed to be spaced apart from each other on the same plane. For example, the first contact electrode CEN1 and the second contact electrode CNE2 may be disposed to be spaced apart from each other on the second insulating film INS2. The first contact electrode CNE1 and the second contact electrode CNE2 may be provided on the same layer and may include the same material. However, the present disclosure is not limited thereto, and according to an embodiment, the first contact electrode CNE1 and the second contact electrode CNE2 may be provided on different layers and/or may include different materials.

The first contact electrode CNE1 may be provided on the second insulating film INS2 on the first electrode EL1 to overlap the first electrode EL1. In addition, the first contact electrode CNE1 may be directly provided on (e.g., may directly contact) the one end of each of the light emitting elements LD and may overlap the one end of each of the light emitting elements LD. The first contact electrode CNE1 may electrically and stably connect the first electrode EL1 and the one end of each of the light emitting elements LD to each other.

The second contact electrode CNE2 may be provided on the second insulating film INS2 on the second electrode EL2 to overlap the second electrode EL2. In addition, the second contact electrode CNE2 may be directly provided on (e.g., may directly contact) the other end of each of the light emitting elements LD and may overlap the other end of each of the light emitting elements LD. The second contact electrode CNE2 may electrically and stably connect the second electrode EL2 and the other end of each of the light emitting elements LD to each other.

The display element portion DPL may include a first insulating pattern INSP1 directly provided and/or formed on the first contact electrode CNE1 and a second insulating pattern INSP2 directly provided and/or formed on the second contact electrode CNE2. In an embodiment of the present disclosure, the first insulating pattern INSP1 and the second insulating pattern INSP2 may be provided and/or formed on the same layer, may include the same material, and may be formed through the same process. In an embodiment of the present disclosure, the first insulating pattern INSP1 and the second insulating pattern INSP2 may be spaced apart from each other at a constant (or substantially constant) distance therebetween. For example, when viewed on a plane, the first insulating pattern INSP1 and the second insulating pattern INSP2 may be spaced apart from each other at a constant (or substantially constant) distance in the first direction DR1.

The first and second insulating patterns INSP1 and INSP2 may include an organic insulating film, and the first and second insulating patterns INSP1 and INSP2 may include the same organic material. For example, the organic insulating film may be at least one of acrylic resin (a polyacrylate resin), epoxy resin, phenol resin, polyamide resin, polyimide resin, unsaturated polyester resin, polyphenylene ether resin, poly-phenylene sulfides resin, and benzocyclobutene resin.

The first insulating pattern INSP1 may overlap the first contact electrode CNE1 when viewed on the plane. For example, the first insulating pattern INSP1 may have the same or substantially the same planar shape as the first contact electrode CNE1. For example, when the first contact electrode CNE1 has a bar shape extending in the second direction DR2, the first insulating pattern INSP1 provided thereon may also have a bar shape extending in the second direction DR2.

The second insulating pattern INSP2 may overlap the second contact electrode CNE2 when viewed on the plane. For example, the second insulating pattern INSP2 may have the same planar shape as the second contact electrode CNE2. For example, when the second contact electrode CNE2 has a bar shape extending in the second direction DR2, the second insulating pattern INSP2 provided thereon may also have a bar shape extending in the second direction DR2.

In an embodiment of the present disclosure, the first insulating pattern INSP1 may be formed by a process using the same mask as is used to form the first contact electrode CNE1, and the second insulating pattern INSP2 may be formed by a process using the same mask as is used to form the second contact electrode CNE2. After sequentially stacking a metal layer and an insulating material layer on the second insulating film INS2 of the pixel area PXA of each pixel PXL, the first and second insulating patterns INSP1 and INSP2 may be formed by using a mask, and an etching process using the first and second insulating patterns INSP1 and INSP2 as an etching mask may be performed to form the first contact electrode CNE1 and the second contact electrode CNE2.

The first insulating pattern INSP1 may overlap the first electrode EL1 and the one end of each of the light emitting elements LD, and the second insulating pattern INSP2 may overlap the second electrode EL2 and the other end of each of the light emitting elements LD.

The first insulating pattern INSP1 may be provided on the first contact electrode CNE1 to protect the first contact electrode CNE1. In addition, the first insulating pattern INSP1 may overlap the one end of each of the light emitting elements LD and may act as a fixing member fixing the light emitting elements LD together with the first contact electrode CNE1. The second insulating pattern INSP2 may be provided on the second contact electrode CNE2 to protect the second contact electrode CNE2. In addition, the second insulating pattern INSP2 may overlap the other end of each of the light emitting elements LD and may act as a fixing member fixing the light emitting elements LD together with the second contact electrode CNE2.

In an embodiment of the present disclosure, after the alignment of the light emitting elements LD in the pixel area PXA of each pixel PXL is completed, the first insulating pattern INSP1 may be formed by a process using the same mask as is used to form the first contact electrode CNE1, and the second insulating pattern INSP2 may be formed by a process using the same mask as is used to form the second contact electrode CNE2 to stably fix the both ends of each of the light emitting elements LD. Accordingly, the first and second insulating patterns INSP1 and INSP2 may prevent (or substantially prevent) the light emitting elements LD from deviating (or moving) from an aligned position.

An encap layer (e.g., an encapsulation layer) ENC may be provided and/or formed on the first and second insulating patterns INSP1 and INSP2. The encap layer ENC may be an inorganic insulating film including an inorganic material or an organic insulating film including an organic material. For example, the encap layer ENC may have a structure in which at least one inorganic insulating film or at least one organic insulating film is alternately stacked. The encap layer ENC may entirely cover the display element portion DPL to block (or substantially block) water or moisture from entering to the display element portion DPL including the light emitting elements LD.

According to the above-described embodiment, the first and second contact electrodes CNE1 and CNE2 and the first and second insulating patterns INSP1 and INSP2 positioned thereon are utilized as the fixing member to fix the light emitting elements LD. Therefore, a separate configuration (or component) for fixing the light emitting elements LD may be omitted. For example, the light emitting elements LD may be fixed by using the first and second contact electrodes CNE1 and CNE2 and the first and second insulating patterns INSP1 and INSP2 without a separate configuration provided on an upper surface of the light emitting elements LD to prevent (or substantially prevent) the light emitting elements LD from deviating (or moving) from the aligned position. Accordingly, a process or the like of manufacturing the above-described separate configuration (or component) may be omitted. Thus, a manufacturing process of the display device according to the above-described embodiment may be simplified.

FIGS. 11A to 11E are schematic plan views sequentially illustrating a method of manufacturing the pixel shown in FIG. 8, and FIGS. 12A to 12G are schematic cross-sectional views sequentially illustrating a method of manufacturing the pixel shown in FIG. 9.

In the following description, the pixel shown in FIGS. 8 and 9 is sequentially described according to the manufacturing method by combining FIGS. 11A to 11E and 12A to 12G.

In FIGS. 11A to 11E and 12A to 12G, description will be given based primarily on differences from the above-described embodiment in order to avoid repetitive description(s). A part, element, or configuration that is not specially described in another embodiment of the present disclosure follows (e.g., is the same or substantially similar to) the above-described embodiment, and the same reference numeral refers to the same component, and the similar reference numeral refers to a similar component.

Referring to FIGS. 1A to 5, 6A, 8 to 11A, and 12A, the pixel circuit portion PCL is formed on the substrate SUB.

The pixel circuit portion PCL may include an insulating film, the transistor T, the driving voltage line DVL, and the first and second conductive lines CL1 and CL2. The insulating film may include the buffer film BFL formed on the substrate SUB, the gate insulating film GI formed on the buffer film BFL, the first interlayer insulating film ILD1 formed on the gate insulating film GI, the second interlayer insulating film ILD2 formed on the first interlayer insulating film ILD1, and the passivation film PSV formed on the second interlayer insulating film ILD2. The passivation film PSV may include the first contact opening CH1 exposing a portion of the second conductive line CL2 and the second contact opening CH2 exposing a portion of the driving voltage line DVL.

The first insulating film INS1 having the opening OPN and the first and second contact openings CH1 and CH2 is formed on the pixel circuit portion PCL. The first contact opening CH1 in the first insulating film INS1 may correspond to the first contact opening CH1 in the passivation film PSV, and the second contact opening CH2 in the first insulating film INS1 may correspond to the second contact opening CH2 in the passivation film PSV. The first insulating film INS1 may include an inorganic insulating film including (or formed of) an inorganic material or an organic insulating film including (or formed of) an organic material.

Referring to FIGS. 1A to 5, 6A, 8 to 10, 11B, 12A, and 12B, the first and second connection lines CNL1 and CNL2 including a conductive element (and/or a conductive material) having a high reflectance and the first and second electrodes EL1 and EL2 are formed on the first insulating film INS1.

The first and second connection lines CNL1 and CNL2 extend in the first direction DR1 and may be commonly provided to the pixels PXL positioned adjacent each other in the extension direction. For example, each of the first and second connection lines CNL1 and CNL2 may be commonly provided to the pixels PXL positioned in the same pixel row. For example, the pixels PXL positioned in the same pixel row may be commonly connected to each of the first and second connection lines CNL1 and CNL2.

The first electrode EL1 may be branched from the first connection line CNL1 in the second direction DR2, and the second electrode EL2 may be branched from the second connection line CNL2 in the second direction DR2. The first electrode EL1 and the first connection line CNL1 may be integrally provided, and the second electrode EL2 and the second connection line CNL2 may be integrally provided.

The first electrode EL1 may be electrically connected to a portion of the pixel circuit portion PCL, for example, the second conductive line CL2, through the first contact opening CH1, which passes through the passivation film PSV and the first insulating film INS1. The second electrode EL2 may be electrically connected to a portion of the pixel circuit portion PCL, for example, the driving voltage line DVL, through the second contact opening CH2, which passes through the passivation film PSV and the first insulating film INS1.

Referring to FIGS. 1A to 5, 6A, 8 to 10, and 12A to 12C, after forming an insulating material layer on the first and second electrodes EL1 and EL2 and the first and second connection lines CNL1 and CNL2, the second insulating film INS2 is formed from the insulating material layer by using a mask such that the second insulating film INS2 exposes a portion of each of the first and second electrodes EL1 and EL2 (e.g., the insulating material layer is formed and then patterned by using a mask to form the second insulating film INS2).

Next, the bank BNK is formed on the second insulating film INS2. The bank BNK may be a pixel defining film defining (or partitioning) the light emission area of each of the pixels PXL. The bank BNK may include an inorganic insulating film including an inorganic material and/or an organic insulating film including an organic material.

Referring to FIGS. 1A to 5, 6A, 8 to 10, 11C, and 12A to 12D, an electric field is formed between the first and second electrodes EL1 and EL2 by applying the alignment signals (or alignment voltages) corresponding to the respective first and second electrodes EL1 and EL2 through the first and second connection lines CNL1 and CNL2. In some embodiments, the alignment signal applied to the first electrode EL1 and the alignment signal applied to the second electrode EL2 may be different from each other.

As described above, when the electric field is formed between the first and second electrodes EL1 and EL2, the mixed liquid including the light emitting elements LD is input (or deposited) to the pixel area PXA of each of the pixels PXL using the inkjet printing method or the like. For example, an inkjet nozzle may be disposed on (or over) the second insulating film INS2, and a solvent in which a plurality of light emitting elements LD are mixed may be input to the pixel area PXA of each of the pixels PXL through the inkjet nozzle. The solvent may be any one or more of acetone, water, alcohol, and toluene, but the present disclosure is not limited thereto. For example, the solvent may be in a form of an ink or paste. A method of inputting the light emitting elements LD to the pixel area PXA of each of the pixels PXL is not limited to the above-described method, and the method of inputting the light emitting elements LD may be variously changed.

The solvent may be removed after the light emitting elements LD are input to the pixel area PXA of each of the pixels PXL.

When the light emitting elements LD are input to the pixel area PXA of each of the pixels PXL, self-alignment of the light emitting elements LD may be induced by the electric field formed between the first electrode EL1 and the second electrode EL2. Accordingly, the light emitting elements LD may be aligned between the first electrode EL1 and the second electrode EL2. For example, the light emitting elements LD may be aligned on the second insulating film INS2 between the first electrode EL1 and the second electrode EL2 in the opening OPN in the first insulating film INS1.

Referring to FIGS. 1A to 5, 6A, 8 to 10, and 11D, a portion of the first connection line CNL1 is removed by performing an etching process or the like using a mask so that each of the pixels PXL may be driven independently or separately from the pixels PXL adjacent thereto. Accordingly, the first connection line CNL1 provided to each pixel PXL may be electrically and/or physically separated from the first connection line CNL1 provided to the pixels PXL adjacent thereto.

Referring to FIGS. 1A to 5, 6A, 8 to 10, and 12A to 12E, a metal layer MTL and an insulating material layer INSM are sequentially stacked on the light emitting elements LD and the second insulating film INS2. In some embodiments, the insulating material layer INSM may be positioned directly on the metal layer MTL. The metal layer MTL may be configured of (or may include) a transparent conductive material, and the insulating material layer INSM may be (or may include) an organic insulating film including an organic material.

Referring to FIGS. 1A to 5, 6A, 8 to 10, 11E, 12A to 12F, and 12G, after a mask is disposed on the insulating material layer INSM, the first and second insulating patterns INSP1 and INSP2 are formed by a process using the mask (e.g., the insulating material layer INSM is patterned or etched to form the first and second insulating patterns INSP1 and INSP2). Then, an etching process using the first and second insulating patterns INSP1 and INSP2 is performed to form the first contact electrode CNE1 corresponding to the first insulating pattern INSP1 and the second contact electrode CNE2 corresponding to the second insulating pattern INSP2 from the metal layer MTL. The etching process may be a wet etching process.

Because the first and second insulating patterns INSP1 and INSP2 acts as masks to form the first and second contact electrodes CNE1 and CNE2, respectively, the first insulating pattern INSP1 and the first contact electrode CNE1 positioned thereunder may have the same planar shape, and the second insulating pattern INSP2 and the second contact electrode CNE2 positioned thereunder may have the same planar shape.

The first contact electrode CNE1 and the first insulating pattern INSP1 positioned thereon may be provided on the one end of each of the light emitting elements LD positioned in the opening OPN, and the second contact electrode CNE2 and the second insulating pattern INSP2 positioned thereon may be provided on the other end of each of the light emitting elements LD. Accordingly, the first contact electrode CNE1, the first insulating pattern INSP1 positioned on the first contact electrode CNE1, the second contact electrode CNE2, and the second insulating pattern INSP2 positioned on the second contact electrode CNE2 may stably fix the light emitting elements LD so that the light emitting elements LD do not deviate from (e.g., do not move from) the aligned area.

Subsequently, the encap layer ENC is formed to cover the first and second insulating patterns INSP1 and INSP2. The encap layer ENC may have a structure in which at least one inorganic film and at least one organic film are alternately stacked.

Figure 13:
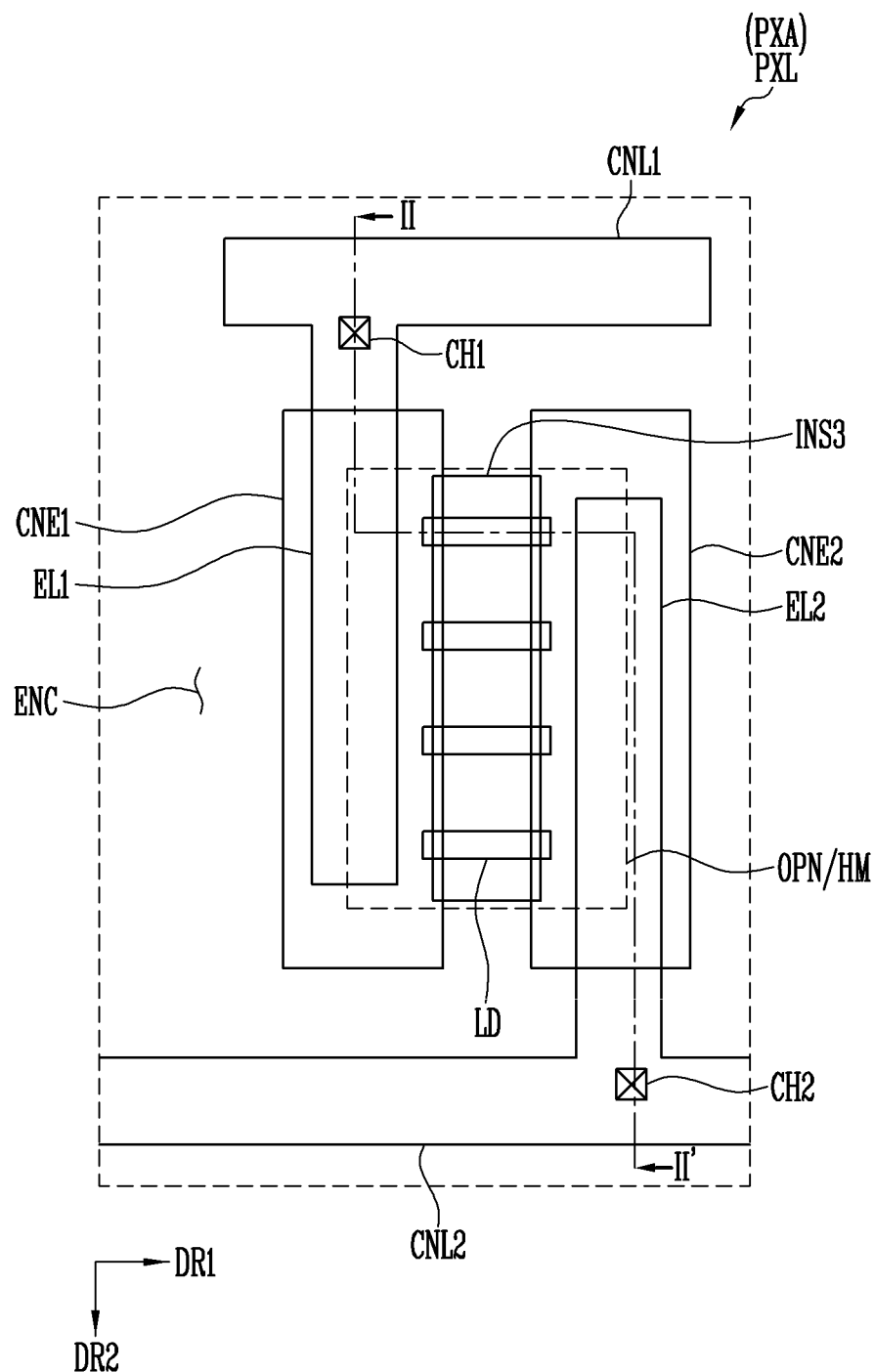
FIG. 13 is a plan view schematically illustrating one pixel according to another embodiment of the present disclosure.
Figure 14:
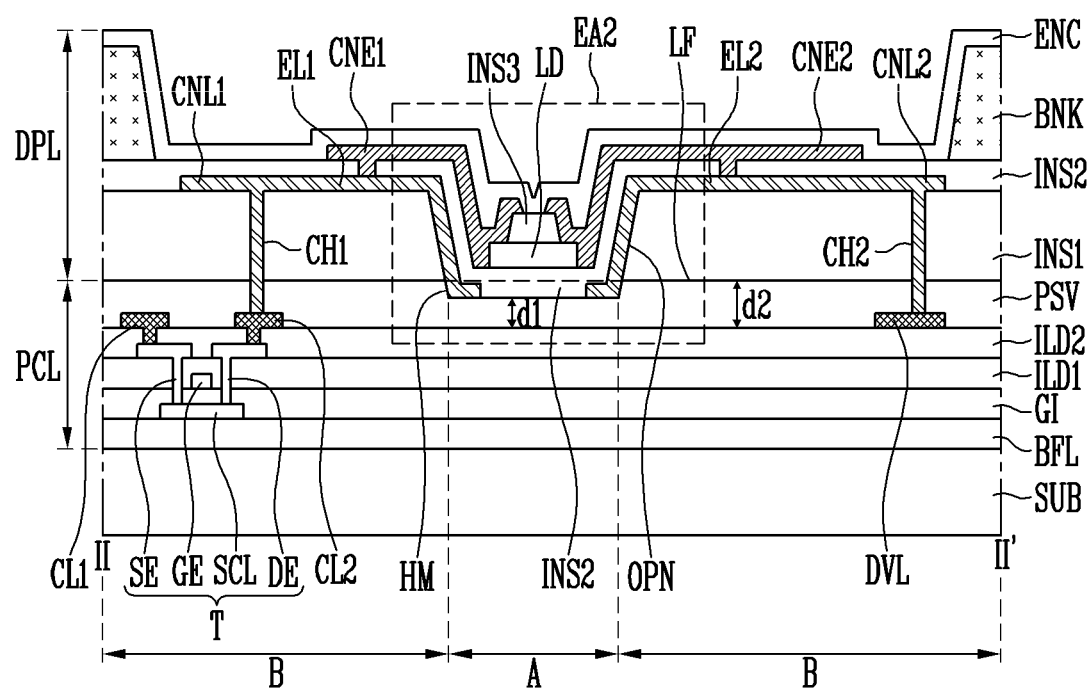
FIG. 14 is a cross-sectional view taken along the line II-II' of FIG. 13.
Figure 15:
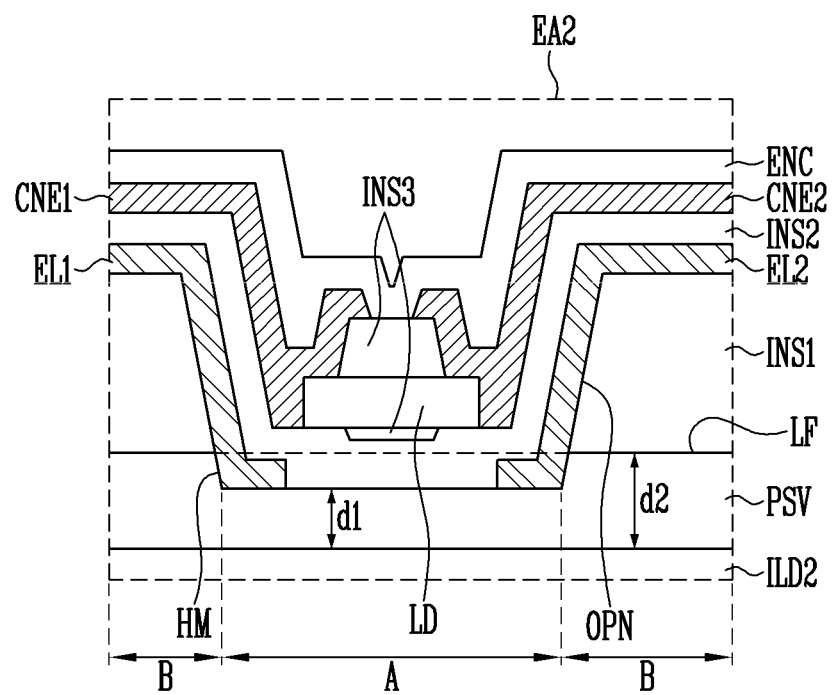
FIG. 15 is an enlarged cross-sectional view of the portion EA2 of FIG. 14.
Figure 16:
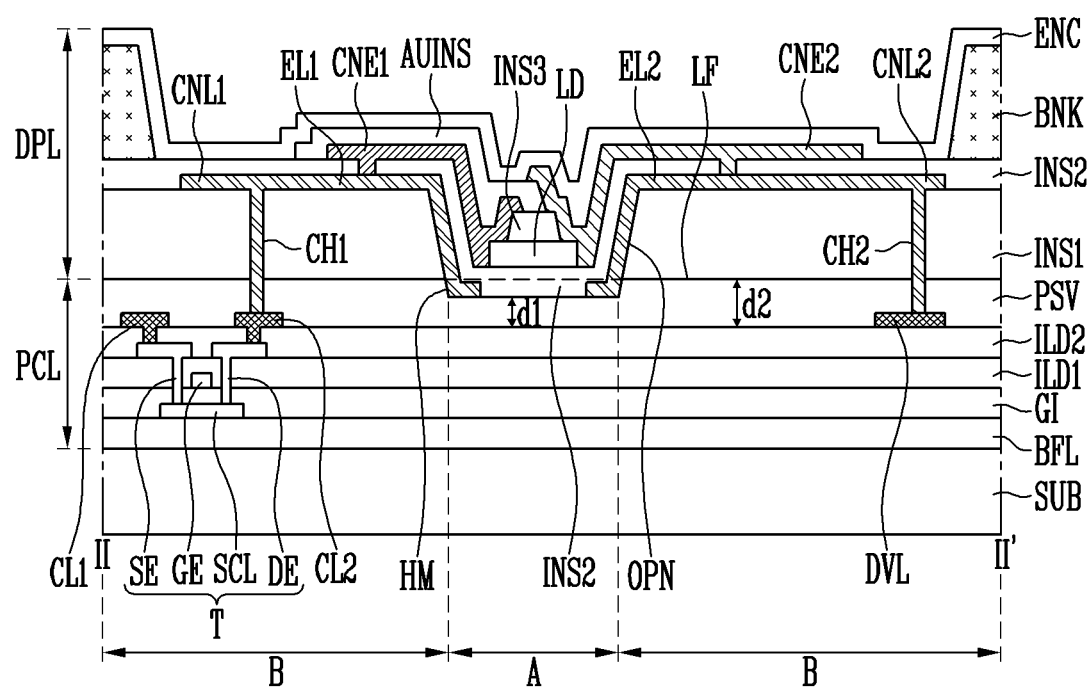
FIG. 16 is a cross-sectional view corresponding to the line II-II' of FIG. 13 in an implementation of the display element portion shown in FIG. 14 according to another embodiment.
Figure 17A:
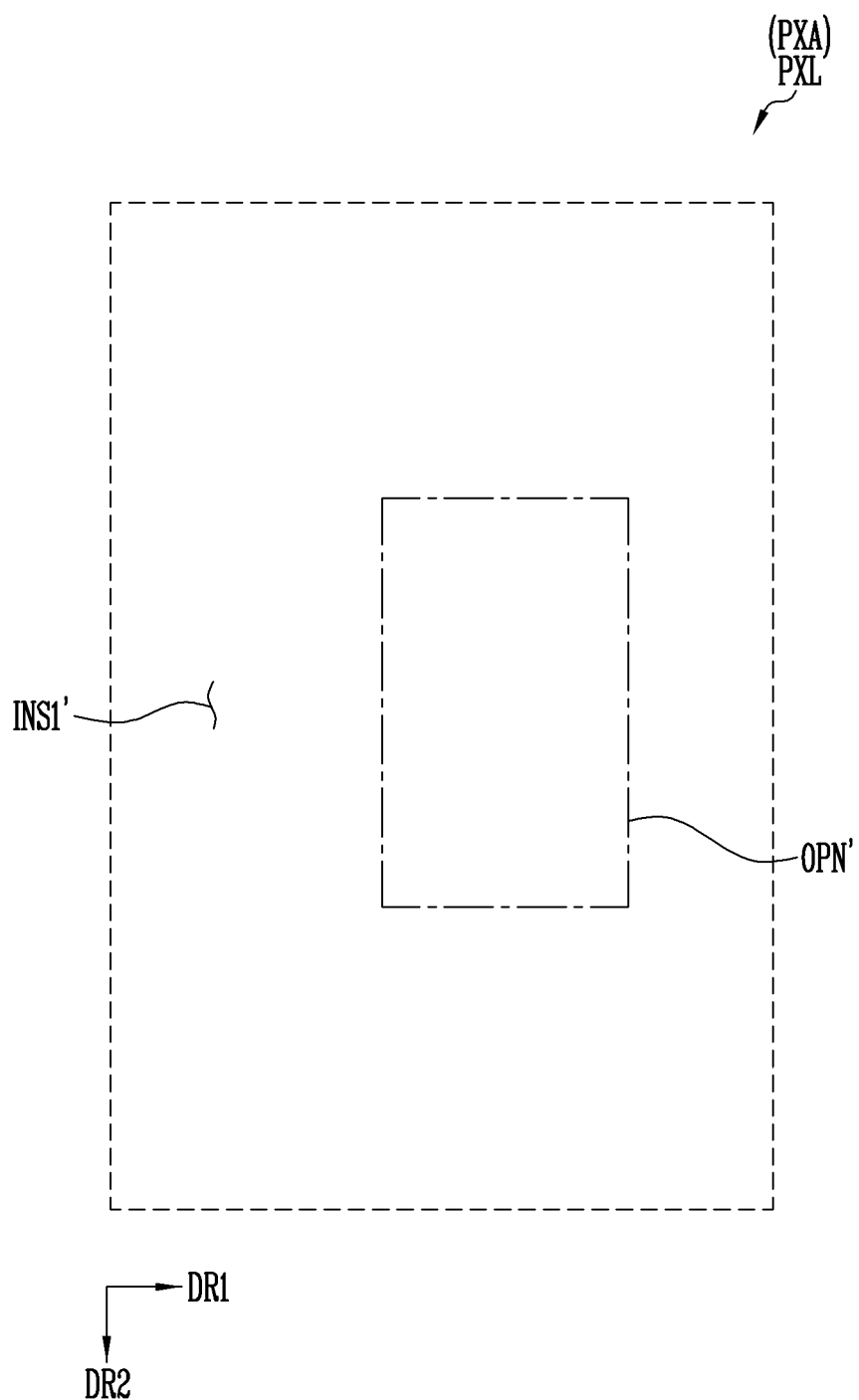
FIGS. 17A to 17G are schematic plan views sequentially illustrating a method of manufacturing the pixel shown in FIGS. 13 and 14.
Figure 17B:
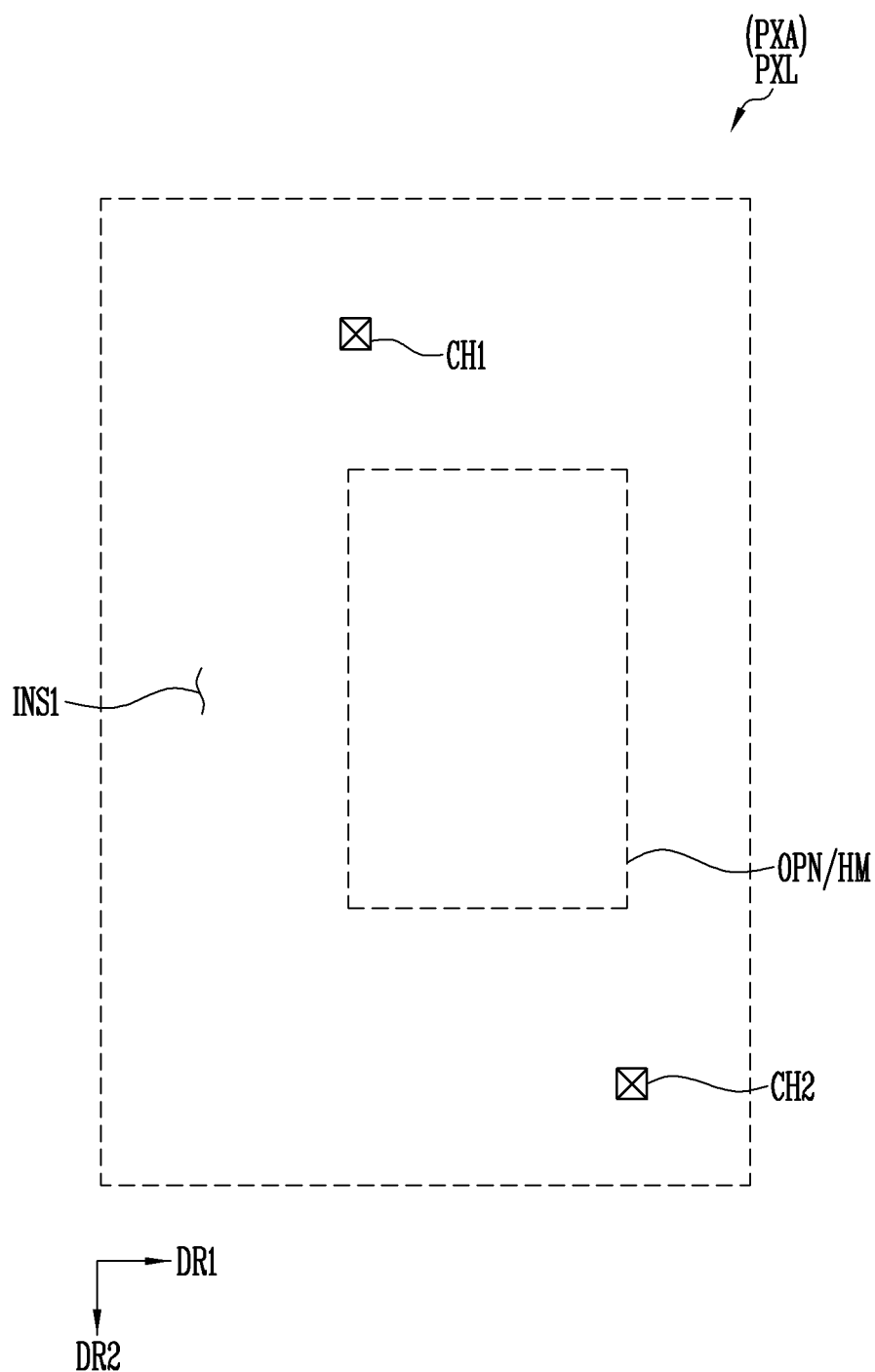
Figure 17C:
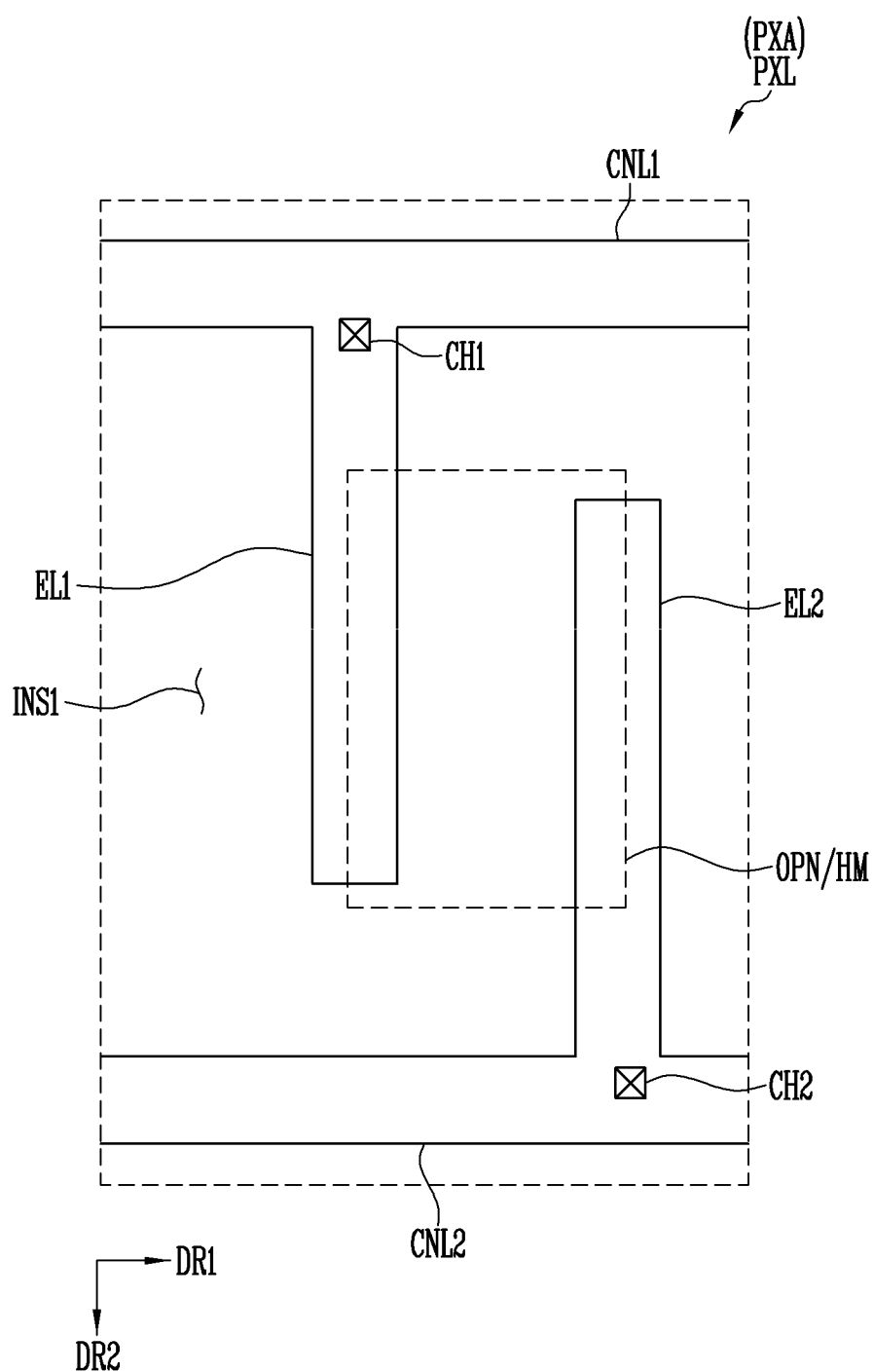
Figure 17D:
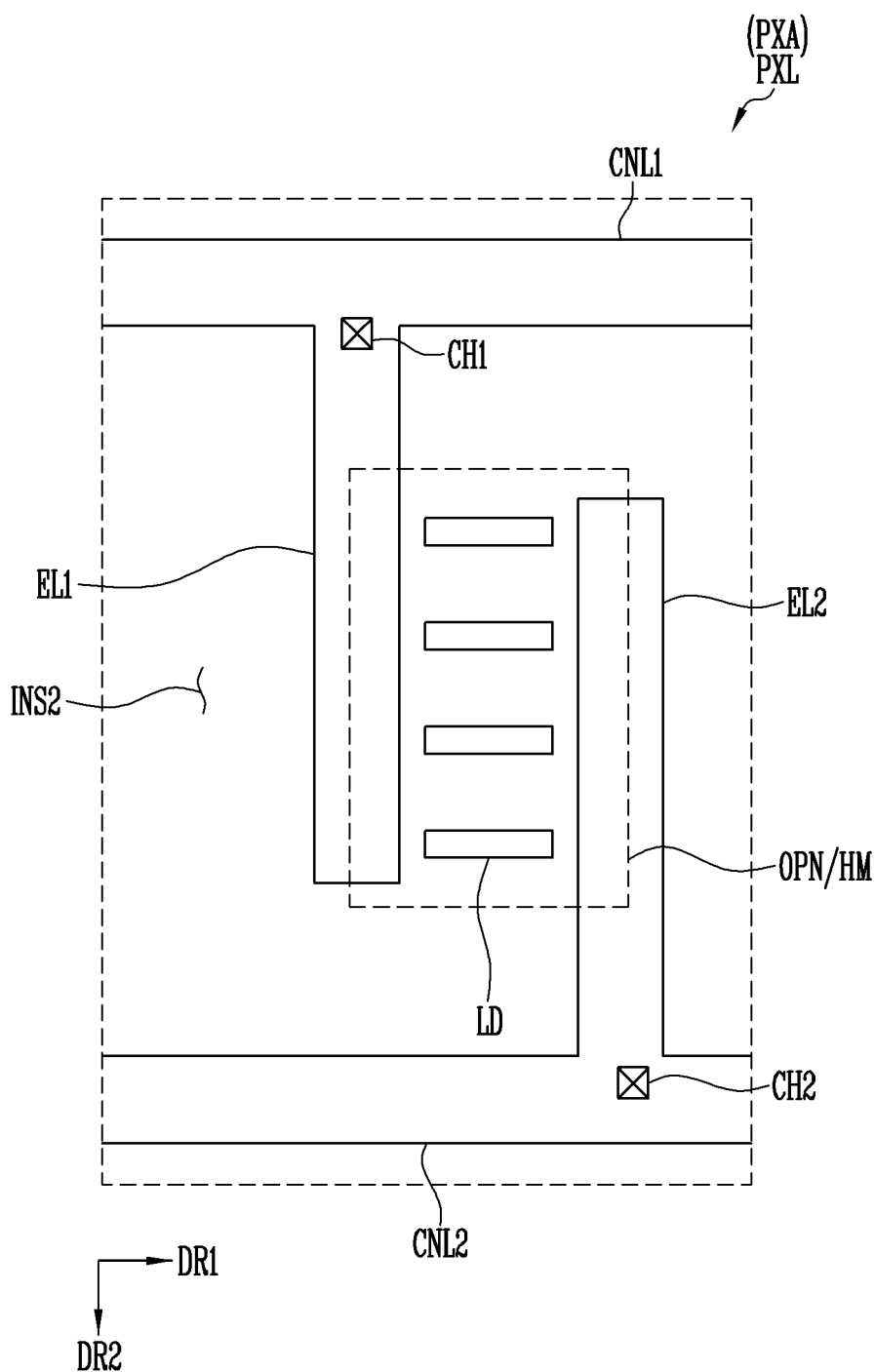
Figure 17E:
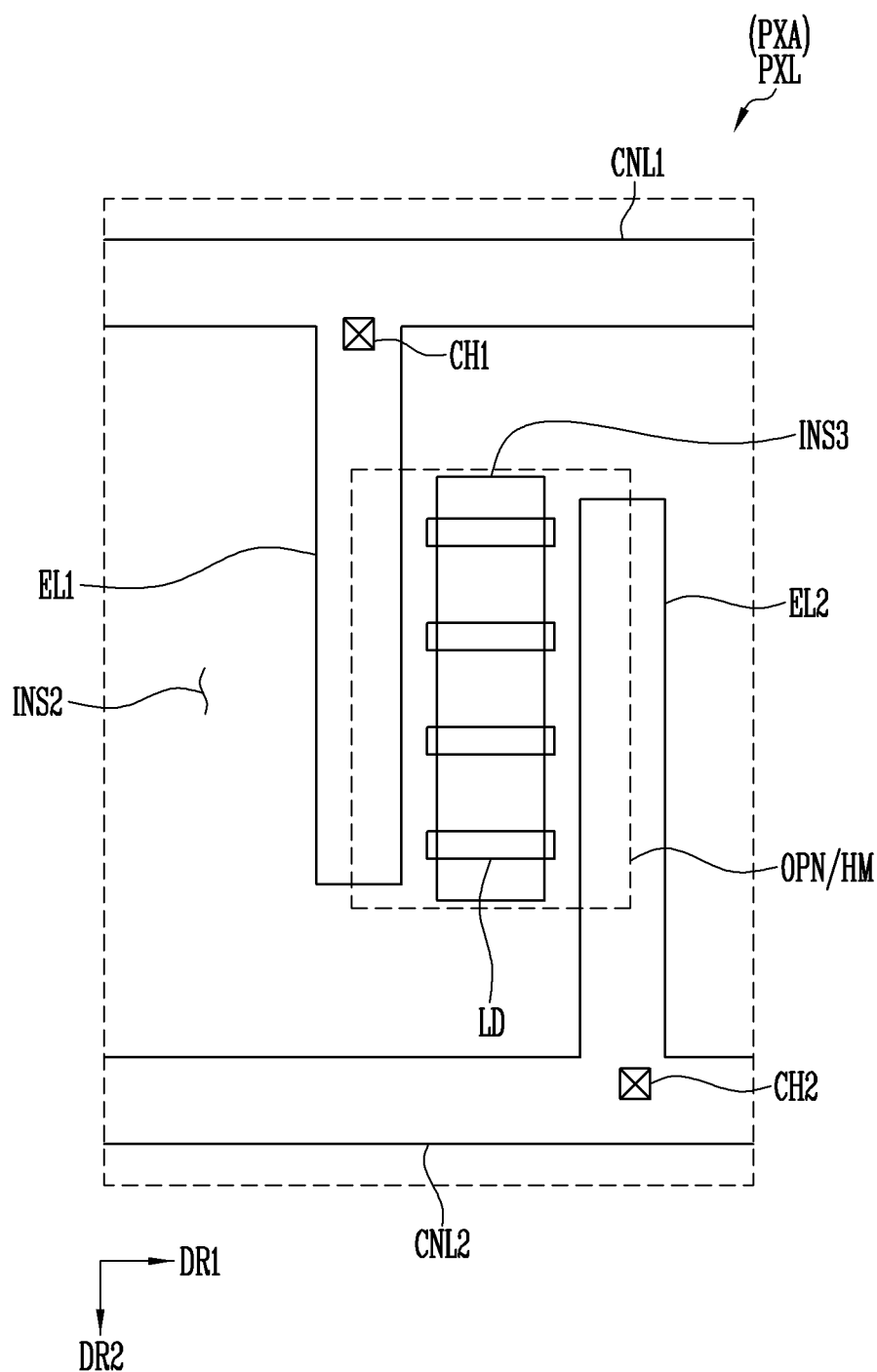
Figure 17F:
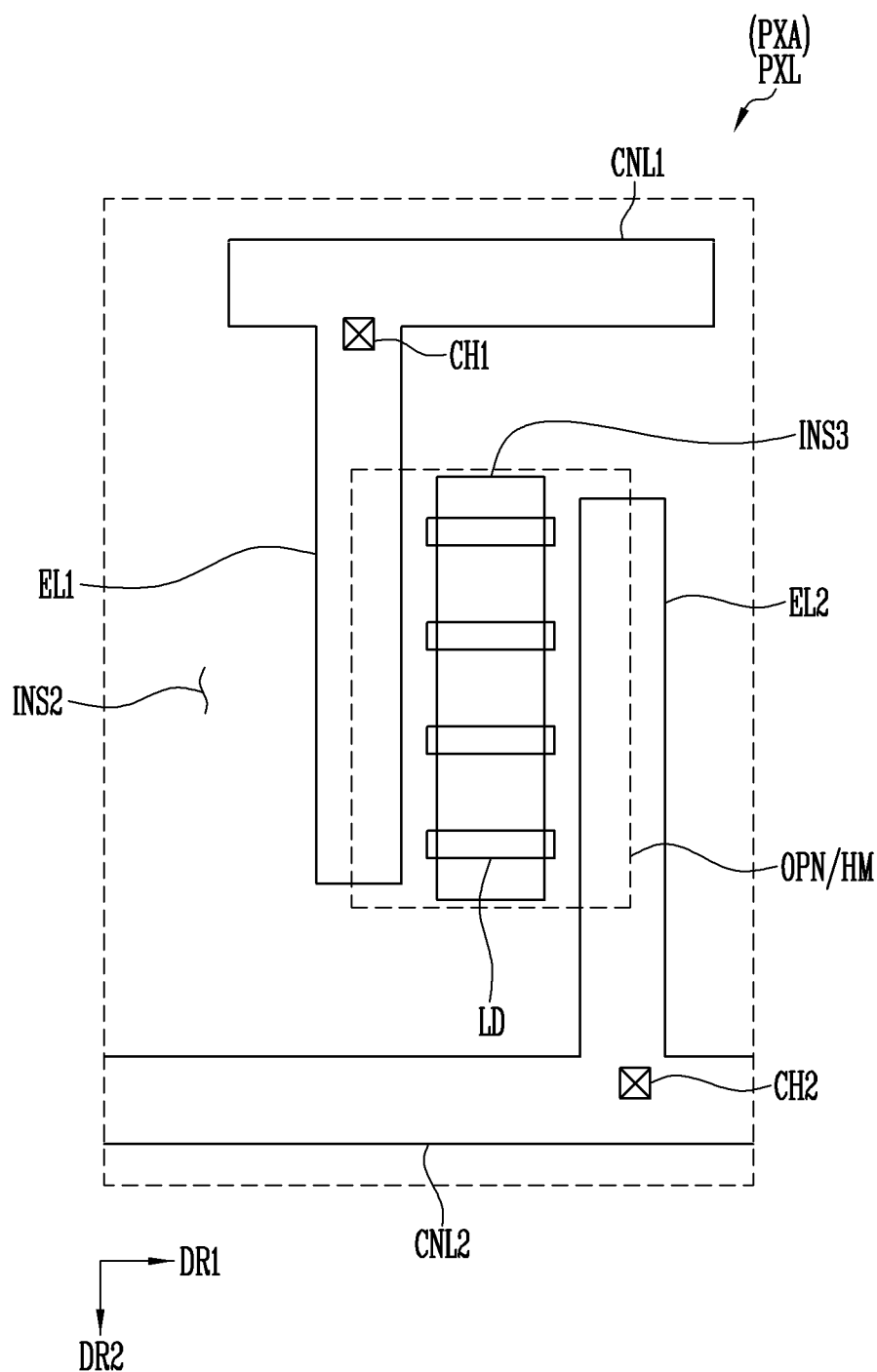
Figure 17G:
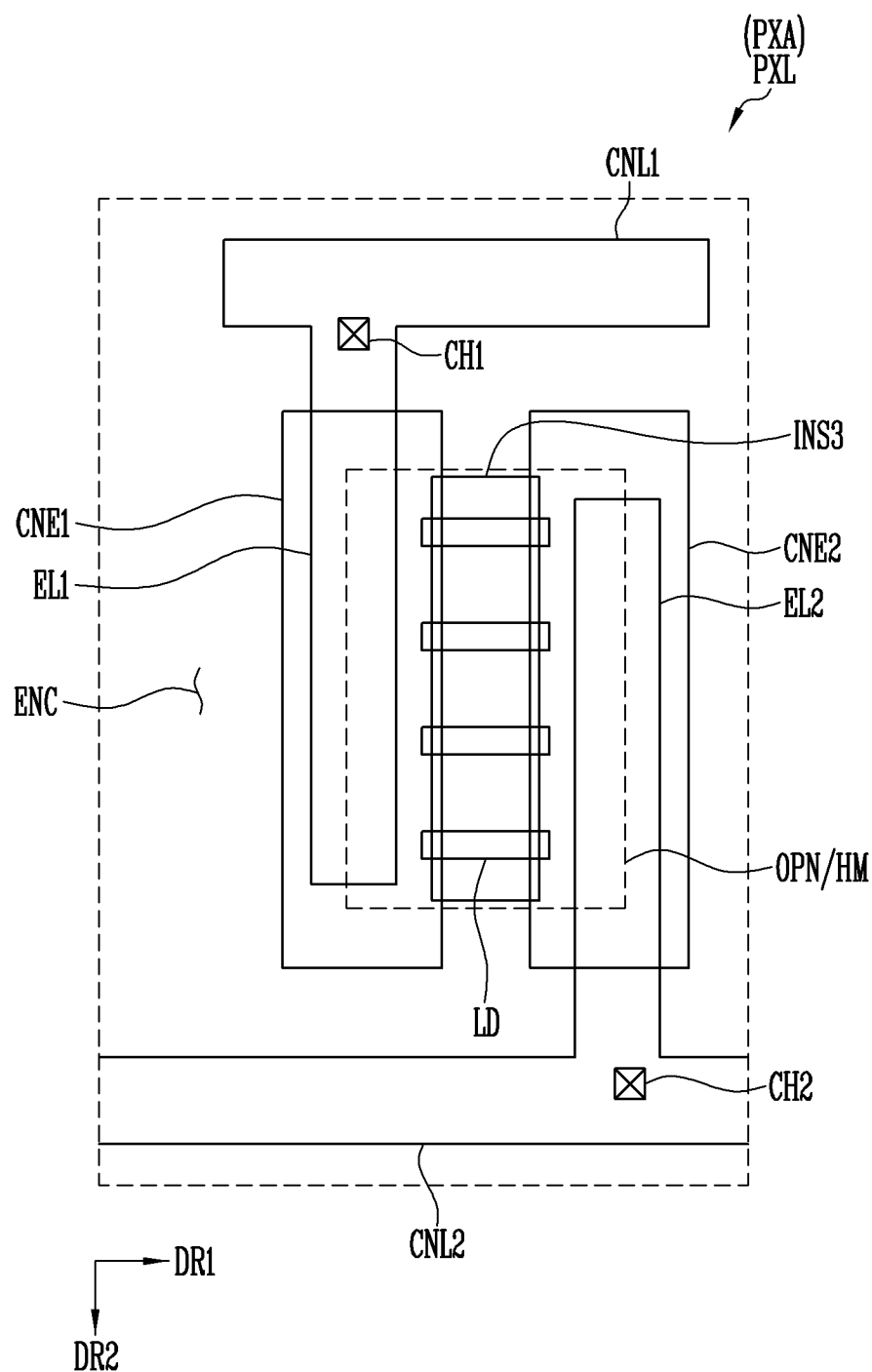
Figure 18A:
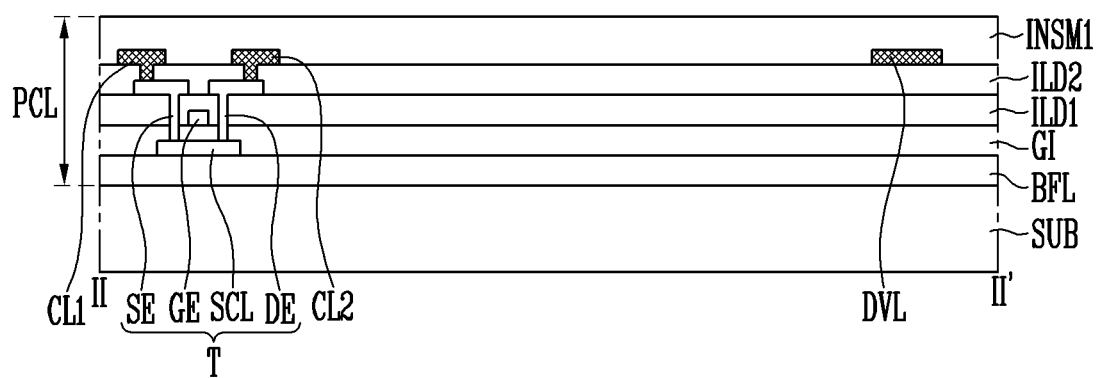
FIGS. 18A to 18I are schematic cross-sectional views sequentially illustrating a method of manufacturing the pixel shown in FIGS. 13 and 14.
Figure 18B:
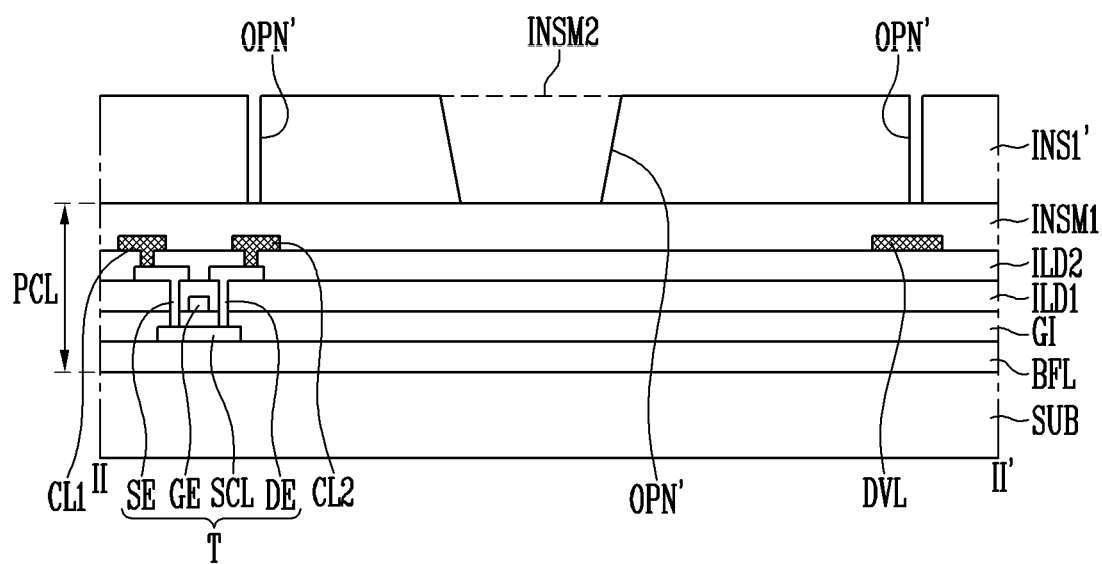
Figure 18C:
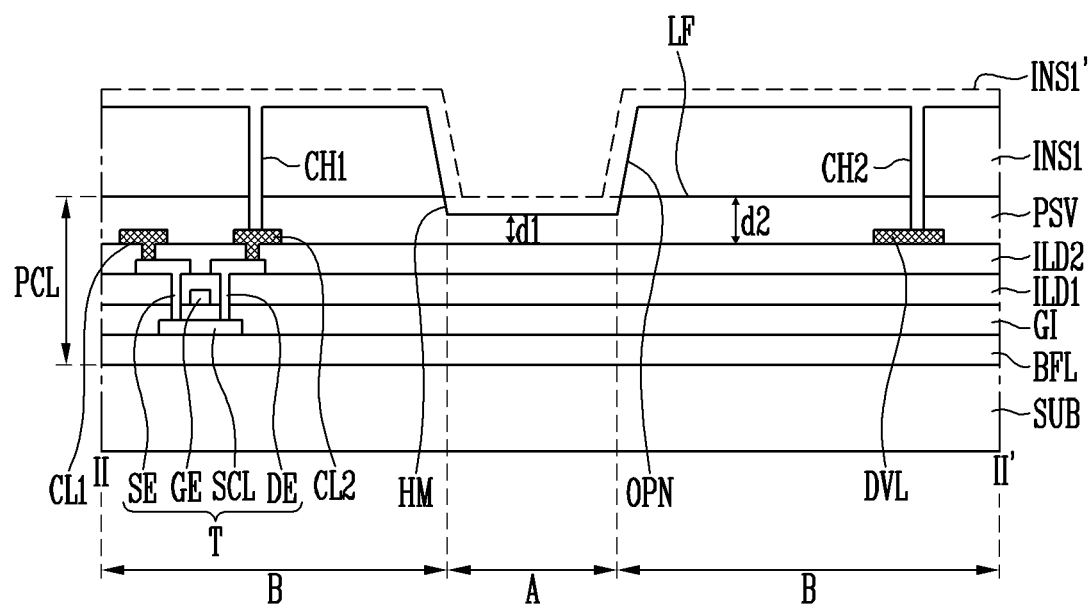
Figure 18D:
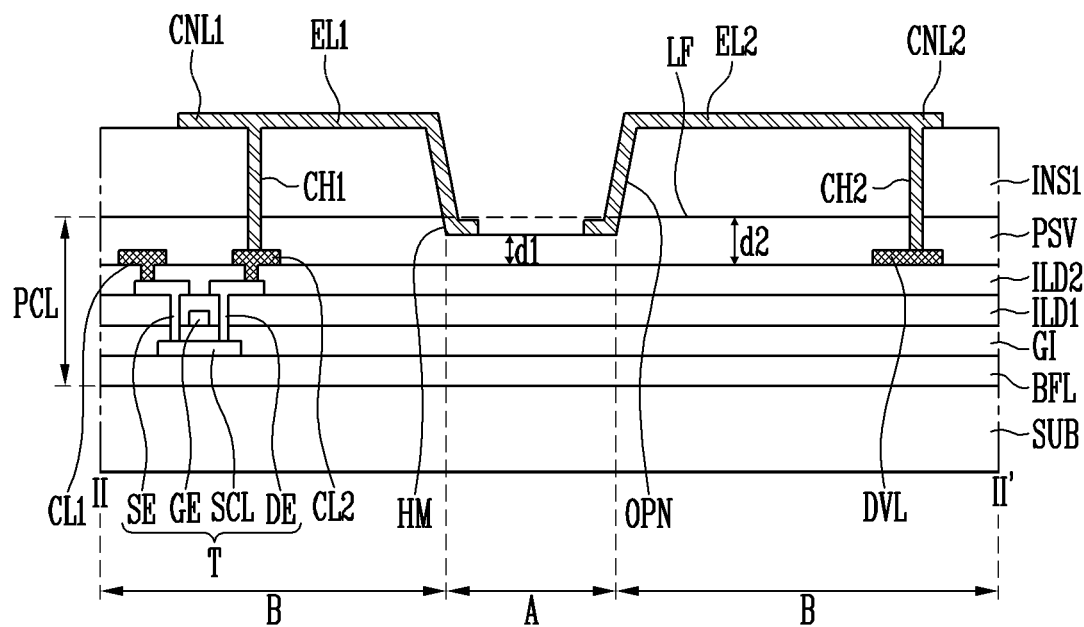
Figure 18E:
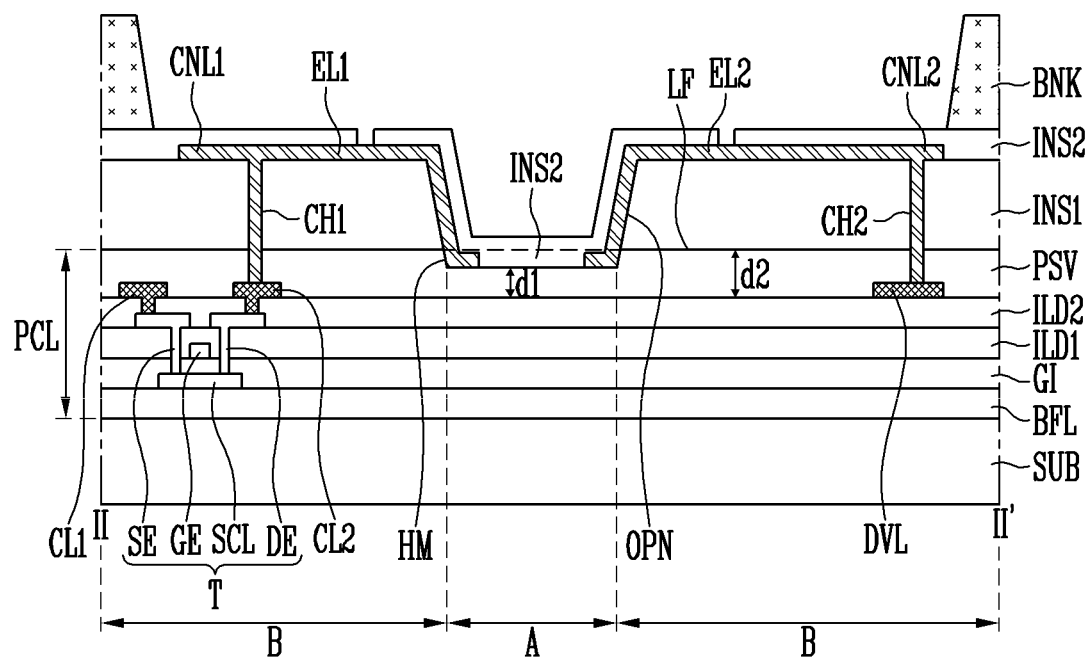
Figure 18F:
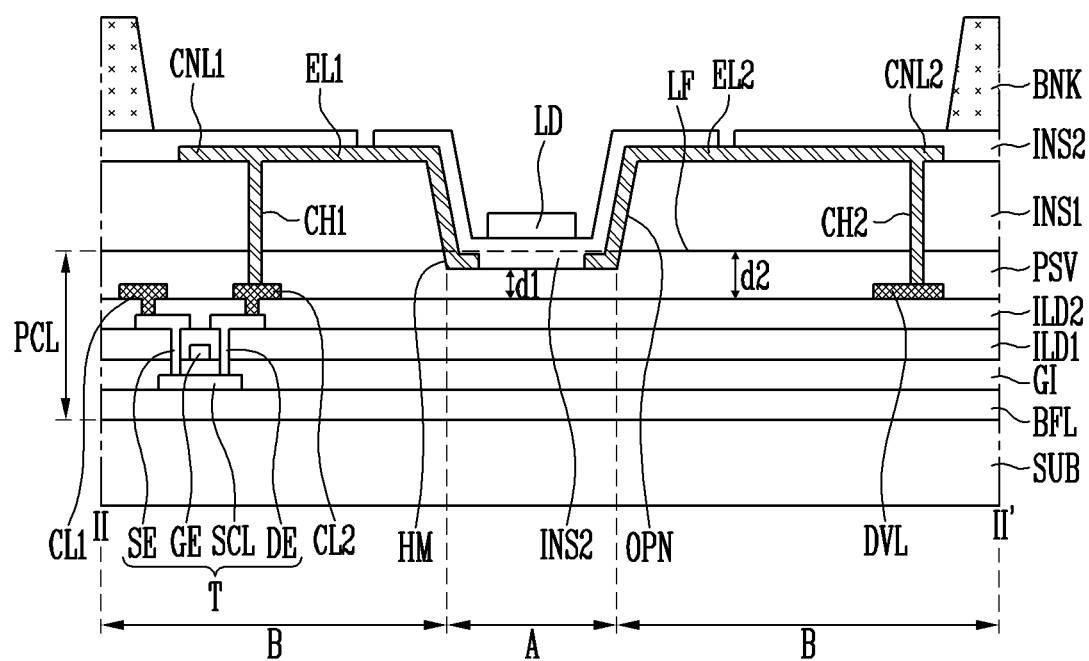
Figure 18G:
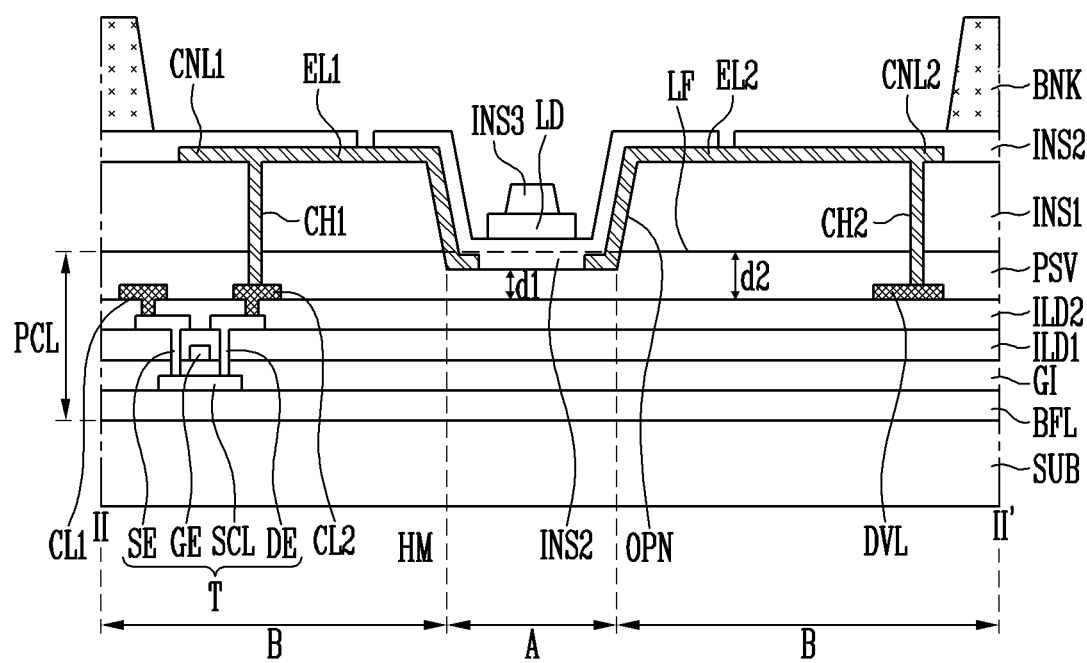
Figure 18H:
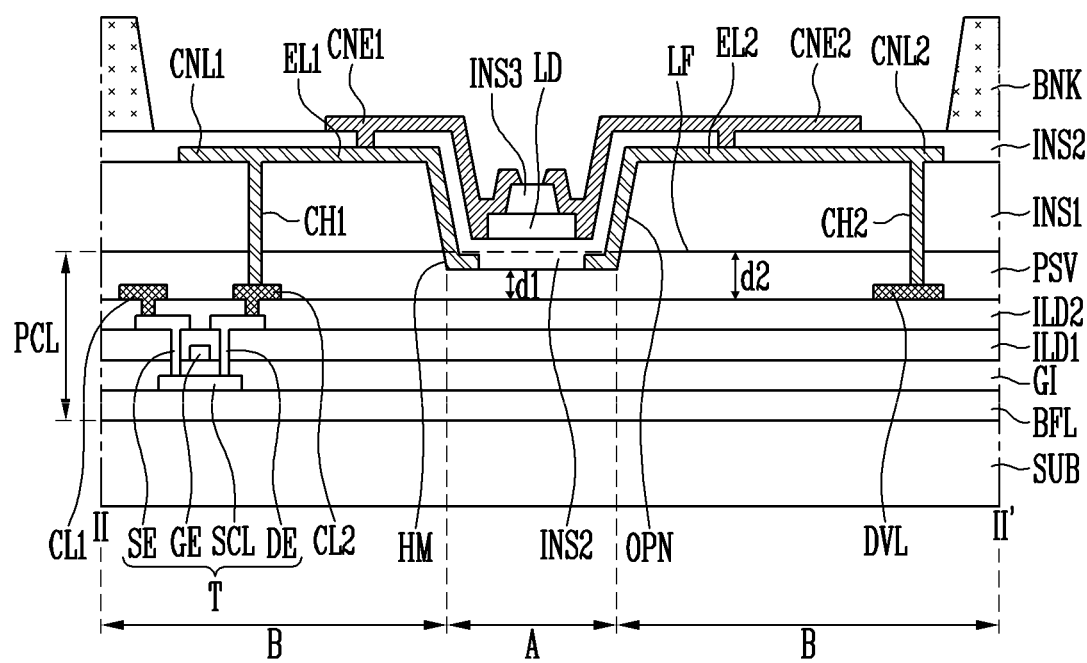
Figure 18I:
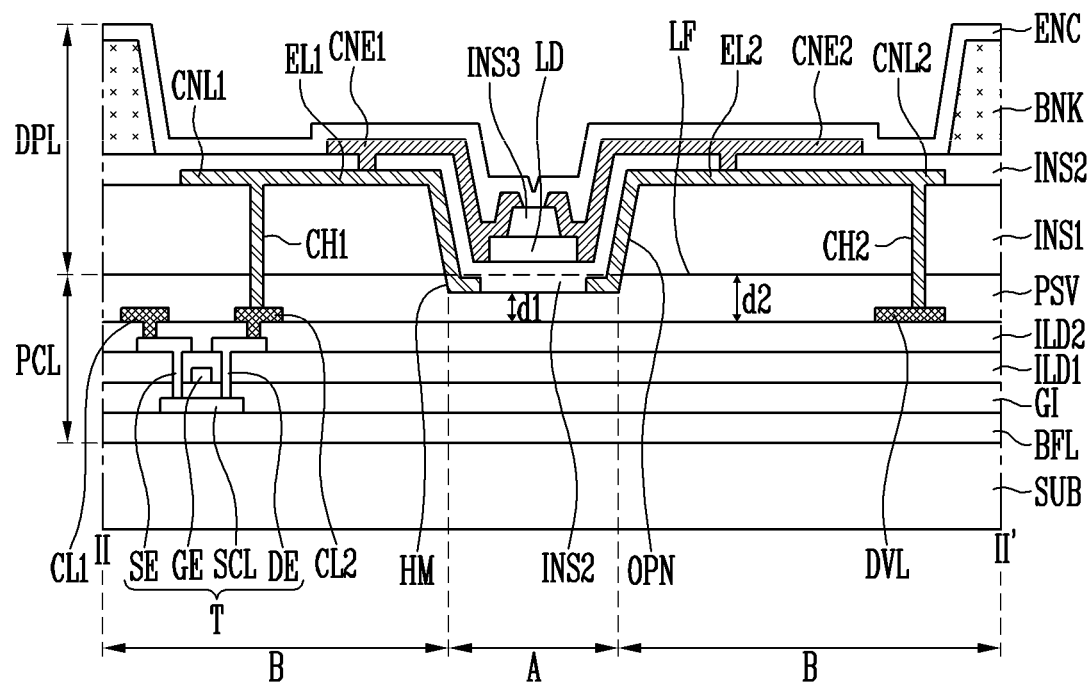

FIG. 13 is a plan view schematically illustrating one pixel according to another embodiment of the present disclosure, FIG. 14 is a cross-sectional view taken along a line II-II' of FIG. 13, FIG. 15 is an enlarged cross-sectional view of an EA2 portion of FIG. 14, and FIG. 16 is a cross-sectional view corresponding to the line II-II' of FIG. 13 as an implementation of the display element portion shown in FIG. 14 according to another embodiment.

In relation to the embodiment of FIGS. 13 to 16, differences from the above-described embodiment will be primarily described in order to avoid repetitive description(s). A part, element, or configuration that is not specially described in the present disclosure follows the above-described embodiment, the same reference numeral indicates the same component, and similar reference numeral indicates a similar component.

Referring to FIGS. 1A to 5, 6A, and 13 to 16, each pixel PXL may include the substrate SUB, the pixel circuit portion PCL, and the display element portion DPL.

The pixel circuit portion PCL may include an insulating film provided on the substrate SUB, the transistor T, the first and second conductive lines CL1 and CL2, the driving voltage line DVL, and the passivation film PSV. The transistor T, the first and second conductive lines CL1 and CL2, and the driving voltage line DVL may be the same or substantially the same as (e.g., may have the same or substantially the same configuration as) the transistor T, the first and second conductive lines CL1 and CL2, and the driving voltage line DVL described above with reference to FIGS. 8 to 12G.

The passivation film PSV may be provided and/or formed on the first and second conductive lines CL1 and CL2 and the driving voltage line DVL. The passivation film PSV may be an organic insulating film including an organic material.

In an embodiment of the present disclosure, the passivation film PSV may be divided into a first region A and a second region B. The first region A may be a region corresponding to (e.g., under) the opening OPN in the first insulating film INS1, and the second region B may be a region that does not correspond to (e.g., is offset from) the opening OPN. A thickness d1 of the passivation film PSV in the first region A may be different from a thickness d2 of the passivation film PSV in the second region B. For example, the thickness d1 of the passivation film PSV in the first region A may be less than the thickness d2 of the passivation film PSV in the second region B (e.g., the passivation film PSV may be thinner in the first region A than in the second region B). That is, the thickness d2 of the passivation film PSV in the second region B may be greater than the thickness d1 of the passivation film PSV in the first region A.

The display element portion DPL may include first to third insulating films INS1 to INS3 provided on one or more of the passivation film PSV, the first and second electrodes EL1 and EL2, the bank BNK, the light emitting elements LD, the first and second contact electrodes CNE1 and CNE2, and the encap layer ENC.

The first insulating film INS1 may be provided on the passivation film PSV and may have the opening OPN exposing a portion of the passivation film PSV. The light emitting elements LD may be disposed in the opening OPN in the first insulating film INS1.

The first insulating film INS1 may be formed through a following process.

After applying an insulating material layer on the passivation film PSV, an insulating pattern having a sub opening exposing a portion of the passivation film PSV may be formed by performing a process using a mask. Subsequently, the first contact opening CH1 exposing a portion of the second conductive line CL2, the second contact opening CH2 exposing a portion of the driving voltage line DVL, and the first insulating film INS1 having the opening OPN corresponding to a groove HM in the passivation film PSV may be formed by performing an etching process using the above-described insulating pattern as an etching mask. The sub opening may be the opening OPN having a width and/or a size that is expanded by the etching process using the insulating pattern as the etching mask.

When the above-described etching process is performed, one region of the passivation film PSV exposed by the sub opening of the insulating pattern may be etched, and thus, the groove HM may be formed. The groove HM in the passivation film PSV may correspond to the opening OPN in the first insulating film INS1. Accordingly, the first region A of the passivation film PSV may be a region where the groove HM is positioned, and the second region B of the passivation film PSV may be a region where the groove HM is not positioned. The first area A of the passivation film PSV where the groove HM is positioned may be thinner than the second region B of the passivation film PSV where the groove HM is not positioned, as shown in FIGS. 14 and 15.

A process of forming the groove HM in the passivation film PSV and the opening OPN in the first insulating film INS1 described above will be described in more detail with reference to FIGS. 17A, 17B, and 18A to 18C.

The first and second electrodes EL1 and EL2 may be provided and/or formed on the first insulating film INS1 having the opening OPN and the first and second contact openings CH1 and CH2. A portion of each of the first electrode EL1 and the second electrode EL2 may extend into the opening OPN in the first insulating film INS1 and may be provided and/or formed in the groove HM in the passivation film PSV exposed by the opening OPN. The portion of each of the first and second electrodes EL1 and EL2 provided in the groove HM in the passivation film PSV may be positioned under a boundary surface between the first insulating film INS1 and the passivation film PSV, for example, below a lower surface LF of the first insulating film INS1. For example, the portion of each of the first and second electrodes EL1 and EL2 provided in the groove HM of the passivation film PSV in the opening OPN in the first insulating film INS1 may be positioned to be further adjacent to (e.g., nearer to) the substrate SUB than the lower surface LF of the first insulating film INS1 (e.g., a distance between the lowest portions of the first and second electrodes EL1 and EL2 and the substrate SUB is less than a distance between the lower surface LF of the first insulating film INS1 and the substrate SUB).

The first electrode EL1 may be connected to a portion of the pixel circuit portion PCL, for example, the second conductive line CL2 and the transistor T, through the first contact opening CH1, which passes through the first insulating film INS1 and the passivation film PSV. The second electrode EL2 may be connected to a portion of the pixel circuit portion PCL, for example, the driving voltage line DVL, through the second contact opening CH2, which passes through the first insulating film INS1 and the passivation film PSV.

The second insulating film INS2 may be provided and/or formed on the first and second electrodes EL1 and EL2.

The light emitting elements LD may be disposed on the second insulating film INS2 positioned in the opening OPN in the first insulating film INS1. The third insulating film INS3 may be provided and/or formed on each of the light emitting elements LD. The third insulating film INS3 may be provided and/or formed on each of the light emitting elements LD to cover a portion of an upper surface of each of the light emitting elements LD and expose the both ends of each of the light emitting elements LD to the outside. The third insulating film INS3 may be formed as an independent insulating pattern in the pixel area PXA of each pixel PXL, but the present disclosure is not limited thereto.

The third insulating film INS3 may be a single film or have a multi-film structure and may include an inorganic insulating film including an inorganic material or an organic insulating film including an organic material. The third insulating film INS3 may further fix each of the light emitting elements LD aligned in the pixel area PXA of each pixel PXL. In an embodiment of the present disclosure, the third insulating film INS3 may include an inorganic insulating film that protects the active layer 12 of each of the light emitting elements LD from external oxygen, moisture, and the like. However, the present disclosure is not limited thereto. For example, the third insulating film INS3 may include an organic insulating film including an organic material according to a design condition or the like of the display device to which the light emitting elements LD are applied.

In an embodiment of the present disclosure, the light emitting elements LD may not deviate from the aligned position by forming the third insulating film INS3 on the light emitting elements LD after the alignment of the light emitting elements LD is completed in the light emission area EMA of each pixel PXL. When an empty gap (or space) is present between the second insulating film INS2 and the light emitting elements LD before forming the third insulating film INS3, the empty gap may be filled with the third insulating film INS3 in a process of forming the third insulating film INS3. Accordingly, the third insulating film INS3 may be an organic insulating film to fill the empty gap between the second insulating film INS2 and the light emitting elements LD.

The first and second contact electrodes CNE1 and CNE2 may be provided and/or formed on the third insulating film INS3.

The first contact electrode CNE1 may be formed on the second insulating film INS2 on the first electrode EL1 and may overlap the first electrode EL1 and the one end of each of the light emitting elements LD. The second contact electrode CNE2 may be formed on the second insulating film INS2 on the second electrode EL2 and may overlap the second electrode EL2 and the other end of each of the light emitting elements LD. The first contact electrode CNE1 and the second contact electrode CNE2 may be disposed to be spaced apart from each other. For example, the first contact electrode CNE1 and the second contact electrode CNE2 may be disposed to be spaced apart from each other at a constant (or substantially constant) distance on the third insulating film INS3 of each of the light emitting elements LD.

The first contact electrode CNE1 and the second contact electrode CNE2 may be provided on the same layer, but the present disclosure is not limited thereto. According to an embodiment, the first contact electrode CNE1 and the second contact electrode CNE2 may be provided on different layers. For example, as shown in FIG. 16, the first contact electrode CNE1 may be provided on the third insulating film INS3 and may be covered by an auxiliary insulating film AUINS. In addition, the second contact electrode CNE2 may be provided on the auxiliary insulating film AUINS and may be covered by the encap layer ENC. The auxiliary insulating film AUINS may be an inorganic insulating film including an inorganic material or an organic insulating film including an organic material.

According to the above-described embodiment, in a process of forming the opening OPN in the first insulating film INS1, the first and second contact openings CH1 and CH2 for respectively connecting the first and second electrodes EL1 and EL2 to a portion of the pixel circuit unit PCL may be simultaneously (or concurrently) formed. Therefore, a process or the like of forming the first and second contact openings CH1 and CH2 using a separate mask may be omitted. Accordingly, a manufacturing process of the display device according to the above-described embodiment may be simplified.

FIGS. 17A to 17G are schematic plan views sequentially illustrating a method of manufacturing the pixel shown in FIG. 13, and FIGS. 18A to 18I are schematic cross-sectional views sequentially illustrating a method of manufacturing the pixel shown in FIG. 14.

Hereinafter, the pixels shown in FIGS. 13 and 14 will be sequentially described according to the manufacturing method with reference to FIGS. 17A to 17G and FIGS. 18A to 18I.

Referring to FIGS. 1A to 5, 6A, 13, 14, and 18A, an insulating film, the transistor T, the driving voltage line DVL, and the first and the second conductive lines CL1 and CL2 are formed on the substrate SUB.

Subsequently, the first insulating material layer INSM1 is formed on the first and second conductive lines CL1 and CL2 and the driving voltage line DVL. The first insulating material layer INSM1 may be an organic insulating film including an organic material.

Referring to FIGS. 1A to 5, 6A, 13, 14, 17A, 18A, and 18B, after forming the second insulating material layer INSM2 on the first insulating material layer INSM1, a first insulating pattern INS1' having a plurality of sub openings OPN' exposing a portion of the first insulating material layer INSM1 is formed by removing a portion of the second insulating material layer INSM2 using a mask.

The second insulating material layer INSM2 may include an inorganic insulating film including (or formed of) an inorganic material or an organic insulating film including (or formed of) an organic material.

Referring to FIGS. 1A to 5, 6A, 13, 14, 17B, and 18A to 18C, a portion of each of the first insulating pattern INS1' and the first insulating material layer INSM1 is removed by performing an etching process using the first insulating pattern INS1' as an etching mask.

Through the above-described etching process, a portion of the first insulating material layer INSM1 is removed to form the passivation film PSV and the first insulating film INS1 having the first contact opening CH1 exposing a portion of the second conductive line CL2 and the second contact opening CH2 exposing a portion of the driving voltage line DVL. The etching process may be a dry etching process.

In the above-described etching process, because the first insulating pattern INS1' is used as the etching mask, a width and/or a size of at least one sub opening OPN' of the sub openings OPN' may be expanded, and thus, at least one of the sub openings OPN' may become the opening OPN. In addition, one region of the first insulating material layer INSM exposed by the sub opening OPN' is etched (e.g., is partially etched), and thus, the passivation film PSV having the groove HM is formed. The groove HM in the passivation film PSV may correspond to the opening OPN in the first insulating film INS1. The thickness d1 of the first region A of the passivation film PSV having the groove HM may be less than the thickness d2 of the other region B of the passivation film PSV where the groove HM is not present.

In an embodiment of the present disclosure, the groove HM in the passivation film PSV may be positioned under the lower surface LF of the first insulating film INS1.

Referring to FIGS. 1A to 5, 6A, 13, 14, 17C, and 18A to 18D, the first and second connection lines CNL1 and CNL2 including a conductive element (or conductive material) having a high reflectance and the first and second electrodes EL1 and EL2 are formed on the first insulating film INS1 having the opening OPN.

The first and second connection lines CNL1 and CNL2 may extend in the first direction DR1 and may be commonly provided to pixels PXL positioned adjacently in the extension direction DR1. The first electrode EL1 may be branched from the first connection line CNL1 in the second direction DR2, and the second electrode EL2 may be branched from the second connection line CNL2 in the second direction DR2. The first electrode EL1 and the first connection line CNL1 may be integrally provided, and the second electrode EL2 and the second connection line CNL2 may be integrally provided.

The first electrode EL1 may be electrically connected to a portion of the pixel circuit portion PCL through the first contact opening CH1, which passes through the passivation film PSV and the first insulating film INS1. The second electrode EL2 may be electrically connected to a portion of the pixel circuit portion PCL through the second contact opening CH2, which passes through the passivation film PSV and the first insulating film INS1.

A portion of each of the first electrode EL1 and the second electrode EL2 may extend into the opening OPN in the first insulating film INS1 and may be provided and/or formed in the groove HM in the passivation film PSV exposed by the opening OPN. The portion of each of the first and second electrodes EL1 and EL2 provided in the groove HM in the passivation film PSV may be positioned under the lower surface LF of the first insulating film INS1.

Referring to FIGS. 1A to 5, 6A, 13, 14, and 18A to 18E, the second insulating film INS2 exposing a portion of each of the first and second electrodes EL1 and EL2 is formed on the first and second electrodes EL1 and EL2 and the first and second connection lines CNL1 and CNL2.

Next, the bank BNK is formed on the second insulating film INS2.

Referring to FIGS. 1A to 5, 6A, 13, 14, 17D, and 18A to 18F, after forming an electric field between the first and second electrodes EL1 and EL2 by applying the alignment signals (or alignment voltages) corresponding to the respective first and second electrodes EL1 and EL2, the mixed liquid including the light emitting elements LD is input to the pixel area PXA of each of the pixels PXL using an inkjet printing method or the like.

When the light emitting elements LD are input to the pixel area PXA of each of the pixels PXL, the light emitting elements LD may be self-aligned by the electric field formed between the first electrode EL1 and the second electrode EL2. Accordingly, the light emitting elements LD may be aligned on the second insulating film INS2 between the first electrode EL1 and the second electrode EL2 in the opening OPN in the first insulating film INS1.

Referring to FIGS. 1A to 5, 6A, 13, 14, 17E, and 18A to 18G, the third insulating film INS3 is formed on each of the light emitting elements LD. The third insulating film INS3 may cover at least a portion of an upper surface of each of the light emitting elements LD and expose the both ends of each of the light emitting elements LD to the outside.

Referring to FIGS. 1A to 5, 6A, 13, 14, and 17F, an etching process or the like using a mask is performed to remove a portion of the first connection line CNL1 so that each of the pixels PXL may be driven independently or separately from the pixels PXL adjacent thereto. Accordingly, the first connection line CNL1 provided to each pixel PXL may be electrically and/or physically separated from the first connection line CNL1 provided to the pixels PXL adjacent thereto.

Referring to FIGS. 1A to 5, 6A, 13, 14, 17G, 18A to 18I, the first and second contact electrodes CNE1 and CNE2 are formed on the third insulating film INS3. The first contact electrode CNE1 may overlap the first electrode EL1 and the one end of each of the light emitting elements LD. The second contact electrode CNE2 may overlap the second electrode EL2 and the other end of each of the light emitting elements LD.

Subsequently, the encap layer ENC covering the first and second contact electrodes CNE1 and CNE2 is formed.

Figure 19:
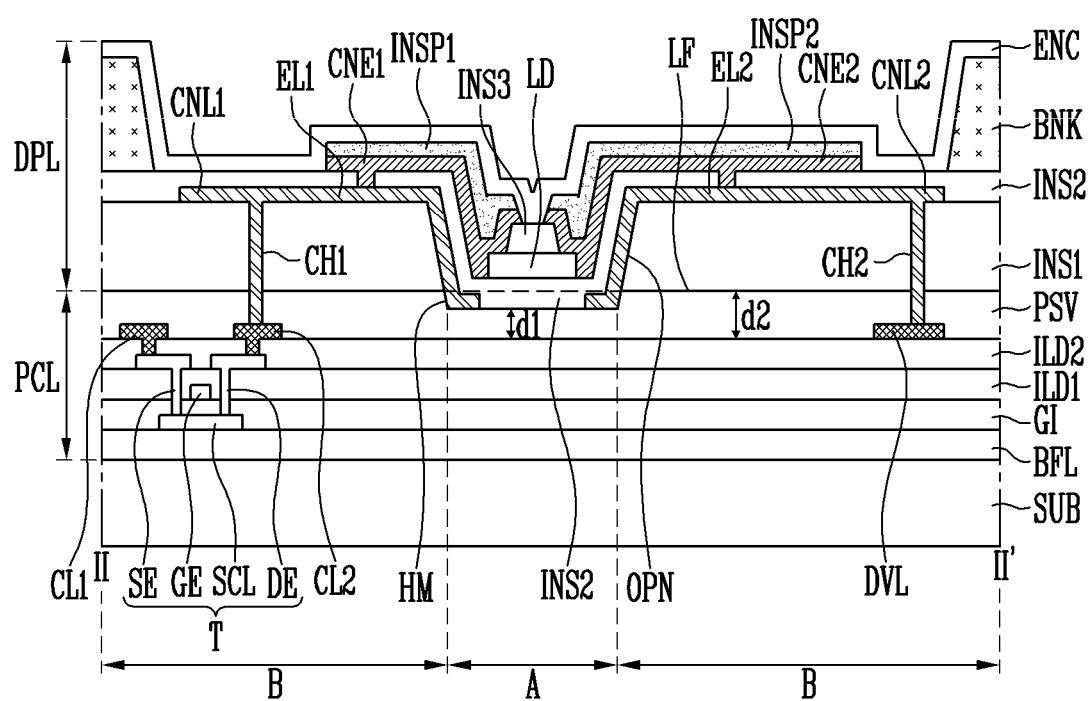
FIG. 19 is a cross-sectional view of the implementation of the display element portion shown in FIG. 14 according to another embodiment.

FIG. 19 is a cross-sectional view of the implementation of the display element portion shown in FIG. 14 according to another embodiment.

In relation to the embodiment shown in FIG. 19, differences from the above-described embodiment will be primarily described in order to avoid repetitive description(s). A part, element, or configuration that is not specially described in the present disclosure follows the above-described embodiment, and the same reference numeral indicates the same components, and a similar reference numeral indicates a similar component.

Referring to FIGS. 1A to 5, 6A, and 19, each pixel PXL may include the substrate SUB, the pixel circuit portion PCL, and the display element portion DPL.

The pixel circuit portion PCL may have the same or substantially the same configuration as the pixel circuit portion PCL described above with reference to FIGS. 13 to 18I.

The display element portion DPL may include the first to third insulating films INS1 to INS3 provided on one or more of the passivation film PSV, the first and second electrodes EL1 and EL2, the bank BNK, the light emitting elements LD, the first and second contact electrodes CNE1 and CNE2, and the encap layer ENC. In addition, the display element portion DPL may include the first insulating pattern INSP1 disposed between the first contact electrode CNE1 and the encap layer ENC, and the second insulating pattern INSP2 disposed between the second contact electrode CNE2 and the encap layer ENC.

The first insulating pattern INSP1 and the second insulating pattern INSP2 may be provided and/or formed on the same layer, may include the same material, and may be formed through the same process. The first and second insulating patterns INSP1 and INSP2 may include an organic insulating film including an organic material.

The first insulating pattern INSP1 may overlap the first contact electrode CNE1 when viewed on the plane and may have the same shape as the shape of the first contact electrode CNE1. For example, the first insulating pattern INSP1 and the first contact electrode CNE1 may have the same planar shape. The second insulating pattern INSP2 may overlap the second contact electrode CNE2 when viewed on the plane and may have the same shape as the shape of the second contact electrode CNE2. For example, the second insulating pattern INSP2 and the second contact electrode CNE2 may have the same planar shape.

In an embodiment of the present disclosure, the first insulating pattern INSP1 may be formed by a process using the first contact electrode CNE1 and one mask (e.g., the same mask), and the second insulating pattern INSP2 may be formed by a process using the second contact electrode CNE2 and one mask (e.g., the same mask).

The first insulating pattern INSP1 may be provided on the first contact electrode CNE1 to protect the first contact electrode CNE1. In addition, the first insulating pattern INSP1 may overlap the one end of each of the light emitting elements LD and may act as a fixing member that fixes the light emitting elements LD together with the first contact electrode CNE1. The second insulating pattern INSP2 may be provided on the second contact electrode CNE2 to protect the second contact electrode CNE2. In addition, the second insulating pattern INSP2 may overlap the other end of each of the light emitting elements LD and may act as a fixing member that fixes the light emitting elements LD together with the second contact electrode CNE2.

Although the present disclosure has been described with reference to example embodiments, those skilled in the art will understand that the example embodiments described herein may be variously modified and changed without departing from the spirit and scope of the present disclosure as set forth in the claims and their equivalents.

Therefore, the technical scope of the present disclosure should not be limited to the content described in the detailed description of the specification but should be defined by the claims and their equivalents.

What is claimed is:

1. A display device comprising:
    a substrate having a display area and a non-display area extending around a side of the display area, the display area comprising a plurality of pixel areas; and
    a pixel in each of the pixel areas, each of the pixels comprises:
        a transistor and a driving voltage line on the substrate;
        a passivation layer on the transistor and the driving voltage line;
        an insulating layer on the passivation layer and having an opening;
        first and second electrodes on the insulating layer and spaced apart from each other; and a plurality of light emitting elements in the opening,
wherein the passivation layer has a first area corresponding to the opening in the insulating layer and a second area that does not correspond to the opening in the insulating layer, and
wherein a thickness of the first area of the passivation layer and a thickness of the second area of the passivation layer are different from each other.

2. The display device according to claim 1, wherein the thickness of the first area of the passivation layer is less than the thickness of the second area of the passivation layer.

3. The display device according to claim 2, wherein a first distance between the substrate and a portion of each of the first and second electrodes in the opening in the insulating layer is less than a second distance between the substrate and the passivation layer.

4. The display device according to claim 1, wherein each of the pixels further comprises:
an insulating pattern on an upper surface of the light emitting elements;
a first contact electrode connecting the first electrode and one end of the light emitting elements; and
a second contact electrode connecting the second electrode and another end of the light emitting elements.

5. The display device according to claim 4, wherein the first contact electrode and the second contact electrode are spaced apart from each other on the insulating pattern.

6. The display device according to claim 5, wherein the first contact electrode and the second contact electrode are on the same layer.

7. The display device according to claim 5, wherein the first contact electrode and the second contact electrode are on different layers.

8. The display device according to claim 5, wherein each of the pixels further comprises:
a first insulating pattern on the first contact electrode; and
a second insulating pattern on the second contact electrode, and wherein
the first contact electrode and the first insulating pattern have the same planar shape, and the second contact electrode and the second insulating pattern have the same planar shape.

9. A method of manufacturing a display device, the method comprising:
providing a pixel in each pixel area on a substrate, the providing the pixel comprising:
forming a transistor and a driving voltage line on the substrate;
forming a first insulating material layer on the transistor and the driving voltage line;
forming an insulating pattern having a sub opening exposing the first insulating material layer by forming a second insulating material layer on the first insulating material layer and removing a portion of the second insulating material layer;
forming a passivation layer having a groove and an insulating layer having an opening with a width greater than a width of the sub opening by removing a portion of the exposed first insulating material layer using the insulating pattern as an etching mask;
forming a first electrode and a second electrode spaced apart from each other on the insulating layer;
supplying light emitting elements to the pixel area and aligning the light emitting elements by forming an electric field between the first electrode and the second electrode by applying an alignment signal corresponding to each of the first and second electrodes; and
forming a contact electrode on each of the first and second electrodes.

10. The method according to claim 9, wherein the groove in the passivation layer corresponds to the opening in the insulating layer.

11. The method according to claim 10, wherein a first distance between the substrate and a portion of each of the first and second electrodes in the opening in the insulating layer is less than a second distance between the substrate and the passivation layer.

12. The method according to claim 11, wherein the forming the passivation layer and the insulating layer comprises forming a contact opening exposing each of a portion of the transistor and a portion of the driving voltage line by removing a portion of the insulating pattern and the second insulating material layer.

* * * * *